(12) United States Patent
Yamazaki et al.

(10) Patent No.: US 7,196,400 B2
(45) Date of Patent: Mar. 27, 2007

(54) SEMICONDUCTOR DEVICE WITH ENHANCED ORIENTATION RATIO AND METHOD OF MANUFACTURING SAME

(75) Inventors: Shunpei Yamazaki, Tokyo (JP); Toru Mitsuki, Kanagawa (JP); Kenji Kasahara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 19 days.

(21) Appl. No.: 10/835,077

(22) Filed: Apr. 30, 2004

(65) Prior Publication Data
US 2004/0201023 A1   Oct. 14, 2004

Related U.S. Application Data

(62) Division of application No. 10/190,550, filed on Jul. 9, 2002, now Pat. No. 6,828,179.

(30) Foreign Application Priority Data

Jul. 10, 2001  (JP) .............................. 2001-209877
Aug. 1, 2001  (JP) .............................. 2001-234302

(51) Int. Cl.
*H01L 29/04* (2006.01)
*H01L 31/036* (2006.01)
*H01L 31/117* (2006.01)

(52) U.S. Cl. .......................... 257/627; 257/62; 257/63; 257/65; 257/255; 257/521; 257/527; 257/616; 257/628

(58) Field of Classification Search ............... 257/63, 257/65, 616, 627–628, 62, 255, 521, 527

See application file for complete search history.

(56) References Cited

U.S. PATENT DOCUMENTS 5,643,826 A   7/1997   Ohtani et al.

(Continued)

FOREIGN PATENT DOCUMENTS

JP   07-130652   5/1995

(Continued)

OTHER PUBLICATIONS

U.S. Appl. No. 09/227,577 filed Jan. 8, 1999; Yamazaki et al. "Semiconductor Device and Method of Manufacturing the Same".

*Primary Examiner*—Ida M. Soward
(74) *Attorney, Agent, or Firm*—Nixon Peabody LLP; Jeffrey L. Costellia

(57) ABSTRACT

An object is to enhance the orientation ratio of a crystalline semiconductor film obtained by crystallizing an amorphous semiconductor film while using as a substrate a less-heat-resistive material such as glass thereby providing a semiconductor device using a crystalline semiconductor film with high quality equivalent to a single crystal. A first crystalline semiconductor film and a second crystalline semiconductor film are formed overlying a substrate, which integrally structure a crystalline semiconductor layer. The first and second crystalline semiconductor films are polycrystalline bodies aggregated with a plurality of crystal grains. However, the crystal grains are aligned toward a (101)-plane orientation at a ratio of 30 percent or greater, preferably 80 percent or greater. Also, relying on a plane orientation of the crystal grains in the first crystalline semiconductor film, the second crystalline semiconductor film has a plane orientation also aligned in the same direction with a probability of 60 percent or higher.

15 Claims, 41 Drawing Sheets
(3 of 41 Drawing Sheet(s) Filed in Color)

U.S. PATENT DOCUMENTS

| | | |
|---|---|---|
| 5,700,333 A | 12/1997 | Yamazaki et al. |
| 5,773,847 A | 6/1998 | Hayakawa |
| 5,789,284 A | 8/1998 | Yamazaki et al. |
| 5,923,962 A | 7/1999 | Ohtani et al. |
| 5,932,893 A | 8/1999 | Miyanaga et al. |
| 6,013,544 A | 1/2000 | Makita et al. |
| 6,048,780 A | 4/2000 | Hayakawa |
| 6,140,165 A | 10/2000 | Zhang et al. |
| 6,261,705 B1* | 7/2001 | Tanikawa et al. ........... 428/641 |
| 6,326,226 B1 | 12/2001 | Jang et al. |
| 6,337,224 B1* | 1/2002 | Okamoto et al. ............. 438/69 |
| 6,388,270 B1 | 5/2002 | Yamazaki et al. |
| 6,475,840 B1 | 11/2002 | Miyanaga et al. |
| 6,583,776 B2 | 6/2003 | Yamazaki et al. |
| 6,624,051 B1* | 9/2003 | Ohtani et al. ............... 438/486 |
| 6,693,044 B1 | 2/2004 | Yamazaki et al. |
| 6,828,587 B2* | 12/2004 | Yamazaki et al. ............. 257/72 |
| 7,098,508 B2* | 8/2006 | Ieong et al. ................. 257/347 |
| 2002/0008286 A1* | 1/2002 | Yamazaki et al. .......... 257/359 |
| 2002/0013114 A1 | 1/2002 | Ohtani et al. |
| 2002/0036289 A1* | 3/2002 | Tamura et al. ................. 257/64 |
| 2002/0038889 A1* | 4/2002 | Yamazaki et al. .......... 257/347 |
| 2002/0043660 A1* | 4/2002 | Yamazaki et al. ............. 257/59 |
| 2002/0043662 A1* | 4/2002 | Yamazaki et al. ............. 257/72 |
| 2002/0163035 A1 | 11/2002 | Yamazaki |

FOREIGN PATENT DOCUMENTS

| | | |
|---|---|---|
| JP | 07-231100 | 8/1995 |
| JP | 08-078329 | 3/1996 |
| JP | 09-082639 | 3/1997 |
| JP | 11-204435 | 7/1999 |
| JP | 2000-114172 | 4/2000 |

* cited by examiner emitting direction

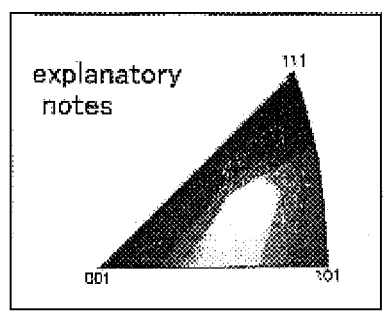
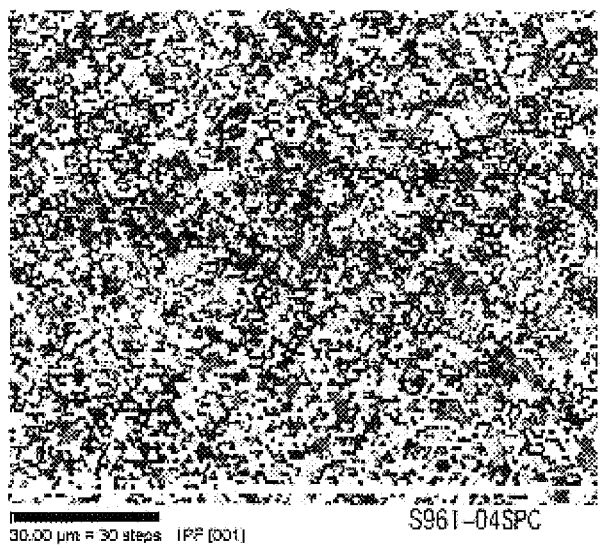
Fig. 24

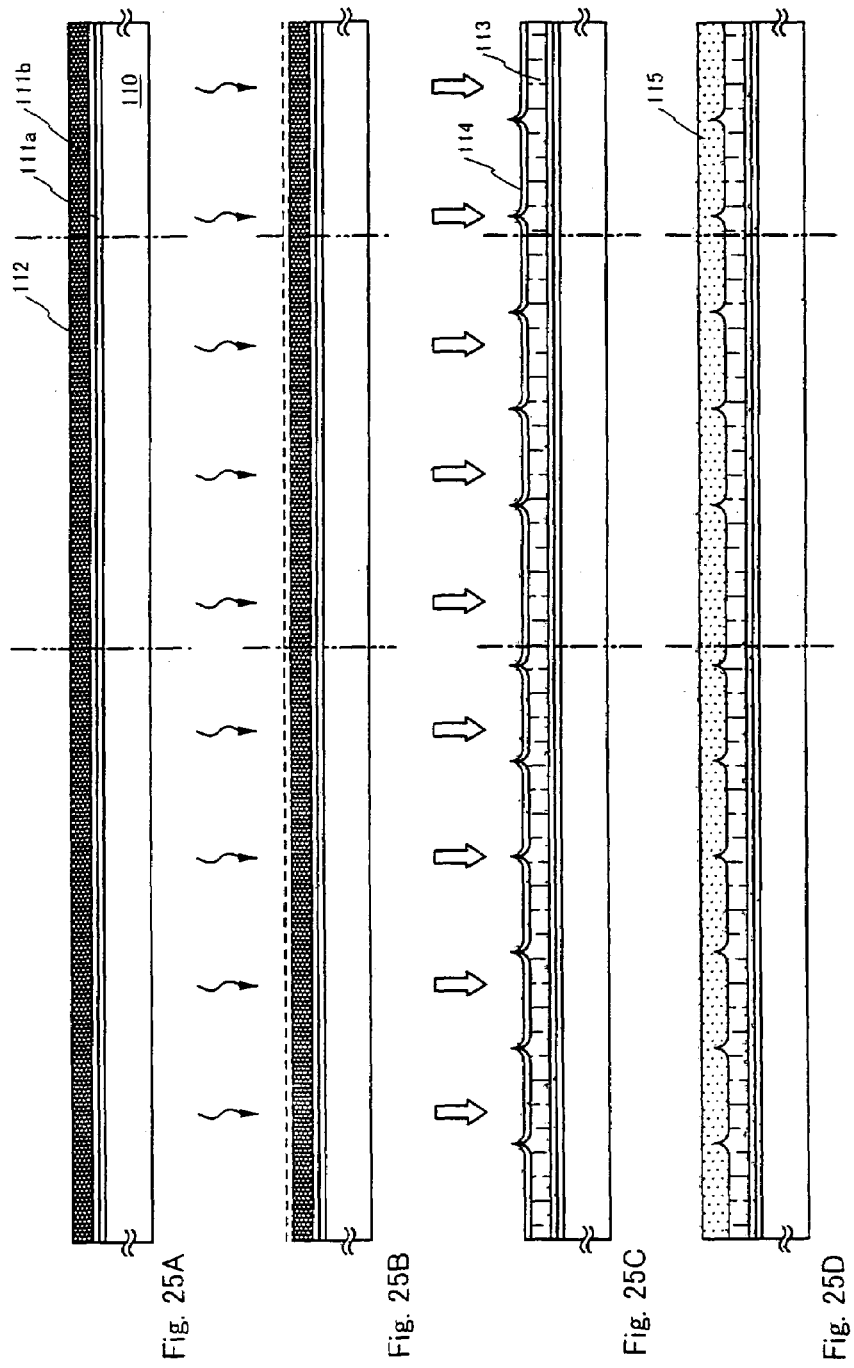

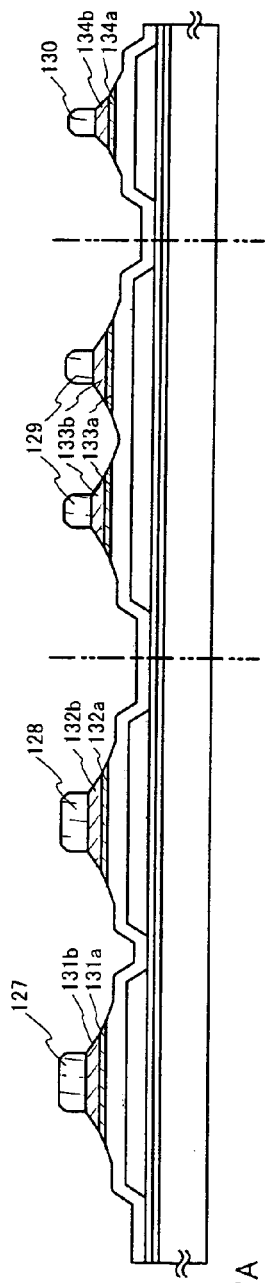
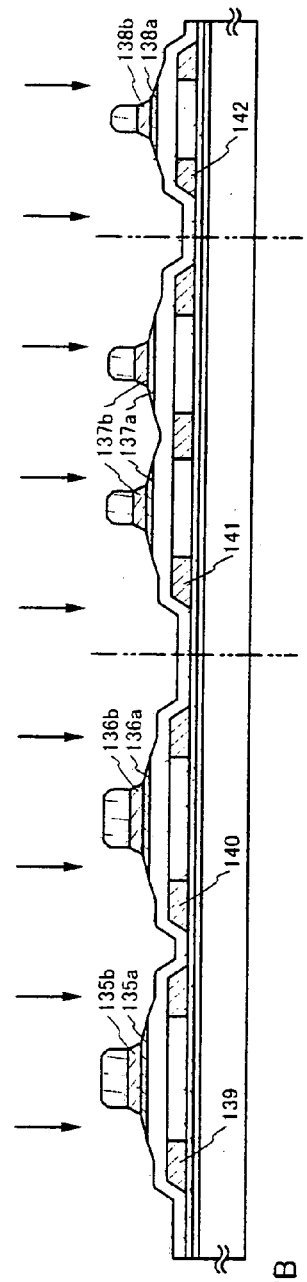
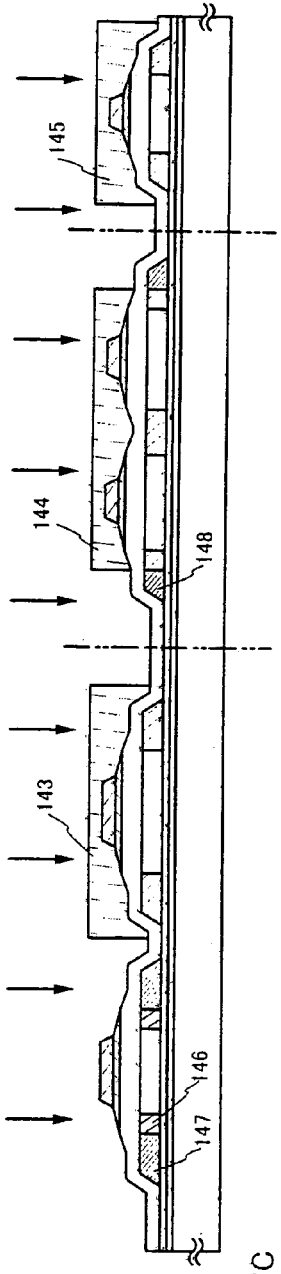
Fig. 27A
Fig. 27B
Fig. 27C

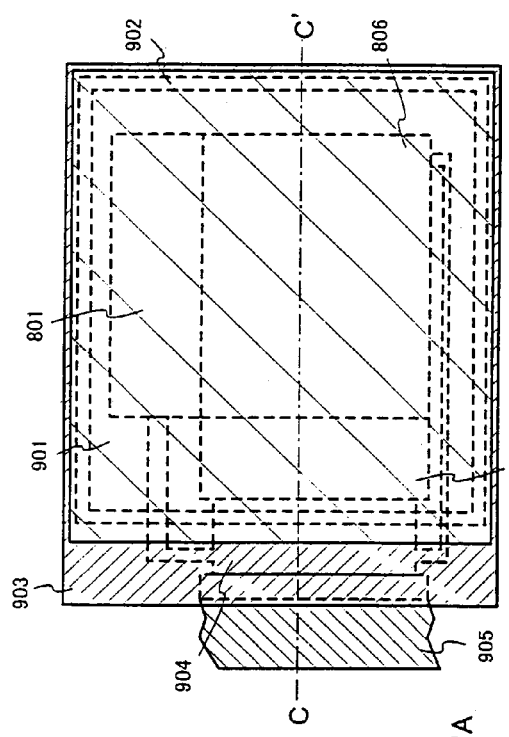
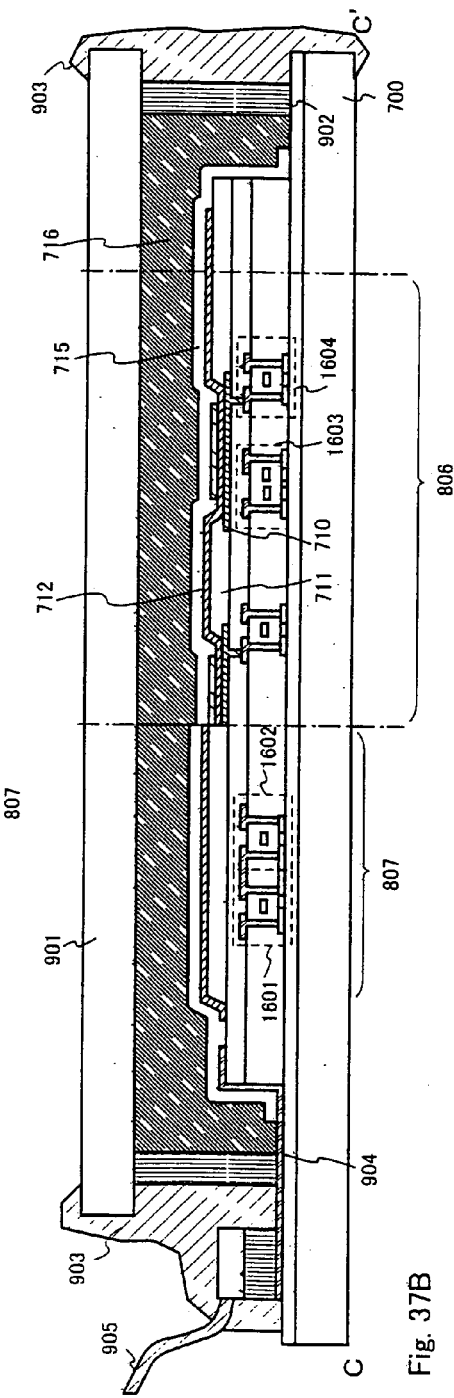
Fig. 37A
Fig. 37B

SEMICONDUCTOR DEVICE WITH ENHANCED ORIENTATION RATIO AND METHOD OF MANUFACTURING SAME

CROSS-REFERENCE TO RELATED APPLICATION

This application is a divisional application of U.S. patent application Ser. No. 10/190,550 filed on Jul. 9, 2002, which issued as U.S. Pat. No. 6,828,179 on Dec. 7, 2004, and is entitled Semiconductor Device and Method for Manufacturing Same. This application claims priority to Japanese Patent Application Number 2001-234302 filed on Aug. 1, 2001 and to Japanese Patent Application Number 2001-209877 filed on Jul. 7, 2001.

BACKGROUND OF THE INVENTION

1. Technical Field of the Invention

This invention relates to a crystal-structured semiconductor film, semiconductor device using the same and method for manufacturing those, and more particularly to a semiconductor film excellent in crystallinity and having a crystal orientation arranged in a single direction, semiconductor device using the same and method for manufacturing those.

2. Description of the Related Art

There is a technology, called a laser anneal process, developed as a method to crystallize an amorphous silicon film formed on an insulating substrate of glass or the like. In the laser anneal process, a laser light having an energy of approximately 100–500 mJ/cm$^2$ is radiated to an amorphous silicon film, thereby realizing crystallization.

For amorphous silicon crystallization, there is a need to heat it up to usually 600° C. or higher. The laser anneal process, however, has an extremely excellent feature that can crystallize an amorphous silicon film while keeping a substrate at nearly a room temperature. The laser uses a solid laser, as represented by an excimer laser or a YAG laser. In any way, because of limitation in beam size, the processing of a large-area substrate requires radiation by connection with bean scans. Accordingly, there is a disadvantage pointed out that crystallinity changes at connections thus disabling to obtain a uniform crystal. Meanwhile, in the case of laser anneal, there also is difficulty in obtaining a homogeneous crystal because of instable output of a laser oscillator. Such crystal quality variation is responsible for the characteristic variation in thin film transistors (hereinafter, described as TFTs).

On the other hand, Japanese Patent Laid-Open No. 7-231100, Japanese Patent Laid-Open No. 7-130652, Japanese Patent Laid-Open No. 8-78329, etc. disclose an art that, using a catalyst element for accelerating the crystallization of an amorphous silicon film, a heating process is made at a temperature of 450-650° C. to cause crystallization in a part or the entire of an amorphous silicon film, and heating is further made at a temperature higher than that heating temperature to thereby obtain a large-grained crystalline silicon film.

In order to obtain a high-quality crystalline silicon film, it is emphasized to arrange the orientation of crystals besides the increase of crystal-grain size. It is considered, in the laser anneal process, that crystallization proceeds on the basis of the spontaneous nucleation of crystals at the interface between an amorphous silicon film and a substrate. The silicon film crystallized by this method, when analyzed in the crystal structure by X-ray diffraction, is usually observed with diffraction peaks at (111), (220), (311) and so on. It has been confirmed as a polycrystalline body aggregated with various orientations. In the polycrystalline body, individual crystal grains precipitate on arbitrary crystal planes. In this case, the probability is the greatest that crystal precipitation occurs on a (111) plane where the interface energy is minimized to an underlying silicon oxide.

In the case that a catalyst element for accelerating silicon crystallization is introduced into an amorphous silicon film to cause crystallization, formed is a silicide of an element introduced at a temperature lower than a temperature of spontaneous nucleation, causing crystal growth on the basis of the silicide. For example, NiSi$_2$ under forming does not have a particular orientation. However, in case the amorphous semiconductor film is reduced to a thickness of 200 nm or less, growth is allowed substantially only in a direction parallel with a substrate surface. In this case, minimum is the interface energy at the contact between the NiSi$_2$ and the crystal-silicon (111) plane. Thus, the plane parallel with a crystalline silicon film surface is a (110) plane, in a lattice plane of which preferential orientation made. Where the crystal grows in a columnar form in a direction parallel with the substrate surface, there exists a freedom in a direction about an axis of the columnar crystal. Thus, orientation is not always on the (110) plane and precipitation occurs also on the other lattice planes. The percentage of orientation on the (110) plane is, however, still less than 20 percent in total.

In the case of low orientation ratio, it is almost impossible to maintain a lattice continuity at a crystal boundary where crystals with different orientations crash one against another. Easily presumed is formation of a number of dangling bonds. The dangling bond at a grain boundary acts as a recombination center or trap center, to reduce the property of carrier (electron/hole) transport. As a result, there is a problem that, because the carriers are vanished due to recombination or trapped in defects, high mobility is not to be expected by the use of such a crystalline semiconductor film.

There is a disclosure, in Japanese Patent Laid-Open No. 2000-114172, of an art that crystallization is made by adding a proper amount of germanium to a silicon film in order to enhance crystal orientation ratio. This publication indicates to obtain a semiconductor film that can be substantially considered as a single crystal exhibiting such a crystallinity that individual crystal grains are arranged in plane orientation order despite it is a semiconductor film aggregated with a plurality of crystal grains. In obtaining it, however, a thermal process at 900–1200° C. is required besides the addition of germanium.

In this manner, crystal quality can be improved by carrying out a thermal process at a high temperature exceeding 900° C. However, such a thermal process cannot be carried out for a crystalline silicon film formed on a glass substrate less resistive to heat. Also, there is a problem that, even if the orientation ratio is enhanced by germanium addition, germanium low in combination energy with hydrogen is not easy for hydrogenation. Namely, a hydrogenation process cannot compensate for the dangling bond caused by germanium.

It is an object of the present invention to provide means for solving the foregoing problem, and to enhance the orientation ratio of a crystalline semiconductor film obtained by crystallizing an amorphous semiconductor film while using as a substrate a less heat-resistive material such as glass thereby providing a semiconductor device using a crystalline semiconductor film with the high quality equivalent to a single crystal.

SUMMARY OF THE INVENTION

In order to solve the foregoing problem, in the present invention, a first crystalline semiconductor film is formed containing first and second elements and having a high crystal orientation, relying upon a crystal orientation of which is formed a second crystalline semiconductor layer based on the first element and having a high orientation ratio. The second element is used to improve orientation ratio. In order to obtain a high-quality crystalline semiconductor film and semiconductor device using same, it is satisfactory to substantially use a crystalline semiconductor film based only on the first element. In view of this point, the present invention has the following structure.

The present invention crystallizes a first amorphous semiconductor film formed on a substrate having an insulating surface, and then deposits thereon a second amorphous semiconductor film and crystallizes it. The second amorphous semiconductor film is epitaxially crystallized relying upon a crystal of an underlying first crystalline semiconductor film.

Accordingly, the crystallinity of the first crystalline semiconductor film is an important characteristic parameter. The means for enhancing the orientation of the is first crystalline semiconductor film includes the application with an amorphous semiconductor film containing germanium in a ratio of 0.1 to 10 atom percent to silicon, and a catalyst element acting to accelerate the crystallization in the amorphous semiconductor film.

The element for accelerating crystallization (catalyst element) uses one or a plurality of those selected from Fe, Co, Ni, Ru, Rh, Pd, Os, Ir, Pt, Cu and Au. Meanwhile, the amorphous semiconductor film is formed in a thickness of 10 nm to 200 nm. By adding the metal element to the amorphous silicon film and carrying out a heating process, formed is a compound of silicon and the metal element (silicide). This is diffused to proceed with crystallization. The germanium added in the amorphous silicon film, not reacting with this compound, exists at an around thereof to cause local strain. The strain acts toward increasing a critical radius of nucleation, to reduce nucleation density and possess an effect to restrict crystal orientation.

It has been found, as a result of experiment, that the concentration of germanium required for causing such an action may be 0.1 atom percent or more and 10 atom percent or less, preferably 1 atom percent or more and 5 atom percent or less to silicon. In case the concentration of germanium exceeds the upper limit value, spontaneous nucleation (nucleation regardless of a compound with an added metal element) is prominent occurring as an alloy material of silicon and germanium, making impossible to enhance the orientation ratio in an obtained polycrystalline semiconductor film. Meanwhile, in the case of below the lower limit value, sufficient strain cannot be caused, also making impossible to enhance the orientation ratio.

The amorphous silicon film added with germanium is formed by a plasma CVD process using intermittent or pulse discharge. The intermittent or pulse discharge is formed by modulating a radio power having an oscillation frequency of 1–120 MHz, preferably 13.56–60 MHz, into a repetitive frequency of 10 Hz–10 kHz and supplying it to a cathode. The ratio in time of radio power application in one period of the repetitive frequency, if given as a duty ratio, is provided with a value of 1–50 percent.

With such an intermittent or pulse discharge, selected is a radical species in a deposition process of an amorphous semiconductor film (herein, refers to an electrically neutral, chemically active atom or molecule) so that film growth can be made with a comparatively long-life radical species. For example, when discomposing $SiH_4$ in a discharge space, various radical or ion species are caused. The radical species repeats the reactions of generations and vanishments. In a steadily sustained discharge, the radical species are kept at a constant existence ratio. However, in the case that there exists a time of off-discharge as in intermittent or pulse discharge, only the long-life radical species is supplied onto a film deposition surface and contributes to film deposition, due to a difference in lifetime between radical or ion species.

The reason of selecting a long-life radical is to inactivate a film growth surface. Germanium is suited for being dispersed and contained in an amorphous silicon film. Because $GeH_4$, a source of germanium, is low in decomposition energy as compared to $SiH_4$, if decomposed at the same supply power, causes atomic germanium, to cause germanium clusters due to gas-phase or surface reaction. According to the foregoing crystal growth model, because germanium is preferably dispersed, desired is intermittent discharge not to cause clusters.

When an amorphous semiconductor film is crystallized, the film volume reduces due to atom rearrangement. As a result, the polycrystalline semiconductor film formed on a substrate involves tensile stresses. However, by containing germanium having a greater atomic radius in a range of 0.1 atom percent or more and 10 atom percent or less, preferably 1 atom percent or more and 5 atoms percent or less, in silicon, the volume contraction upon crystallization is suppressed to reduce the internal stress caused. In this case, in order to obtain a homogeneous effect throughout the film, germanium preferably exists in a dispersed state.

However, germanium has a great atomic radius as compared to silicon. This, when included in silicon, causes a factor to strain the crystal. Meanwhile, because germanium is difficult to compensate for the defects due to hydrogenation, the concentration thereof after crystallization is desirably reduced to a possible low extent. Specifically, utilized is the phenomenon of germanium segregation upon fusion-solidification of a semiconductor containing silicon and germanium. Such a semiconductor film can be easily fused-solidified by laser radiation. The high concentration germanium region segregated with germanium may be removed by chemical etching or chemical mechanical polish to reduce the thickness of a first crystalline semiconductor film. It is preferred that the first crystalline semiconductor film, in its surface, is treated with a solution containing hydrogen fluoride to form a clean surface, and then a second amorphous semiconductor film is deposited thereon. However, air-constituent elements, such as absorbed oxygen, carbon, and nitrogen, may somewhat remain on the surface.

In this manner, a second amorphous semiconductor film is formed on the first crystalline semiconductor film having a high orientation ratio, and crystallized by a heating process, such as furnace anneal or rapid thermal anneal (RTA) or laser radiation. The crystal is allowed to grow in the same plane orientation relying upon the underlying crystal orientation.

As in the above, a method for manufacturing a semiconductor device according to the present invention comprises the steps of: forming a first amorphous semiconductor film containing germanium in a ratio of 0.1 to 10 atom percent to silicon; adding an element having a catalytic action for crystallization to the first amorphous semiconductor film; thereafter carrying out a first crystallizing process with a heating process in an inert gas and a second crystallizing process with radiation of a laser light in an oxidizing atmosphere, to form a first crystalline semiconductor film; removing the first crystalline semiconductor film by a predetermined thickness from its surface; thereafter forming a second amorphous semiconductor film based on silicon on the first crystalline semiconductor film; and crystallizing the second amorphous semiconductor film in an inert gas to form a second crystalline semiconductor film.

Also, another structure comprises the steps of: forming a first amorphous semiconductor film containing germanium in a ratio of 0.1 to 10 atom percent to silicon; adding an element having a catalytic action for crystallization to the first amorphous semiconductor film; thereafter carrying out a first crystallizing process with a heating process in an inert gas and a second crystallizing process with radiation of a laser light in an oxidizing atmosphere, to form a first crystalline semiconductor film; removing the first crystalline semiconductor film by a predetermined thickness from its surface; repeating a plurality of number of times the first crystallization process, the second crystallization process and the etching process in the order; thereafter forming a second amorphous semiconductor film based on silicon on the first crystalline semiconductor film; and crystallizing the second amorphous semiconductor film in an inert gas to form a second crystalline semiconductor film.

The means for removing the first crystalline semiconductor film by a predetermined thickness may be applied with any of wet etching, dry etching and chemical mechanical polish. In the case of using wet etching, it can be made with an etching solution containing $HNO_3$, HF, $CH_3COOH$ and $Br_2$, or an etching solution containing $HNO_3$, HF, $CH_3COOH$ and $I_2$.

Meanwhile, the catalyst element used in crystallizing the first amorphous semiconductor film is removed by gettering. The gettering may be carried out after the second crystallizing process or after forming a second crystalline semiconductor film.

The obtained crystalline semiconductor layer has: a second crystalline semiconductor film based on silicon provided in close contact with a first crystalline semiconductor film containing silicon and germanium; wherein the first crystalline semiconductor film has a (101)-plane orientation ratio of 30 percent or greater and the second crystalline semiconductor film has a (101)-plane orientation ratio of 20 percent or greater. Meanwhile, the first crystalline semiconductor film contains germanium in a concentration of $1\times10^{20}$/$cm^3$ or less and the second crystalline semiconductor film contains germanium in a concentration of $1\times10^{19}$/$cm^3$ or less. Also, provided is a crystalline semiconductor layer that the first crystalline semiconductor film and the second crystalline semiconductor film are coincident in crystal orientation at a ratio of 60 percent or higher.

Meanwhile, the invention forms a first crystalline semiconductor film having a high orientation ratio on a substrate, on which an amorphous silicon film is formed as a second semiconductor layer. By carrying out a laser radiation for crystallization, a semiconductor layer having a high orientation ratio is obtained under the influence of the high orientation ratio of the first crystalline semiconductor layer. Particularly, the first semiconductor layer suitably uses a silicon-germanium ($Si_{1-x}Ge_x$) film.

A $Si_{1-x}Ge_x$ film having a high orientation in the same plane direction is obtained by adding a catalyst element to a $Si_{1-x}Ge_x$ (x=0.001–0.05) film formed by a plasma CVD process and carrying out a heating process on it. The first crystalline semiconductor layer (crystalline $Si_{1-x}Ge_x$ film), obtained by catalyst element addition and heating process, has a high (110)-plane orientation.

Then, an amorphous silicon film is formed as a second semiconductor layer on the first crystalline semiconductor layer, and laser light is radiated to it. At this time, the orientation of the first crystalline semiconductor layer has an effect upon the crystal orientation of the second semiconductor layer (amorphous silicon film), to obtain a crystalline silicon film having a high first (110)-plane orientation. By using the first crystalline semiconductor layer as a seed (nucleus) in a crystallization process for the second semiconductor layer, it is possible to form a preferred crystalline semiconductor layer having a high orientation ratio.

Subsequently, because the catalyst element used in forming the first crystalline semiconductor layer and remaining in the semiconductor layer possibly has a bad effect upon the characteristic of a TFT made using the semiconductor layer, carried out is a process for moving the catalyst element from the semiconductor layer.

A gettering region is formed on the second semiconductor layer. Incidentally, prior to forming a gettering region, a chemical oxide film may be used which is to be formed as a barrier layer on the second semiconductor layer by processing with an ozone-containing solution. On the barrier layer, a semiconductor layer as a gettering region is formed by a sputter or plasma CVD process. Incidentally, the gettering region, because to be removed later by etching, preferably uses a low density film, such as an amorphous silicon film, having a high selective ratio with respect to the crystalline semiconductor layer.

Subsequently, an inert gas element is added to the gettering region. The inert gas element may use one or a plurality of those selected from He, Ne, Ar, Kr and Xe. Incidentally, when forming a gettering-region semiconductor layer, the inert gas, if introduced into the semiconductor layer, can form a gettering region.

Next, carried out is a heating process for moving the catalyst element to the gettering region. The heating process may use any of a method of heating using the radiation heat of a light source, a method of heating with a heated inert gas and a method of heating using a furnace. By such a heating process for gettering, the catalyst element is moved into the gettering region thereby reducing the concentration of the catalyst element remaining in the semiconductor layer down to $1\times10^{17}$/$cm^3$ or less. After ending the gettering process, the gettering region is removed away.

In this manner, a first crystalline semiconductor layer having a high orientation ratio is formed and a second semiconductor layer is formed thereon, followed by radiating a laser light in order for crystallization. Due to this, the second semiconductor layer can also be made into a crystalline semiconductor layer having a high orientation ratio under the influence of the orientation of the first crystalline semiconductor layer.

BRIEF DESCRIPTION OF THE DRAWINGS

The patent or application file contains at least one drawing executed in color. Copies of this patent or patent application publication with color drawings will be provided by the office upon request and payment of the necessary fee.

FIG. 24 is a figure showing a result of observation due to EBSP;

FIGS. 25A to 25D are views showing a TFT fabrication process using the invention;

FIGS. 27A to 27C are views showing a TFT fabrication process using the invention;

FIGS. 37A and 37B are views showing an example of a light-emitting device;

DETAILED DESCRIPTION OF THE PREFERRED EMBODIMENTS

Embodiment 1

The crystalline semiconductor layer, having a high (101)-plane orientation ratio, to be obtained in the present invention is characterized by comprising a plurality of silicon-based semiconductor films. The crystalline semiconductor layer, in a typical embodiment, is formed with a first crystalline semiconductor film based on silicon and containing germanium and a second crystalline semiconductor film based on silicon. The first crystalline semiconductor film is formed by forming a first amorphous semiconductor film on an insulator surface and then crystallizing it by adding a catalyst element for accelerating crystallization. The second crystalline semiconductor film is formed by forming a second amorphous semiconductor film on the first crystalline semiconductor film and then epitaxially growing a crystal thereof by a thermal process or laser radiation.

Figure 1:
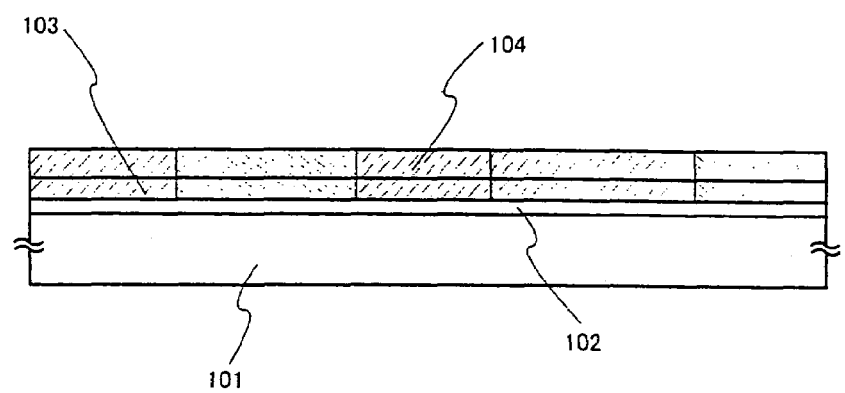
FIG. 1 is a sectional view explaining an embodiment of the present invention.

FIG. 1 is a view explaining a structure of a crystalline semiconductor layer of the invention. A blocking layer 102 is formed on a substrate 101, on which are layered a first crystalline semiconductor film 103 and a second crystalline semiconductor film 104. These integrally constitute a crystalline semiconductor layer. The first and second crystalline semiconductor films are polycrystalline bodies aggregated with a plurality of crystal grains. However, the crystal grains are aligned toward a (101)-plane orientation at a rate of 30 percent or higher, preferably 80 percent or higher. Relying upon the plane orientation of the crystal grains in the first crystalline semiconductor film, the second crystalline semiconductor film has a plane orientation aligned in the same direction with a probability of 60 percent or higher. Namely, the second crystalline semiconductor film is epitaxially grown on the crystals of the first crystalline semiconductor film. FIG. 1 shows individual crystal grains with a different hatching, to illustratively show a manner that the crystal grains in the first and second semiconductor films are grown in the same orientation.

The substrate for forming such a crystalline semiconductor layer is applied with a glass substrate of alumina borosilicate glass or barium borosilicate glass. Besides these, the substrate can employ a semiconductor substrate of quartz, silicon, germanium, gallium or arsenic formed, on a surface, with an insulating film.

In the case of using a glass substrate, a blocking layer is formed of silicon nitride, silicon oxide, silicon oxide nitride, at between the semiconductor film and the glass substrate. This prevents the impurity element of alkali metal element or the like contained in the glass substrate from diffusing into the semiconductor film. The blocking layer, in a preferred example, is a silicon oxide nitride film formed by a plasma CVD process using a reactive gas of $SiH_4$, $N_2O$ and $NH_3$ or a silicon nitride film formed using a reactive gas of $SiH_4$, $NH_3$ and $N_2$. The blocking layer is formed with a thickness of 20–200 nm.

The first amorphous semiconductor film, formed on a surface of the blocking layer, is of silicon added with 0.1–10 atoms percent, preferably 1–5 atom percent, of germanium. The content of germanium can be adjusted by a mixing ratio of $SiH_4$ and $GeH_4$ used as a typical reactive gas. Besides these, the applicable reactive gases include $Si_2H_6$, $SiF_4$, $GeF_4$ and so on, which can be used in proper combination. The first amorphous semiconductor contains a nitrogen and carbon in a concentration of less than $5\times10^{18}/cm^3$, and oxygen in a concentration of less than $1\times10^{18}/cm^3$. This is to prevent an adverse effect upon the electric characteristic in the course of crystallization of the amorphous semiconductor film or of the formed crystalline semiconductor film.

In forming a first amorphous semiconductor film, it is possible to apply various film-forming methods including a plasma CVD process, a low-pressure CVD process and a sputter process. In the case of applying a plasma CVD process as a typical film-forming method, it is preferred that a reactive gas of $SiH_4$ and $GeH_4$ or a reactive gas of $SiH_4$ and $H_2$-diluted $GeH_4$ is introduced into a reaction chamber to carry out deposition under intermittent discharge with a radio frequency discharge of 1–200 MHz modulated at a repetition frequency of 10 Hz–100 kHz. With intermittent discharge, a coat film can be formed with greater homogeneity by the growth based on a radial. The amorphous semiconductor film is deposited to a thickness of 20–100 nm.

In the case of using a low-pressure CVD process, the similar reactive gas can be applied. Preferably, the reactive gas is diluted with He to deposit an amorphous semiconductor film at a temperature of 400–500° C. on the substrate. In any way, the gas used in the invention uses a gas refined to a high purity in order to reduce the concentration of the impurity elements of oxygen, nitrogen carbon to be mixed in the amorphous semiconductor film deposited.

In crystallization, an element for accelerating the crystallization of the amorphous semiconductor film (catalyst element) is introduced into a surface of the first amorphous semiconductor film. The element uses one or a plurality of elements selected from Fe, Ni, Co, Ru, Rh, Pd, Os, Ir, Pt, Cu and Au. These elements can be used as an element for accelerating the crystallization of an amorphous semiconductor film in any of the inventions described in the present description. Although the use of any of the elements provides a similar effect, nickel is typically employed.

The element is introduced, in location, to the entire surface of the second amorphous semiconductor film or the entire surface of the first amorphous semiconductor film, or otherwise to a slitted or dotted surface in proper surface points of the second amorphous semiconductor film. In the latter case, an insulating film is preferably formed on the amorphous semiconductor film so that the element can be introduced by the utilization of openings provided in the insulating film. The opening, although not limited in size, can have a width of 10–40 μm. The longitudinal length may be determined arbitrarily, i.e. in a range of from several tens μm to several tens cm.

The way of introducing the element is not especially limited provided that the techniques is to make a thin film containing the element exist on a surface of or within an amorphous semiconductor film. For example, usable is a sputter process, a deposition process, a plasma processing method (including a plasma CVD process), an absorbing process, or a method of applying a metal salt solution. The plasma processing method utilizes an element sputtered from a cathode within a glow discharge atmosphere using an inert gas. Meanwhile, the method of applying a metal salt solution is simple and advantageous in that element concentration can be easily adjusted.

The metal salt can use various salts. The solvent can use water, alcohols, aldehydes, ethers, other organic solvents, or a mixture of water and any of these organic solvents. Also, there is no limitation to a solution the metal salt is completely dissolved but the solution may have a metal salt existing partly or entirely in a state of suspension. The element, even if any method is employed, is to be dispersedly introduced onto a surface of or into the amorphous semiconductor film.

After the element for accelerating silicon crystallization is introduced by any of the methods, the element is utilized to crystallize the amorphous semiconductor film. The crystallization may use an RTA process, besides a heating process using an anneal furnace. The heating means in the RTA process can employ radiation heating using a halogen lamp or the like or means for heating a semiconductor film by using a heated gas. In the case of the RTA process, heating temperature is 600–750° C. because a heating process proceeds in a brief time. Meanwhile, in the case of using an anneal furnace, a heating process is suitably at 500–600° C. for 1–12 hours. The heating process may be in air or hydrogen atmosphere but suitably in a nitrogen or inert gas atmosphere.

Thereafter, a crystallinity enhancing process is further carried out with radiation of intense light, such as a laser light, an ultraviolet ray or an infrared ray. With only the heating process, it is possible to obtain a crystalline semiconductor film preferentially oriented to {101}. However, preferably a heating process is made followed by radiation of intense light such as laser light. The laser anneal, after the heating process, can repair and vanish the crustal defects left in the grain boundaries. This is an effective measure for a purpose to improve crystal quality.

The laser anneal uses a gas laser, such as an excimer or argon laser, having a wavelength of 400 nm or shorter or a solid-laser second to fourth harmonic as represented by YAG, $YVO_4$, $YAlO_3$ and YLF lasers. For example, the second harmonic of an Nd:YAG laser, having 532 nm, is applied with the light in an absorption band of a semiconductor band-to-band transition. The laser itself may be applied with any of pulse oscillation and continuous oscillation lasers. The laser light is focused into a linear or spot form by an optical system, to provide a radiation with an energy density of 100–700 $mJ/cm^2$. The laser light thus focused is scanned over a predetermined area of the substrate, thereby carrying out the process. In case intense light is radiated by using a light source of a halogen lamp, a xenon lamp, a mercury lamp, a metal halide lamp or an excimer light-emission lamp in place of a laser, the similar effect is to be obtained.

A preferred example using a continuous oscillation laser uses a $YVO_4$ laser oscillator in a continuous oscillation mode. The output 5–10 W of second harmonic (wavelength: 532 nm) of same is focused into a linear laser light having a ratio of a lengthwise to a widthwise of 10 or greater by an optical system. Furthermore, the focusing is made such that an energy density distribution is provided evenly in the lengthwise direction, to carry out scanning at a rate of 10–200 cm/sec. in order for crystallization. The even energy density distribution means not to exclude a perfect constant; i.e. allowable range lies within ±10 percent in an energy density distribution.

The mechanism, obtaining a first crystalline semiconductor film having a high orientation ratio on the (101) plane by the above process, is to be presumed as follows.

The catalyst element introduced in the first amorphous semiconductor film swiftly diffuses within the amorphous semiconductor during a dehydrogenation process. Then, inhomogeneous nucleation commences. The relevant element reacts with silicon to form a silicide. This turns into a crystal nucleus, contributing to the subsequent crystal growth. For example, in the case of using nickel as a typical element, a nickel silicide (hereinafter, described $NiSi_2$) is formed. In the first amorphous semiconductor film, because germanium less solid-dissolves in the $NiSi_2$, a nucleus forms while excluding germanium toward a periphery within the first amorphous semiconductor film.

The $NiSi_2$ does not possess a particular orientation. This, however, is allowed to grow only in a direction parallel with a substrate surface, in case the first amorphous semiconductor film is provided with a thickness of 20–100 nm. In this case, because the interface energy is minimum at the contact between the $NiSi_2$ and the crystalline-semiconductor (111) plane, the plane parallel with a surface of the crystalline semiconductor film is a (110) plane. Preferential orientation occurs on this lattice surface. In the case that the crystal grows in a direction parallel with the substrate surface wherein the growth is in a columnar form, there exists a freedom in a direction about a columnar crystal. Accordingly, the orientation is not always on the (110) plane. It is to be considered that precipitation occur also on the other lattice planes.

As viewed from $NiSi_2$, the germanium having a great atomic radius existing only in a peripheral amorphous region expectedly causes a great strain (tensile stress). The strain energy acts in a direction of increasing the critical radius of nucleation. Furthermore, the strain (compression stress) presumably restricts the nucleus crystal orientation by the $NiSi_2$ to thereby enhance the orientation ratio on a particular crystal plane (specifically, (101) plane).

$NiSi_2$ is of a fluorite structure, which is a structure having nickel atoms arranged between diamond-structured silicon lattices. In case nickel atoms disappear from $NiSi_2$, a silicon crystal structure is left. It has been revealed, from a number of experiments, that nickel atom moves toward the amorphous semiconductor. This can be considered because of the reason that the solid solubility in amorphous semiconductor is higher than that in crystalline semiconductor. Accordingly, a model can be schemed that a crystalline semiconductor is formed as if nickel were moving in amorphous semiconductor. From the consideration, in the first amorphous semiconductor film, a crystal high in orientation ratio on the (101) plane is grown by a heating process.

Figure 2A:
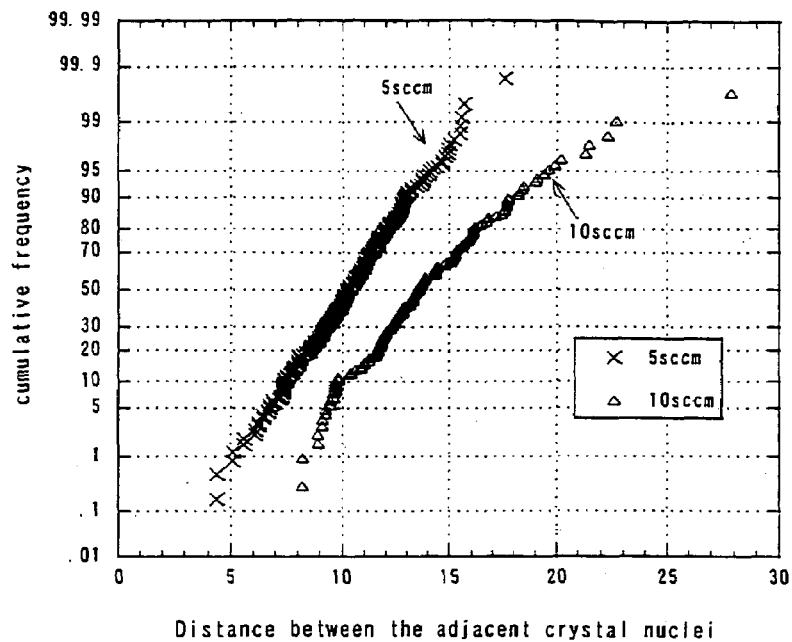
FIGS. 2A and 2B are a cumulative frequency graphs showing adjacent distance of crystal nuclei.
Figure 2B:
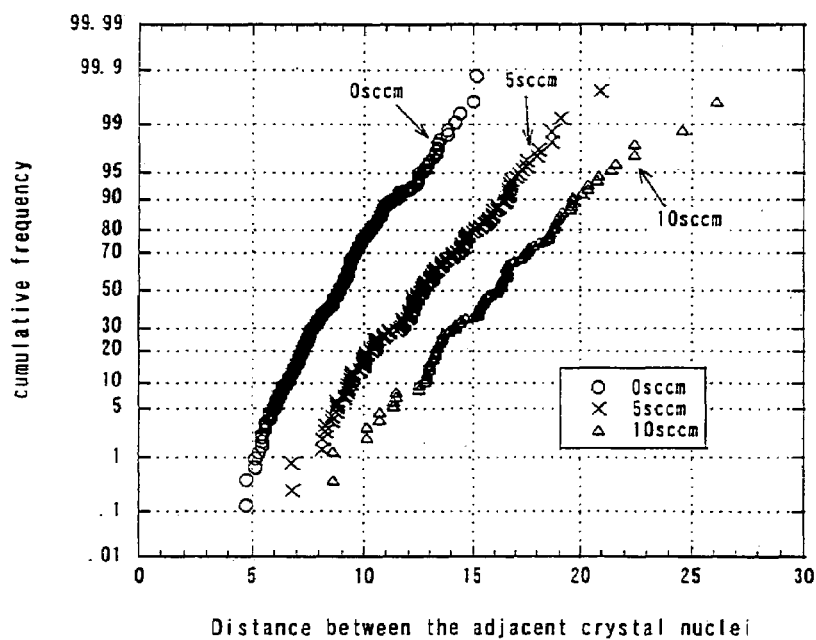
Figure 3:
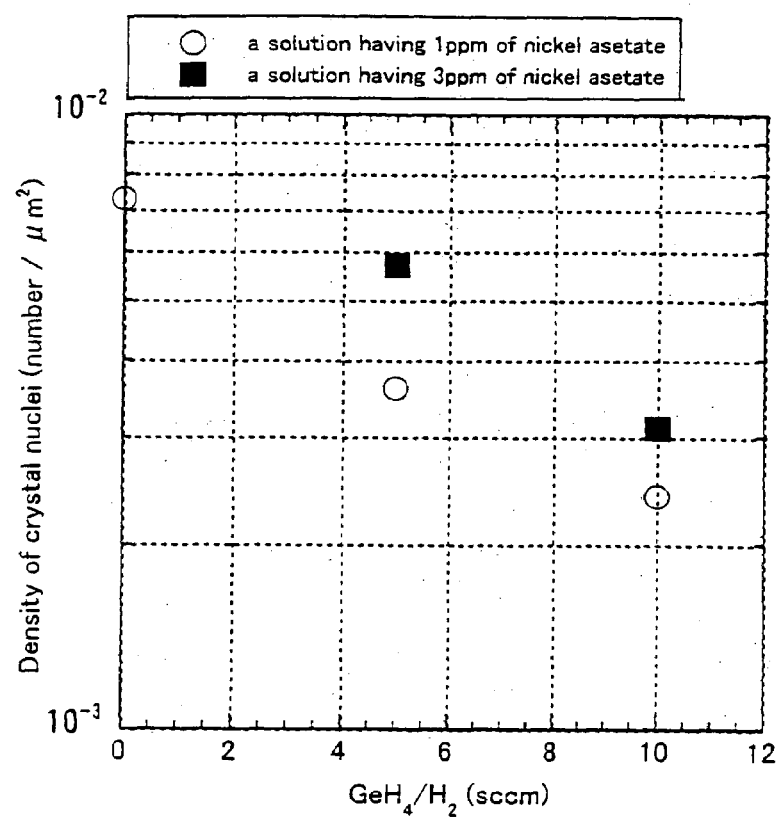
FIG. 3 is a graph showing a relationship between an addition amount of $GeH_4$ and a crystal nucleation density.

In case amorphous silicon contains 0.1–10 atom percent of germanium, the nucleation density of crystal lowers. FIGS. 2A and 2B are results of an examination of a $GeH_4$ addition dependency on a distance between the adjacent crystal nuclei, a cumulative frequency of which is shown on the vertical axis. FIG. 2A is a result of using a solution having 3 ppm of nickel acetate as an element to accelerate silicon crystallization. FIG. 2B shows a result of 1 ppm. The increase of $GeH_4$ addition amount means a corresponding increase of concentration of the germanium contained in the amorphous semiconductor film. The results of FIGS. 2A and 2B both indicate that the distance between the adjacent crystal nuclei increases with increase in $GeH_4$ addition amount. Based on this result, FIG. 3 shows a density of crystal nuclei against $GeH_4$ addition amount. There is shown a tendency that the density of crystal nuclei lowers with the increase of $GeH_4$ amount. This result backs up, in the foregoing consideration, that the existence of germanium in amorphous semiconductor film acts toward increasing the critical radius of nucleation.

Figure 14:
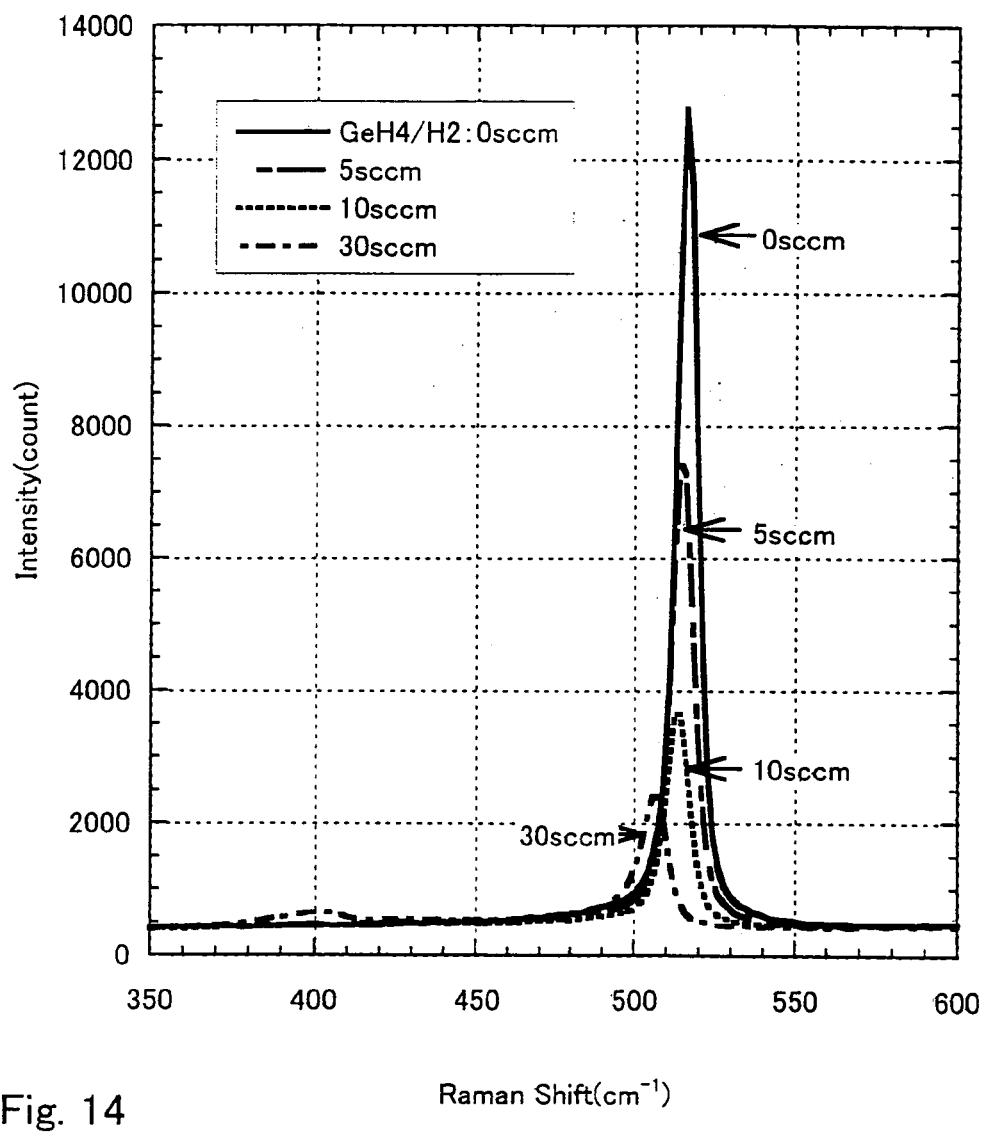
FIG. 14 is a graph showing a Raman spectrum on a crystalline semiconductor film containing germanium.

The adequacy of germanium concentration can be estimated from a property of a crystalline semiconductor film formed. FIG. 14 shows the Raman spectroscopic analysis data where the $GeH_4$ flow rate is varied during deposition. It has been revealed, by SIMS, that germanium content is 1.5 atom percent at a $GeH_4$ flow rate of 5 SCCM, 3 atom percent at 10 SCCM and 11 atom percent at 30 SCCM. However, it is shown, as seen from Raman spectrum, that the peak is shifted in position toward a lower frequency as germanium concentration increases. The shift from 520.7 $cm^{-1}$ of single-crystal silicon represents a crystal strain, wherein the strain increases with germanium content increase. With respect to 516 $cm^{-1}$ of a film not added with $GeH_4$, 515 $cm^{-1}$ at 5 SCCM and 514 $cm^{-1}$ at 10 SCCM. With respect to this, departure is as great as 506 $cm^{-1}$ at 30 SCCM. Accordingly, it can be seen from a viewpoint of crystal strain that the maximum content of germanium is 10 atomic percent or less, preferably 5 atom percent or less.

Figure 4:
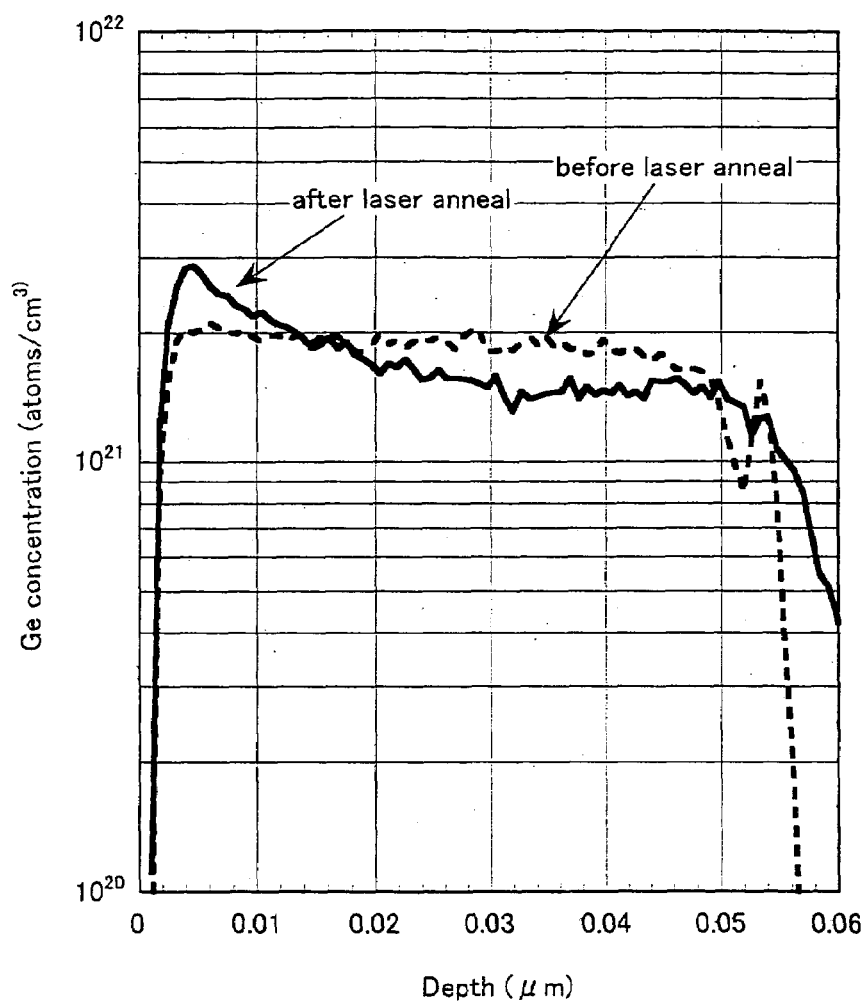
FIG. 4 is a graph showing a germanium concentration distribution in a first crystalline semiconductor film before and after laser anneal.

By the laser anneal for solidification once through a fusion state, the crystal orientation ratio is improved and wherein germanium having a low melt point aggregates toward a film surface. FIG. 4 is a result of measurement, by SIMS, on the germanium concentration distribution of after solid-phase growth and after laser anneal, showing that the germanium concentration after laser anneal is increased close to the surface. Due to this, a reduction in germanium concentration is confirmed within the film. It can be conformed that germanium has apparently aggregated toward the film surface.

It can be considered that germanium acts effectively for enhancing a silicon-crystal orientation ratio in crystallization as described above. However, the existence of germanium causes defects. The defects result from silicon-network irregularity, and from the nature that germanium itself is less compensated for with hydrogen. Consequently, germanium is not necessarily required after a crystallization.

Because germanium after laser anneal aggregates to the surface as shown in FIG. 4, the means can be provided to etch-remove a high concentration layer. The etching can be carried out with an etching solution including $HNO_3$, HF, $CH_3COOH$ and $Br_2$ (referred to as CP-4) or $HNO_3$, HF, $CH_3COOH$ and $I_2$ (referred to as CP-8). Besides these, a Secco solution, a Dash solution or the like may be employed.

Meanwhile, by repeating laser anneal and etching processes a plurality of times, the germanium concentration in the first crystalline semiconductor film can be further reduced while maintaining a crystal orientation. Of course, there is a thickness decrease in the first crystalline semiconductor film. However, the trice etching processes of 5 nm per once on a film thickness of 50 nm can reduce the remaining germanium concentration down to $1 \times 10^{21}/cm^3$ or less.

Thereafter, a second amorphous semiconductor film is formed on the first crystalline semiconductor film by a deposition technique, such as a plasma CVD or low-pressure CVD process. The second amorphous semiconductor film is a semiconductor film based on silicon, to be typically formed by an amorphous silicon film. The second amorphous semiconductor film is formed to a thickness of 10–100 nm, preferably a thickness of 30–60 nm. The first crystalline semiconductor film at its surface is removed of an oxide film by hydrogen fluoride. In the process, however, adhesion elements of oxygen, carbon and the like remain due to the air on the film surface. They are held to remain at an interface.

The second amorphous semiconductor film is crystallized by a heating process or laser anneal. Crystallization is by an epitaxial growth relying upon the underlying crystal. Namely, a crystalline semiconductor layer having a high orientation ratio can be obtained while leaving the underlying-layer orientation as it is.

Next, shown is one example of a method for forming a crystalline semiconductor layer on the basis of the invention. The reactive gas for forming a first amorphous semiconductor film uses $SiH_4$ and $GeH_4$ diluted by hydrogen to 10 percent. The reactive gases for use are refined to a high purity, in order to reduce the concentration of the impurities of oxygen, nitrogen and carbon contained in an amorphous semiconductor film formed. The purity of $SiH_4$ is applied with 99.9999 percent or higher, while $GeH_4$ is with 1 ppm or less of nitrogen/hydrocarbon compound and 2 ppm or less of $CO_2$. In the case that a germanium content against silicon is to be varied in the first amorphous semiconductor film, the mixing ratio in gas flow rate of $SiH_4$ and $GeH_4$ diluted by $H_2$ to 10 percent is varied while making the total flow rate constant. Besides, the common condition is under a radio frequency power of 0.2–0.5 $W/cm^2$, preferably 0.35 $W/cm^2$ (27 MHz) modulated into a pulse discharge having a repetition frequency of 1–10 kHz (duty ratio: 30 percent) to be fed to a cathode of a parallel plate type plasma CVD apparatus. Reaction pressure is 20–50 Pa, preferably 33. 25 Pa, substrate temperature is 300° C. and electrode spacing is 35 mm.

Figure 5:
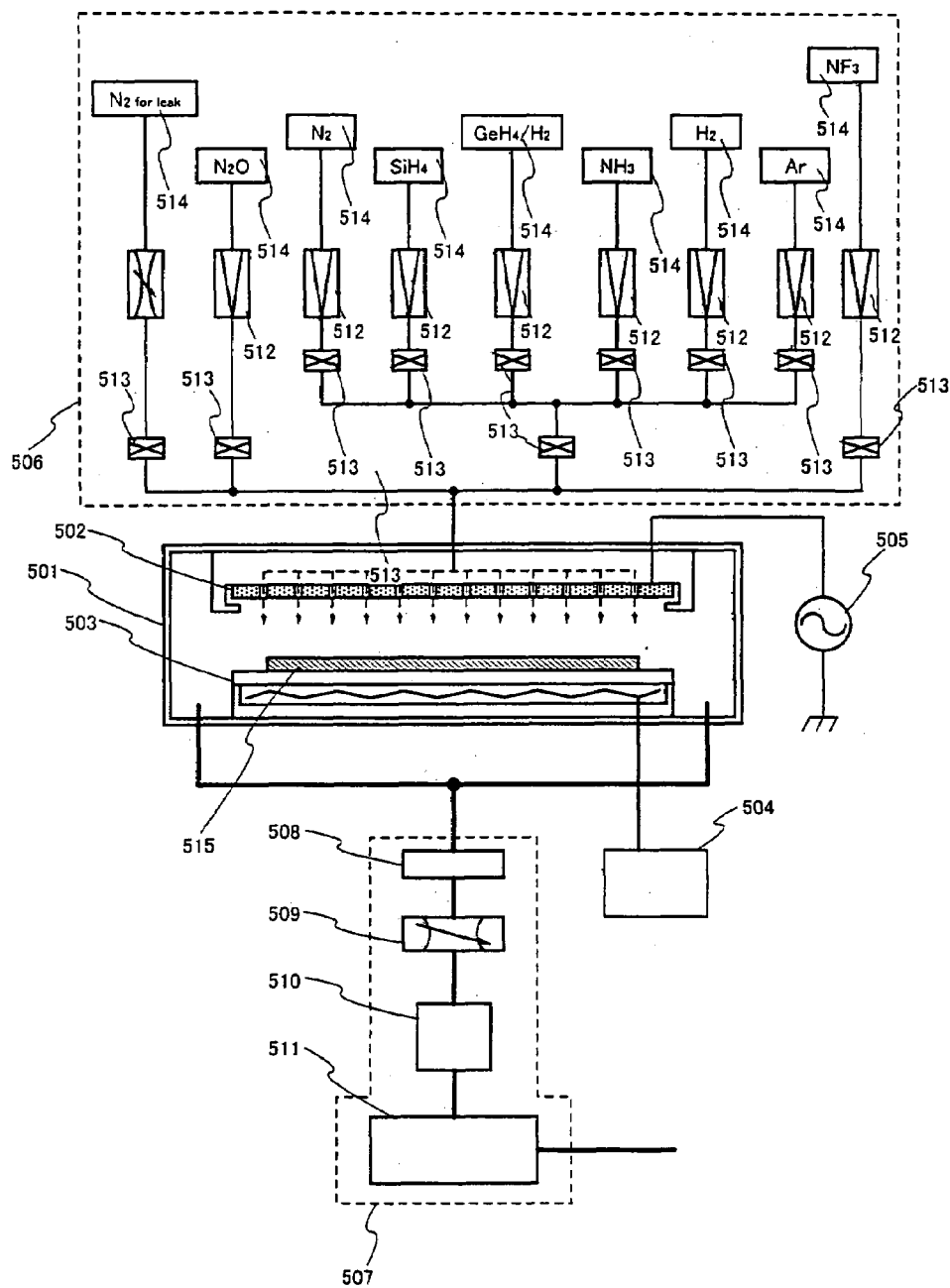
FIG. 5 is a diagram showing a structure of a plasma CVD apparatus to be used in the invention.

FIG. 5 shows one example of a plasma CVD apparatus structure to be used in forming first and second amorphous semiconductor films. The plasma CVD apparatus is of a parallel plate type having, within a reaction chamber 501, a cathode 502 connected with a radio frequency power source 505 and an anode 503. The cathode 502 is in a shower plate form so that the reactive gas from gas supply means 506 can be supplied through the shower plate into the reaction chamber. The anode 503 has heating means 504 of a seeds heater or the like, on which a substrate 515 is placed. A gas supply system, although the detail is omitted, is structure with a cylinder 514 filled with $SiH_4$, $GeH_4$ and the like, a mass flow controller 512 for controlling gas flow rate, 25 and a stop valve 513. A discharge means 507 is made up with a gate valve 508, an automatic pressure control valve 509, a turbo molecular pump (or combined molecular pump) 510 and a dry pump 511. The turbo molecular pump (or combined molecular pump) 510 and the dry pump 511 do not use lubricant oil, to completely eliminate the pollution due to oil diffusion within the reaction chamber. For the reaction chamber having a volume of 13 litters, a turbo molecular pump having a discharge rate of 300 litters/sec. is arranged in a first stage and a dry pump having a discharge rate of 40 $m^3$/hr is arranged in a second stage, to prevent organic matter vapor from reverse diffusing from a discharge system and enhance the attainable vacuum degree within the reaction chamber. Thus, impurity elements are prevented from being mixed in to a possible less extent during forming an amorphous semiconductor film.

A first amorphous semiconductor film, to be formed on an insulating surface, is given a thickness of 5–30 nm. The first amorphous semiconductor film is added by germanium having a greater atom diameter than that of silicon, thereby obtaining an effect of reducing the crystal nucleation density. The similar effect is available, in place thereof, with using Ar, Kr or Xe, an inert gas not to combine with tin or silicon. In this case, although silicon becomes difficult to crystallize, the problem can be eliminated by carrying out a crystallization using a catalyst element.

In crystallizing the first amorphous semiconductor film, nickel is used as an element to accelerate silicon crystallization, to carry out a heating process at 500–600° C. and laser anneal. There is a method, as a representative forming condition, of carrying out a heating process in a nitrogen atmosphere at 550° C. for 4 hours and laser anneal. Nickel is applied by a spinner by using a solution containing nickel acetate at a concentration of 10 ppm. Meanwhile, in laser anneal, a XeCl excimer laser (wavelength: 308 nm) is used and radiated at a radiation energy density of 300–600 $mJ/cm^2$ with an overlapping ratio of 90–95 percent. Laser anneal is made to crystallize an uncrystallized portion of a crystallized film by heating, or to repair the defects within grain boundaries. Meanwhile, this is done to aggregate germanium toward a film surface.

The first crystalline semiconductor film is thickness-reduced by being removed a thickness of from a surface of 1–10 nm, preferably approximately 5 nm. Thickness reduction is by chemical etching, such as wet or dry etching, or removal due to chemical mechanical polishing. By thus removing the surface layer aggregated with germanium, the first crystalline semiconductor film is reduced in thickness but can be reduced in germanium concentration. By repeating the laser anneal and etching process, it is possible to reduce the concentration of the germanium remaining in the first crystalline semiconductor film.

Removed is an oxide film formed on a surface of the first crystalline semiconductor film. The removal of the oxide film is by the use of hydrogen fluoride or buffer hydrogen fluoride. Thereafter, a second amorphous semiconductor film is formed by a plasma CVD process. The second amorphous semiconductor film is formed by the use of $SiH_4$, a mixture gas of $SiH_4$ and hydrogen, or $Si_2H_6$. The thickness of deposition is 10–50 nm. Thereafter, crystallization is made by solid-phase growth due to laser anneal or heating process. In this case, epitaxial crystal growth is available relying upon a crystal orientation of the underlying first crystalline semiconductor film.

In this manner, it is possible to obtain a crystalline semiconductor layer exhibiting a high orientation property relative to a (101) plane while using a low heat-resisting material, such as glass, as a substrate. This semiconductor layer comprises a first crystalline semiconductor film and a second crystalline semiconductor is film. By the laser anneal and etching process as noted above, a crystalline semiconductor layer can be obtained which is low in germanium content while having a high orientation ratio. Thus, a crystalline semiconductor layer can be obtained having a high quality equivalent to a single crystal.

Of course, the crystalline semiconductor layer is not limited to the two layers, but may be an overlying structure having three or more layers. In such a case, it is preferred to provide a form having, overlying a substrate, a plurality of semiconductor layers with a germanium content gradually reduced. Such a structure can form a crystalline semiconductor film gradually reduced in germanium amount and high in {101}-plane orientation ratio. Such a crystalline semiconductor film having a high {101}-plane orientation ratio can be used in a channel region determining a device characteristic, such as a channel region and a photoelectric converting layer of a photovoltaic device.

Embodiment 2

Figure 21A:
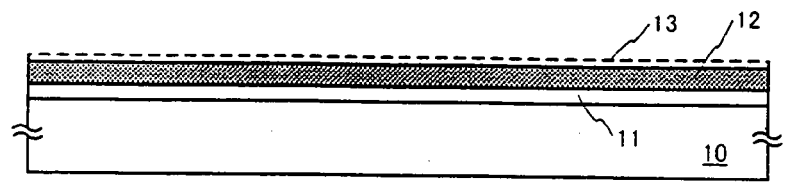
FIGS. 21A to 21E are views showing an embodiment of the invention.
Figure 21B:
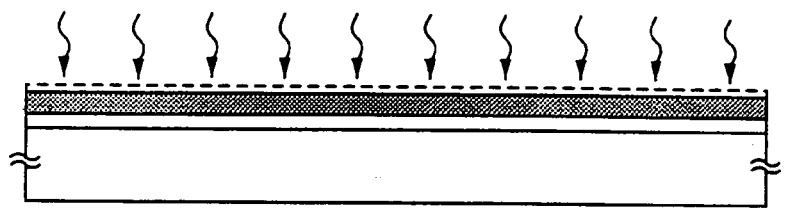

As shown in FIG. 21A, an underlying insulating film 11 is formed on a substrate 10, and an amorphous silicon-germanium ($Si_{1-x}Ge_x$: x=0.001–0.05) film 12 is formed as a first semiconductor layer on the underlying insulating film 11. The underlying insulating film 11 uses the overlying layers of a silicon oxide nitride film formed using $SiH_4$, $NH_3$ and $N_2O$ as a reactive gas and a silicon oxide nitride film deposited using $SiH_4$ and $N_2O$ as a reactive gas.

The first semiconductor layer 12 is an amorphous silicon-germanium film formed by plasma CVD process or low pressure CVD process, similarly to Embodiment 1. The amorphous semiconductor film is deposited to a thickness in a range of 20–100 nm.

Subsequently, a crystallization process is made on the first semiconductor layer. During crystallization, a catalyst element 13 similar to that of Embodiment 1 is added to a surface of the first semiconductor layer 12. The use of any of the foregoing elements can provide an equivalent, similar effect. However, nickel is typically used. The way of adding such a catalyst element to the semiconductor layer is not especially limited provided that it is a technique for allowing it to exist in a surface of or within the semiconductor layer, similarly to Embodiment 1 (FIG. 21A).

Figure 21C:
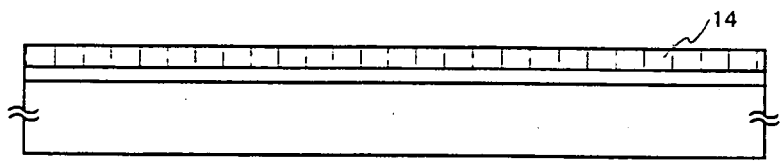

After adding the catalyst element to the semiconductor layer by any of the methods, a heating process is carried out to form a first crystalline semiconductor ($Si_{1-x}Ge_x$: x=0.001–0.05) layer 14. It is satisfactory to use any of a method of heating using the radiation heat of a light source, a method of heating with a heated inert gas and a method of heating using a furnace (FIG. 21C).

Figure 21D:
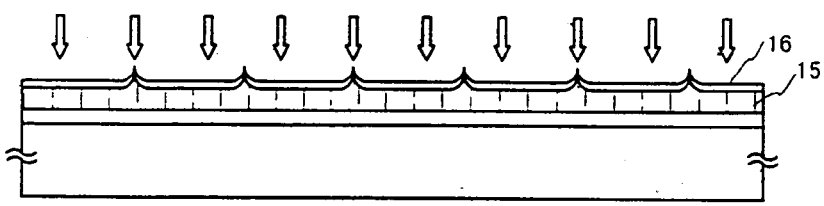
Figure 21E:
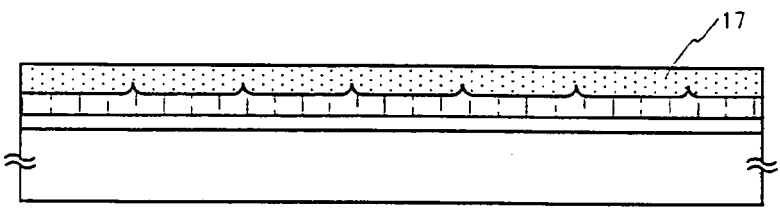

Next, radiation of a first laser light is made to the first crystalline semiconductor ($Si_{1-x}Ge_x$: x=0.001–0.05) layer 14 in an oxygen or air atmosphere. In the state so far, preferred orientation is made on (101) to thereby obtain a first crystalline semiconductor layer 15 having large-sized crystal grains (FIG. 21D). Note that the first crystalline semiconductor layer 15 at its surface is made in a concavo-convex form by the laser radiation process in the atmosphere containing oxygen. Also, an oxide film 16 is formed.

The laser light uses, as a light source, an excimer laser having a wavelength of 400 nm or shorter or a second harmonic (wavelength: 532 nm) to fourth harmonic (wavelength: 266 nm) of YAG or $YVO_4$ laser. The laser light is focused into a linear or spot form by an optical system and radiated at an energy density of 200–500 $mJ/cm^2$. The focused laser light is scanned over a predetermined area of the substrate and radiated to the crystalline semiconductor film with an overlapping ratio of 90–98 percent.

After laser radiation, removed is the oxide film 16 formed in a surface of the first crystalline semiconductor layer 15 to form a second semiconductor layer 17 on the first crystalline semiconductor layer. The second semiconductor layer 17 is formed by an amorphous silicon film to a film thickness of 20–100 nm by a plasma CVD process.

Figure 22A:
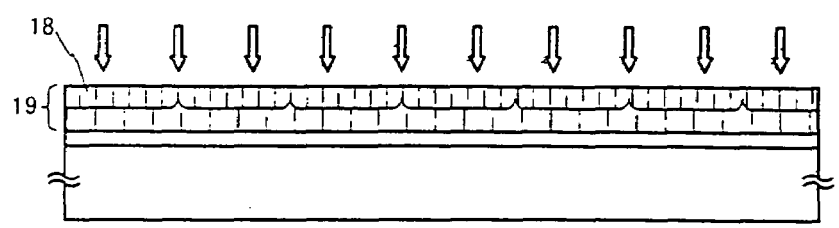
FIGS. 22A and 22B are views showing an embodiment of the invention.

Subsequently, as shown in FIG. 22A, laser light is radiated to the second semiconductor layer to cause crystallization under the influence of an orientation of the first crystalline semiconductor layer. The process of second laser radiation is carried out in a nitrogen atmosphere or vacuum. The second laser light uses, as a light source, an excimer laser having a wavelength of 400 nm or shorter or a second harmonic (wavelength: 532 nm) to fourth harmonic (wavelength: 266 nm) of YAG or $YVO_4$ laser. The laser light is focused into a linear or spot form by an optical system and radiated at an energy density of 400–800 $mJ/cm^2$. The focused laser light is scanned over a predetermined area of the substrate and radiated to the crystalline semiconductor film with an overlapping ratio of 90–98 percent.

In this manner, formed is a crystalline semiconductor layer 19 having the overlying layers of the first crystalline semiconductor layer (crystalline silicon-germanium film) and the second crystalline semiconductor layer 18 (crystalline silicon film). Incidentally, in the second laser radiation process, no concavo-convex is formed in the surface of the obtained crystalline semiconductor layer.

Figure 22B:
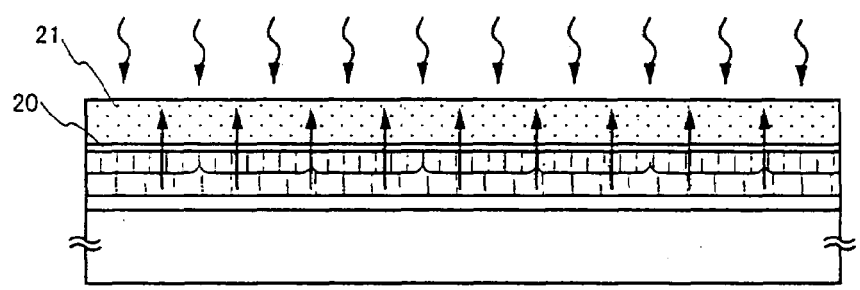

Next, explanation is made on a process to remove the catalyst element contained in the semiconductor layer as shown in FIG. 22B. A barrier layer 20 is formed on the crystalline semiconductor layer. Although barrier layer thickness is not especially limited, it may be substituted with a chemical oxide film to be simply formed by processing with an ozone-containing solution. Meanwhile, a chemical oxide film can be similarly formed by processing with a solution of sulfuric acid, chloride acid or nitric acid mixed with hydrogen peroxide water. As another method, an oxidation process may be made by a plasma process in an oxygen atmosphere or by causing ozone due to ultraviolet ray radiation in an oxygen-containing atmosphere. Meanwhile, a clean oven may be used for heating up to approximately 200–350° C., to form a thin oxide film for use as a barrier layer. Otherwise, a barrier layer may be formed by depositing an oxide film to approximately 1–5 nm by a plasma CVD process, a sputter process or a deposition process.

On the barrier layer, a semiconductor film is formed for a gettering region 21 by a plasma CVD process or sputter process. Typically, formed is an amorphous silicon film containing 0.01–20 atom percent of Ar by a sputter process. This semiconductor film, because to be removed after a gettering process, is desirably made by a low-density film in order to enhance an etching selective ratio to be crystalline semiconductor layer. In case an inert gas element is added in the amorphous silicon film to simultaneously mix the inert gas in the film, a gettering site can be formed by that. The inert gas element uses one or a plurality of those selected from He, Ne, Ar, Kr and Xe.

Next, a heating process is carried out in order for gettering. The heating process may use any of a method using a furnace (in a nitrogen atmosphere at 450-600° C. for 0.5–12 hours), an RTA process using a heating light source (instantaneously to a silicon film at 600–1000° C. for 1–60 seconds), and an RTA process with a heated inert gas (at 550–700° C. for 1–5 minutes). The heating process causes the catalyst element to move into the gettering region by diffusion.

Thereafter, the semiconductor film 21 is selectively etched and removed away. The etching can be carried out by dry etching with $ClF_3$ without using a plasma or wet etching with an alkali solution such as a solution containing hydrazine or tetraethyl ammonium hydroxide (chemical formula: $(CH_3)_4NOH$). In this case, the barrier layer 20 acts as an etching stopper. The barrier layer 20 may be removed later by hydrogen fluoride.

By using the invention as in the above, the catalyst element contained in the crystalline semiconductor layer can be reduced in concentration down to $1 \times 10^{17}/cm^3$ or lower. Meanwhile, the obtained crystalline semiconductor layer is formed by the overlying layers of a first crystalline semiconductor layer having a high orientation ratio and a second crystalline semiconductor layer crystal-grown under the influence of the first crystalline semiconductor layer. This is a favorable crystalline semiconductor layer having a high orientation ratio and aggregated with large-sized crystal grains.

Shown is a result of observation on an obtained semiconductor film by an electron backscatter diffraction pattern (hereinafter, referred to as EBSP).

Figure 23:
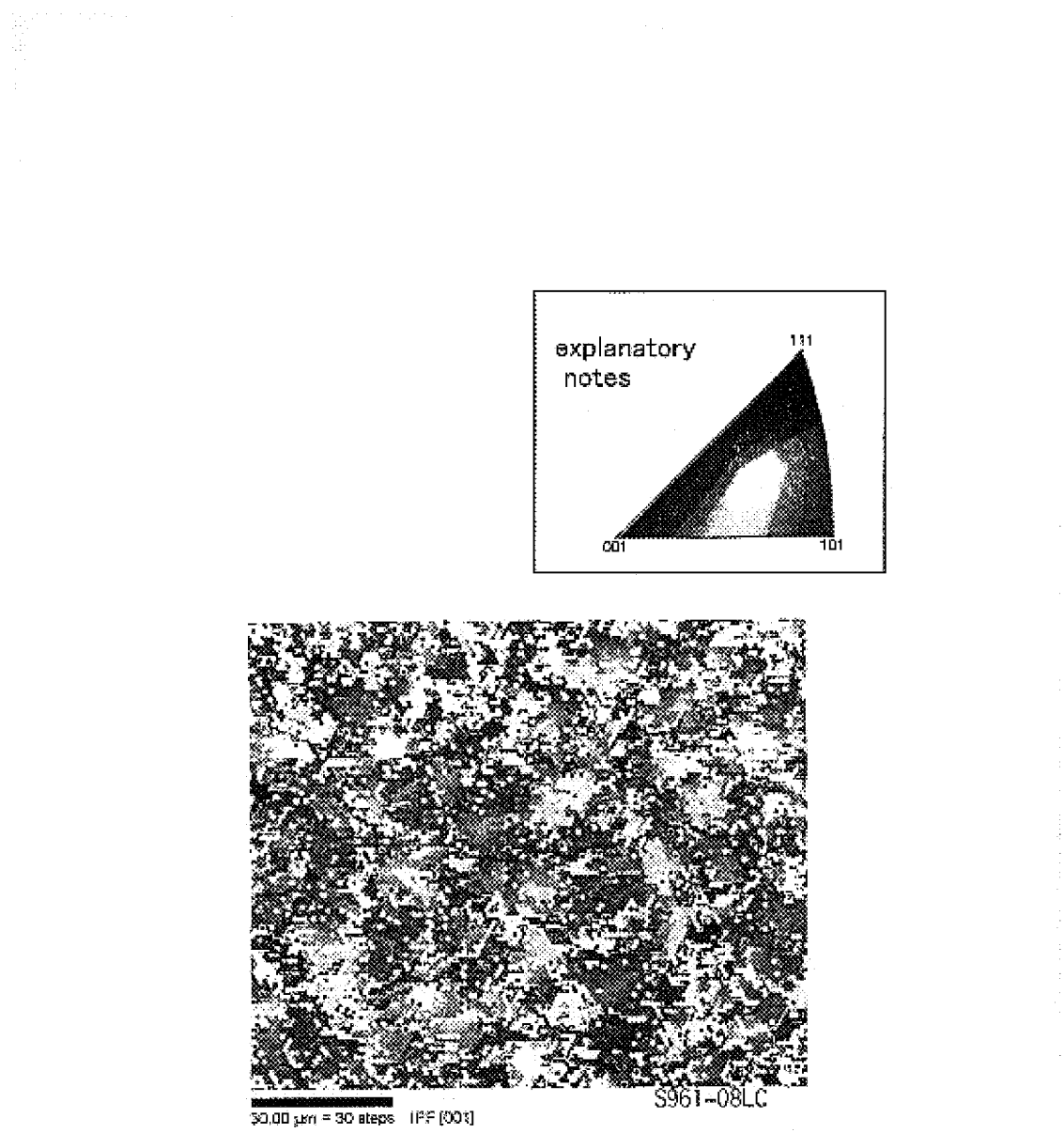
FIG. 23 is a figure showing a result of observation due to EBSP.

EBSP is means having an exclusive detector provided on a scanning electron microscope (SEM) to analyze a crystal orientation by the backward scatter of primary electrons. The analysis of orientation is repeated while moving a position of a sample to be hit by an electron beam (mapping measurement) thereby obtaining information of a crystal orientation or alignment on a planar sample. In one example, the crystal orientation to a surface of the crystal grains at each measuring point can be expressed in colors, as shown in this embodiment. Three tops of the explanatory notes in FIGS. 23 and 24 show (111)-plane, (001)-plane, and (101)-plane, respectively. In the explanatory notes, as the color showing the crystal orientation approaches to the top, the orientation ratio becomes higher. In the present invention, the (111)-plane is highly occupied in a blue region, the (001)-plane is highly occupied in a red region, and the (101)-plane is highly occupied in a green region. Meanwhile, considering a certain measuring point, a region in an adjacent point of within a range of crystal-orientation deviation angle set by an observer (allowable deviation angle) can be expressed with distinction.

The allowable deviation angle is to be freely set by the observer. Setting the allowable deviation angle at 10 degrees to consider on a certain point, referred to as a crystal grain is a region of within a crystal-orientation deviation angle of 10 degrees or less at an adjacent point, wherein a plurality of crystal grains aggregate to form a crystalline semiconductor film in a polycrystalline structure.

In FIGS. 23 and 24, the region in the same color can be considered as one crystal grain. Incidentally, although the crystal grain in actual is formed by a plurality of o crystal grains, they can be macroscopically considered as one crystal grain because the crystal-orientation allowable deviation angle is small within the crystal grain.

FIG. 23 is a result of observation on a crystalline semiconductor layer made by using the invention. The making method will be briefly explained in the below. First, a silicon-germanium film containing 3.5 atomic percent of germanium is formed as a first semiconductor layer to a film thickness of 55 nm by a CVD process. Then, nickel is added as a catalyst element to the first semiconductor layer. A solution containing 10 ppm by weight of nickel is applied to a surface of the first semiconductor layer by a spin coat technique. The first semiconductor layer is heat-processed at 500° C. for 1 hour thereby desorbing hydrogen, followed by being heating-processed at 580° C. for 4 hours by the use of a furnace. Due to this, the first semiconductor layer is crystallized to form a first crystalline semiconductor layer having a high (101)-plane orientation ratio.

Subsequently, the oxide film formed on a surface of the first crystalline semiconductor layer is removed. After the surface is cleaned, a first laser light is radiated. The first laser radiation is carried out in an oxidizing atmosphere. By this process, the first crystalline semiconductor layer is made in a concavo-convex form in the surface thereof. Subsequently, the oxide film formed on the surface of the first crystalline semiconductor layer is again removed. After cleaning the surface, an amorphous silicon film is formed as a second semiconductor layer to a film thickness of 30 nm. Then, a second laser light is radiated to the second semiconductor layer to crystallize the second semiconductor layer. Incidentally, the second laser radiation may be made in an atmosphere containing nitrogen. In this process, a second semiconductor layer is crystal-grown under the influence of an orientation of the first crystalline semiconductor layer so that crystal growth is done aggregated with large-sized crystal grains with a high orientation ratio. Observing such a crystalline semiconductor layer by EBSP, it can be seen, as shown in FIG. 23, that the regions having a color exhibiting a (101) plane are many and the (101)-plane orientation ratio is as high as 30–40%. FIG. 24 shows, for comparison, a result of observation of a crystalline silicon film made by crystallizing an amorphous silicon film used as a first semiconductor layer by a crystallization method using a catalyst element (similar process to that of the invention) to form again an amorphous silicon film as a second semiconductor layer and then laser radiation is made similarly to the invention.

As apparent from a comparison between FIG. 23 and FIG. 24, the crystalline semiconductor film made by using the invention is high in (101)-plane orientation ratio and obtained with large-sized crystal grains. Thus, a crystalline semiconductor film is obtained which is aggregated with such large-sized crystal grains to have high crystallinity.

EXAMPLES

Example 1

Figure 6A:
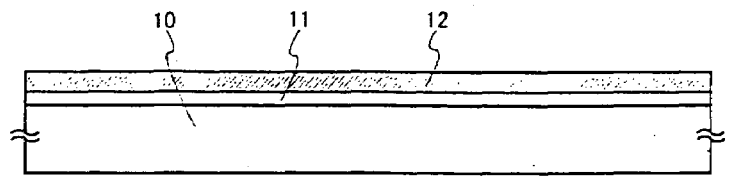
FIGS. 6A to 6F are sectional views explaining a making process of a crystalline semiconductor film according to the invention.

An example of the present invention will be explained with reference to FIGS. 6A to 6F and 7A to 7C. First, as shown in FIG. 6A, on the substrate 10 is formed as a blocking layer 11 an insulation layer of sequentially layering a silicon oxide nitride film formed using $SiH_4$, $NH_3$ and $N_2O$ as a reactive gas and a silicon oxide nitride film formed using $SiH_4$ and $N_2O$ as a reactive gas. On this, a film is used as a first amorphous semiconductor film 12 of silicon added with 3 atom percent of germanium. This amorphous semiconductor film is formed by plasma CVD process using $SiH_4$ and $GeH_4$ diluted with $H_2$ to 10% at a flow rate ratio of 9:1. Substrate heating temperature is 300° C. and reaction chamber inside pressure is 33.25 Pa, to decompose the reactive gas by a radio frequency power of 27 MHz and 0.35 W/cm², thereby depositing a amorphous semiconductor film. At this time, discharge is by an intermittent discharge at a repetitive frequency of 10 KHz and duty ratio (time ratio of on and off to supply electric power) of 30 percent.

In any way, the gas for use in the invention uses a high purity refined to reduce the concentration of the impurity elements of oxygen, nitrogen, carbon and the like to be mixed in a deposited amorphous silicon-germanium film. The first amorphous semiconductor film 12 deposited has a thickness in a range of 20–100 nm.

Figure 6B:
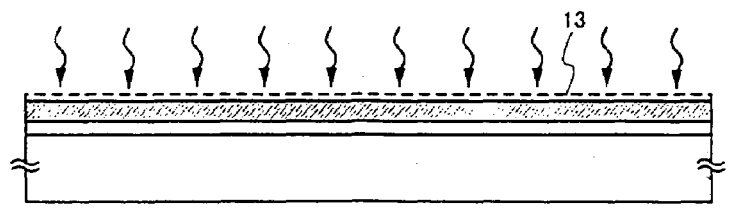

Subsequently, as shown in FIG. 6B, a crystallization process is carried out on the first amorphous semiconductor film 12. In crystallization, nickel is added as a catalyst element to a surface of the first amorphous semiconductor film. How to add nickel uses a cathode formed of a nickel material to sputter the cathode due to glow discharge with an inert gas such as Ar, thereby depositing a slight amount of nickel on the first amorphous semiconductor film 12. Another technique may apply a method to apply a solution of a metal salt.

Figure 6C:
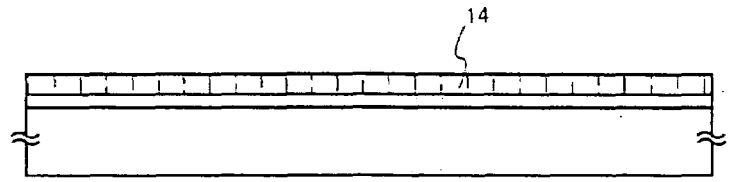

After adding the catalyst element, a heating process is made for crystallization. The heating process may use any of a method of heating using the radiation heat of a light source, a method of heating with a heated inert gas and a method of heating using an anneal furnace. In this manner, a first crystalline semiconductor film 14 is formed as shown in FIG. 6C.

Figure 6D:
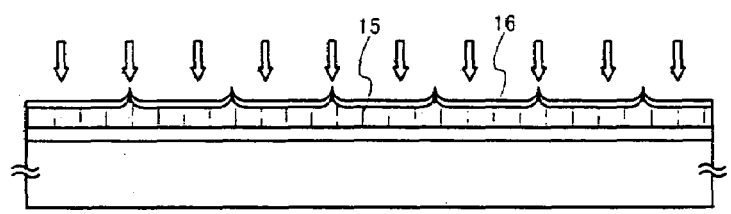

Next, laser light is radiated to the first crystalline semiconductor film 14 in an oxygen or air atmosphere. The laser light uses an excimer laser having a wavelength of 400 nm or shorter, or pulse or continuous oscillation laser light outputted from a second harmonic (wavelength: 532 nm) to fourth harmonic (wavelength: 266 nm) of a YAG laser. The laser light is focused into a linear or spot form by an optical system and radiated at an energy density of 200–500 mJ/cm$^2$. The focused laser light is scanned over a predetermined area of the substrate and radiated to the first crystalline semiconductor film with an overlapping ratio of 90–98 percent. Incidentally, by the laser radiation process in an atmosphere containing oxygen, a projection (also called ridge) is formed in a surface of the first crystalline semiconductor film 15. Also, because of fusion and solidification in an air atmosphere, an oxide film is formed on the surface (FIG. 6D).

Figure 6E:
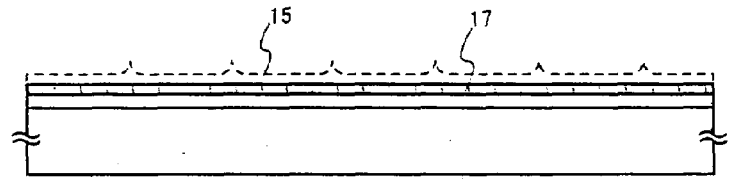

After laser radiation, the oxide film 16 formed in a surface of the first crystalline semiconductor layer 15 is removed by a buffer hydrogen fluoride. Thereafter, the surface layer of the first crystalline semiconductor film 15 is removed a thickness of approximately 5 nm by an etching solution mixed with 5HNO$_3$, 3HF, 3CH$_3$COOH and 0.1Br$_2$ (referred to as CP-4). This can remove away a high concentration region aggregated with germanium whereby germanium concentration can be reduced in the remaining first crystalline semiconductor film. By the above process, it is possible to obtain a first crystalline silicon-germanium film 17 preferentially oriented to (101) to have a large-sized crystal grains, as shown in FIG. 6E.

Figure 6F:
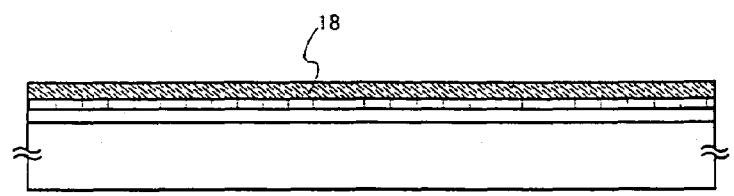

Thereafter, a second amorphous semiconductor film is formed on the first crystalline semiconductor film 17. The second amorphous semiconductor film 18 is formed of amorphous silicon by a plasma CVD process, a thickness of which is given 50 nm (FIG. 6F).

Figure 7A:
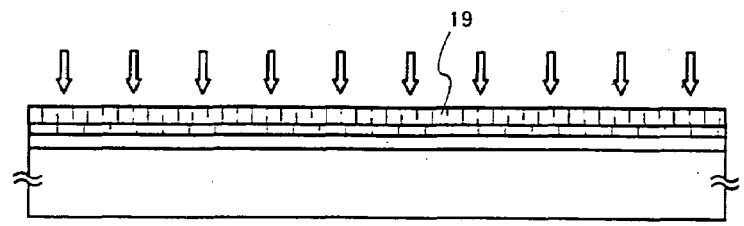
FIGS. 7A to 7C are sectional views explaining a making process of a crystalline semiconductor film according to the invention.

Thereafter, laser light is radiated similarly to the foregoing to thereby crystallize the second amorphous semiconductor film 18. Crystal growth is epitaxially made, in the same orientation, from the underlying first crystalline semiconductor film. This provides a second crystalline semiconductor film 19 having high (101) orientation ratio (FIG. 7A).

Due to the crystallization, there is a possibility that part of the nickel remaining in the first crystalline semiconductor film diffuses into the second crystalline semiconductor film. In any way, it is preferred to remove by gettering the nickel remaining in the crystalline semiconductor layer after crystallization.

Figure 7B:
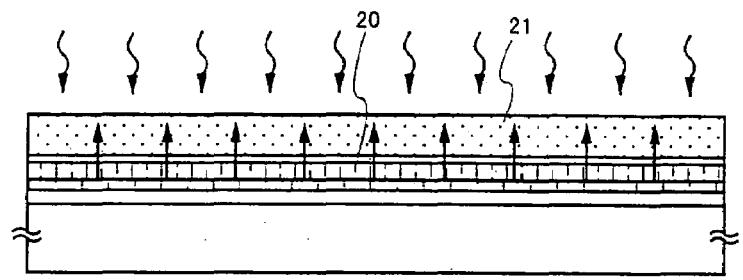

FIG. 7B is a view explaining a gettering process, wherein a thin barrier layer 20 is formed on a surface of the second crystalline semiconductor film. The thin barrier layer 20 is formed by an oxide film such as of chemical oxide, an oxide refined in an ozone atmosphere or in the air, a thin oxide film formed by a deposition or sputtering process, or the like. The thickness is approximately 1–5 nm. Formed on this is an amorphous silicon film 21 containing $1\times10^{20}/cm^3$ or more of Ar. By containing a high concentration of Ar, a strain field is formed in the amorphous silicon film to serve as a gettering site.

The heating process for gettering uses a gas-heating type thermal processing apparatus to carry out a process at 650° C. for 10 minutes. In the case of using an anneal furnace, a thermal process is made at 550° C. for 4 hours. The nickel remaining in the crystalline semiconductor layer can be segregated to the amorphous silicon film 21 by this process (in the arrow direction in the figure). The nickel content can be reduced to $1\times10^{18}/cm^3$ or less.

Thereafter, the amorphous silicon film 21 is selectively removed by etching. The method for etching can use dry etching with ClF$_3$ without using a plasma, or wet etching with an alkali solution such as a solution containing hydrazine or tetraethyl ammonium hydroxide (chemical formula: (CH$_3$)$_4$NOH). In this case, the thin insulating film 20 acts as an etching stopper. The thin insulating film 20 may be removed by hydrogen fluoride. This can obtain a clean surface of the crystalline semiconductor layer.

Figure 7C:
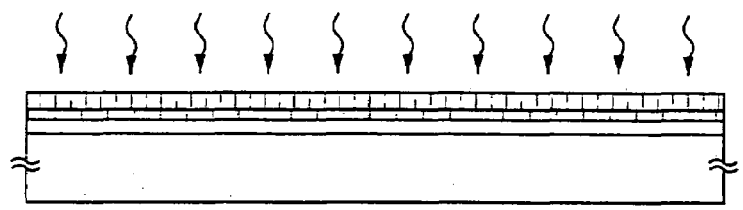

Furthermore, it is preferred to carry out a thermal process for relaxing the strain remaining in the crystalline semiconductor layer, as shown in FIG. 7C. The thermal process temperature is 400–500° C., which thermal process is carried out by an RTA process. In this manner, obtained is a crystalline semiconductor film having a high orientation ratio.

Figure 15A:
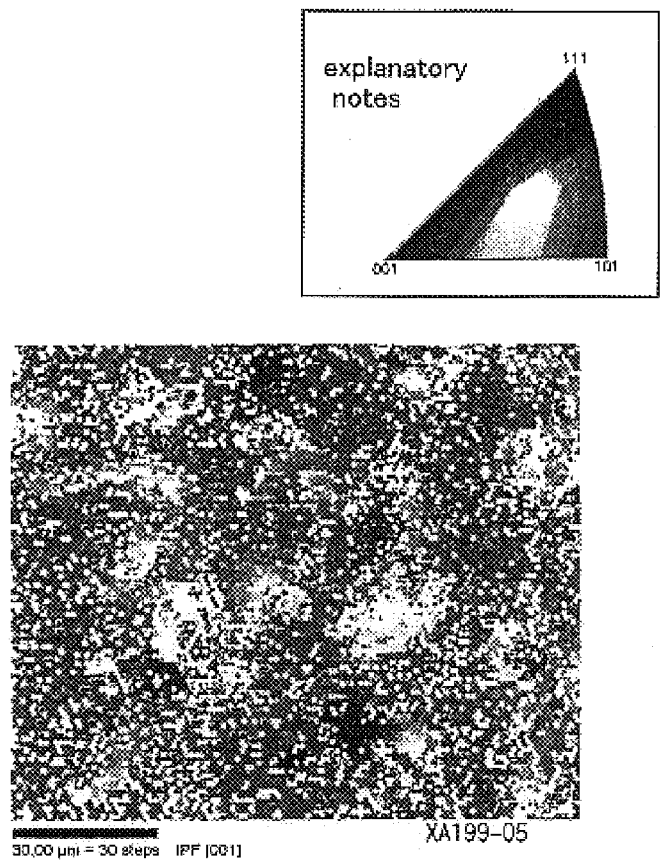
FIGS. 15A and 15B are figures showing a result of surface observation of a crystalline semiconductor film due to EBSP.
Figure 15B:
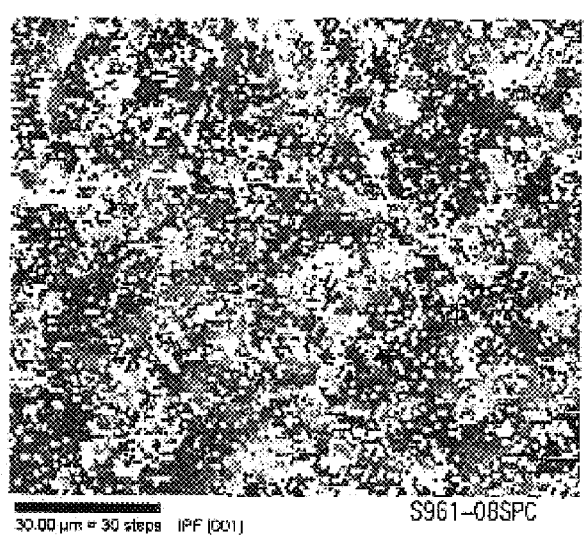

FIGS. 15A and 15B are explained by using the same explanatory notes as FIGS. 23 and 24. FIG. 15A is a result of EPSP measurement on a film, as a first crystalline semiconductor film, containing 3.5 atom percent of germanium. The film thickness is 55 nm. A solution containing 10 ppm by weight of nickel is applied by a spin coat technique, and heat-processed at 500° C. for 1 hour thereby desorbing hydrogen. Thereafter, a heating process is made at 580° C. for 4 hours by the use of an anneal furnace, followed by laser anneal. The crystalline semiconductor film, when observed by EBSP, has many regions having a color exhibiting a (101) plane as shown in FIG. 15A, wherein the (101)-plane orientation ratio is approximately 60%.

Subsequently, after the oxide film formed on the first crystalline semiconductor film surface is again removed to clean the surface, an amorphous silicon film is formed as a second amorphous semiconductor film to a film thickness of 30 nm. Thereafter, the film is crystallized by a heating process at 580° C. for 4 hours, whose result of EBSP measurement is shown in FIG. 15B. Despite the (101) orientation ratio is somewhat decreased, an orientation ratio of 30–40% is obtained. Under the influence of the orientation of the first crystalline semiconductor film, a second crystalline semiconductor film crystal-grows. Thus, crystal growth is available with a high orientation ratio and aggregation with large-sized crystal grains.

As apparent from FIGS. 15A and 15B, the crystalline semiconductor film made using the invention is high in (101)-plane orientation ratio and obtained with large-sized crystal grains. Thus, a crystalline semiconductor film can be obtained with high crystallinity aggregated with such large-sized crystal grains.

Example 2

Figure 8A:
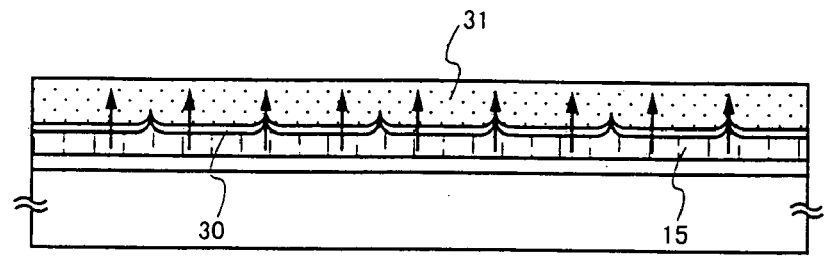
FIGS. 8A to 8D are sectional views explaining a making process of a crystalline semiconductor film according to the invention.
Figure 8B:
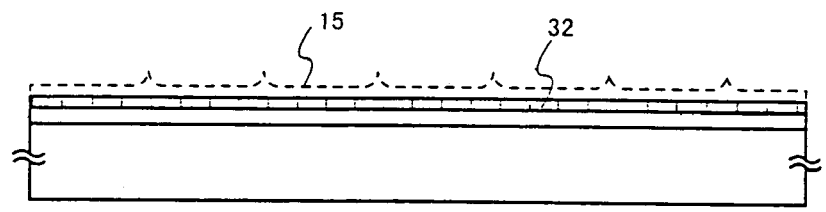
Figure 8C:
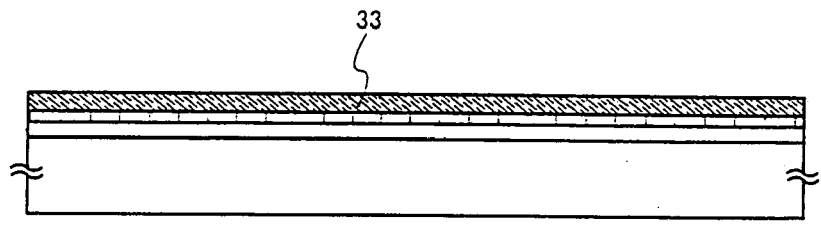
Figure 8D:
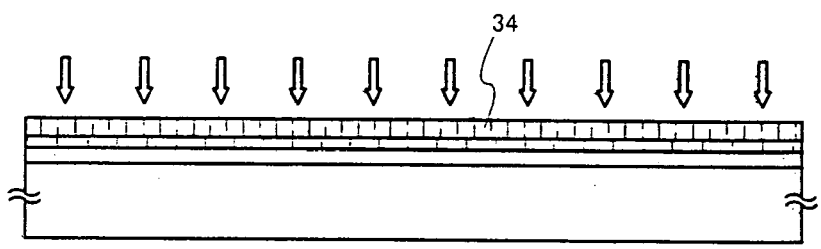

Similarly to Example 1, gettering may be carried out after forming a first crystalline semiconductor film 15. As shown in FIG. 8A, a gettering site is formed by an amorphous silicon film 31 having a strain field through a barrier layer 30. The barrier layer 30 can applied with an oxide film formed upon laser anneal, or may use a chemical oxide as noted before.

Thereafter, a heating process is made in an inert gas at 650° C. for 30 minutes to carry out gettering. After removing the amorphous silicon film 31 and barrier layer 30, an etching solution having HNO$_3$, HF, CH$_3$COOH and I$_2$ (referred to as CP-8) is used to etch, by approximately 5 nm, a surface of the first crystalline semiconductor film 15 thereby planarizing the surface and removing a high concentration layer segregated with germanium. This can reduce the germanium concentration in the first crystalline semiconductor film.

Thereafter, a second amorphous semiconductor film 33 is formed on the first crystalline semiconductor film 32. The second amorphous semiconductor film 33 is formed by an amorphous silicon film to a thickness of 50 nm by a plasma CVD process.

Thereafter, laser light is radiated to crystallize the second amorphous semiconductor film 33. Crystal growth is epitaxially made from the underlying first crystalline semiconductor film, with the same orientation. With even the above process, a second crystalline semiconductor film 34 can be obtained having a high (101) orientation ratio.

Example 3

Figure 9A:
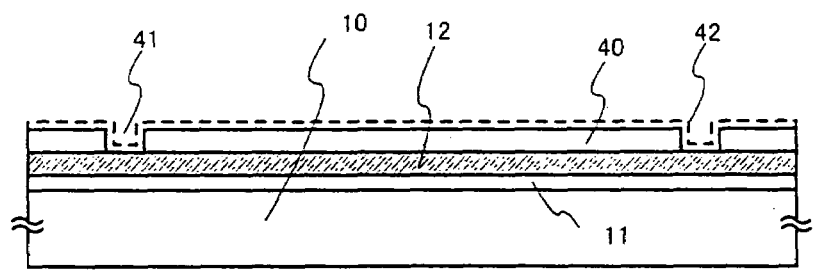
FIGS. 9A to 9C are sectional views explaining a making process of a crystalline semiconductor film according to the invention.

Similarly to Example 1, as show in FIG. 9A, after forming a substrate 10, an underlying insulating film 11 and a first amorphous semiconductor film 12, a mask insulating film 40 having 100 nm is formed to provide an opening 41 therein. Thereafter, a solution containing 1–100 ppm by weight of a catalyst element (nickel, in this example) (nickel acetate solution) is applied by a spin coat technique, to form a catalyst-element (nickel) containing layer 42. Thereupon, the catalyst element is place in contact with the first amorphous semiconductor film 12 at the opening 41.

Figure 9B:
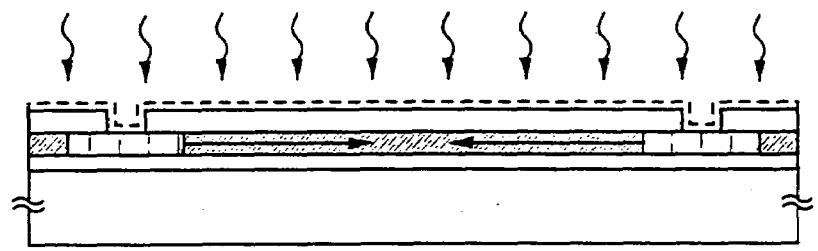
Figure 9C:
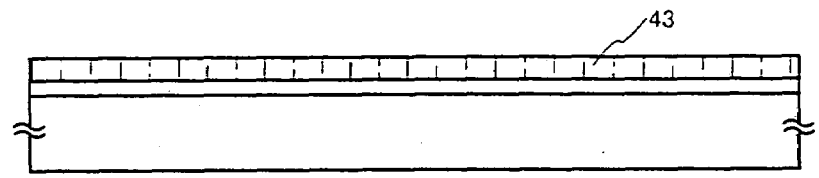

Next, as shown in FIG. 9B, a heating process is made in order to crystallize the first amorphous semiconductor film 12. The heating process may use any of a method of heating using the radiation heat of a light source, a method of heating with a heated inert gas and a method of heating using a furnace. Herein, a furnace is used to carry out a heating process at 580° C. for 4 hours thereby forming a first crystalline semiconductor film. After the heating process, removed is the mask insulating film 40 on the first crystalline semiconductor film 43. From then on, a crystalline semiconductor layer can be obtained by Example 1 or a combination of Example 1 with Example 2.

Example 4

This example explains an example to form a crystalline semiconductor film of the invention by partly adding a catalyst element to a first semiconductor layer, with reference to FIGS. 31A to 31E, 32A and 32B.

On a substrate 300, an underlying insulating film 301 of silicon nitride oxide is formed, on which an $Si_{1-x}Ge_x$ (x=0.001–0.05) film is formed as a first semiconductor layer 302. Incidentally, the underlying insulating film 301 may use a silicon nitride film having 1–10 nm. Next, a mask insulating film 303 of silicon oxide having an opening 304 is formed on the first semiconductor layer 302.

Figure 31A:
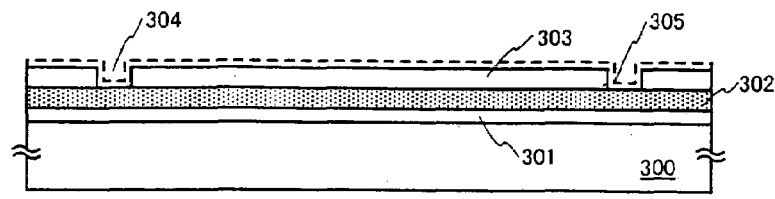
FIGS. 31A to 31E are views showing an example of practical application of the invention.

Next, a solution containing 1–100 ppm by weight of a catalyst element (nickel, in this example) (nickel acetate solution) is applied by a spin coat technique thereby adding a layer 305 containing a catalyst element (nickel). The catalyst-element containing layer 305 is selectively formed on the first semiconductor layer 302 at the opening 304 in the mask insulating film 303. Meanwhile, although this example used a spin coat technique in adding the catalyst element, a thin film containing a catalyst element may be formed on the first semiconductor layer 302 by a deposition or sputtering process (FIG. 31A).

Figure 31B:
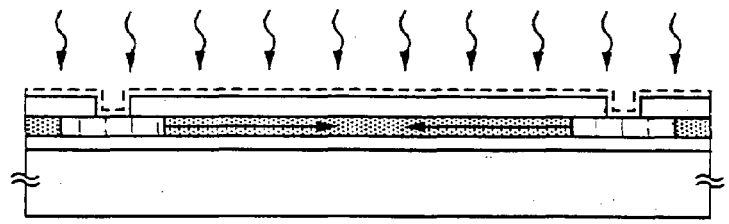
Figure 31C:
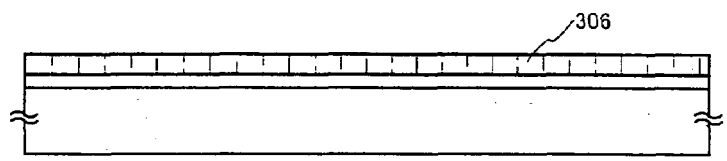

Then, a heating process is carried out in order to crystallize the first semiconductor layer. The heating process may use any of a method of heating using the radiation heat of a light source, a method of heating with a heated inert gas and a method of heating using a furnace. Herein, a furnace is used to carry out a heating process at 580° C. for 4 hours, thereby forming a first crystalline semiconductor layer (FIG. 31B).

Figure 31D:
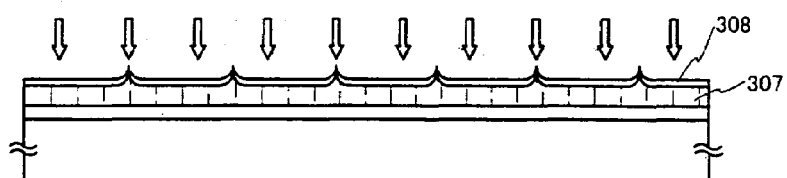

After the heating process, removed is the mask insulating film 303 on the first crystalline semiconductor layer 306. Subsequently, a first laser light is radiated to the first crystalline semiconductor layer 306. The first laser light may use a pulse oscillation or continuous oscillation type excimer laser or YAG laser, $YVO_4$ laser or the like. In the case of using the laser, the laser light emitted from a laser oscillator is desirably focused into a linear form by an optical system and radiated to the semiconductor film. The laser radiation condition may be properly determined by a practitioner. In the case of using an excimer laser, a pulse oscillation frequency is 300 Hz and a laser energy density is 200–500 $mJ/cm^2$. Meanwhile, where using a YAG laser, a second harmonic thereof is used wherein a pulse oscillation frequency is 10–300 Hz and a laser energy density is given 250 $mJ/cm^2$. By the first laser radiation, the first crystalline semiconductor layer 306 turns into a crystalline semiconductor layer 307 having a concavo-convex in a surface thereof. Furthermore, an oxide film 308 is also formed (FIG. 31D).

Next, a process is made to move into the gettering region the catalyst element added to the first semiconductor layer. Incidentally, although an oxide film 308 is formed on the first crystalline semiconductor layer in the first laser radiation process, the oxide film 308 may be removed prior to forming a barrier layer 309 or after forming a barrier layer 309 on the oxide film 308.

A semiconductor layer for a gettering region 310 is formed on the barrier layer 309. The gettering region is formed with a semiconductor layer to a thickness of 25–250 nm by a plasma CVD or sputter process. Typically, an amorphous silicon film containing 0.01–20 atom percent of Ar is formed by a sputter process. This semiconductor film, because to be removed later, is desirably made by a low density film (e.g. amorphous silicon film) to enhance the selective ratio to the crystalline semiconductor layer in order for easy removal by etching. By adding an inert gas element in the amorphous silicon film and introducing Ar simultaneously as an inert gas element into the film, a gettering region can be formed.

Figure 31E:
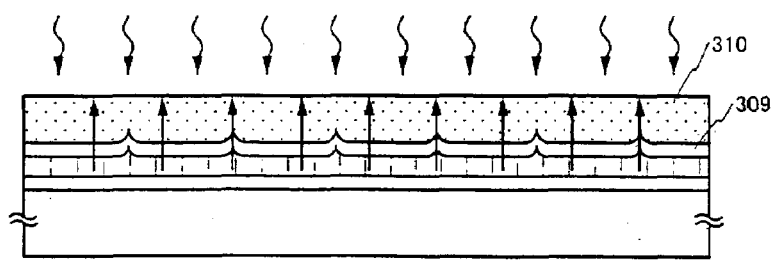

Next, a heating process is carried out in order for gettering. The heating process may use any of a method using a furnace (in a nitrogen atmosphere at 450–600° C. for 0.5–12 hours), an RTA process using a heating light source (instantaneously to a silicon film at 600–1000° C. for 1–60 seconds), and an RTA process with a heated inert gas (at 550–700° C. for 1–5 minutes). The heating process causes the catalyst element to move into the gettering region. The catalyst element contained in the first crystalline semiconductor film can be reduced in concentration down to $1 \times 10^{17}/cm^3$ or less (FIG. 31E).

Thereafter, the semiconductor film 310 is selectively etched and removed away. The etching can be carried out by dry etching with $ClF_3$ without using a plasma or wet etching with an alkali solution such as a solution containing hydrazine or tetraethyl ammonium hydroxide (chemical formula: $(CH_3)_4NOH$). In this case, the barrier layer 309 acts as an etching stopper. The barrier layer 309 may be removed later by hydrogen fluoride.

Figure 32A:
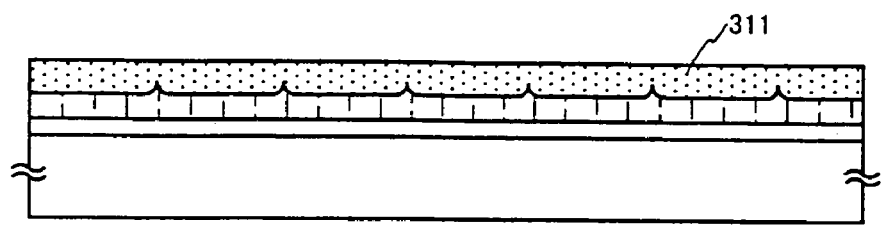
FIGS. 32A and 32B are views showing an example of practical application of the invention.

Then, an amorphous silicon film 311 is formed as a second semiconductor layer on the first crystalline semiconductor layer 307. The amorphous silicon film may be formed by a known method, such as a plasma CVD process or a sputter process, to a film thickness of 20–100 nm (FIG. 32A).

Figure 32B:
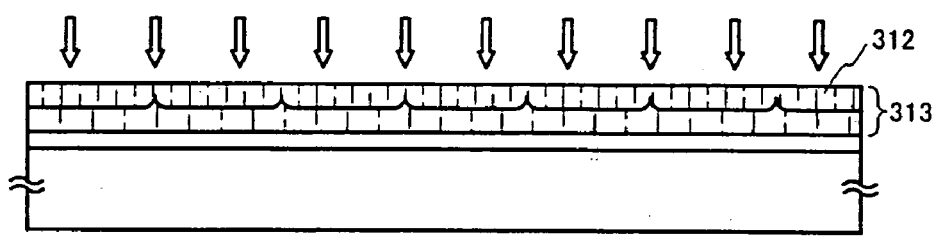

Subsequently, laser light is radiated to the second semiconductor layer 311 to crystallize the second semiconductor layer under the influence of an orientation of the first crystalline semiconductor layer. In the second laser radiation process, radiation is made in a nitrogen atmosphere or in a vacuum. The second laser light uses an excimer laser light having a wavelength of 400 nm or shorter, or a second or third harmonic of a YAG laser. Meanwhile, in place of the excimer laser, may be used the light to be emitted from an ultraviolet lamp. Incidentally, the second laser light is provided with an energy density greater than an energy density of the first laser light, i.e. 400–800 mJ/cm$^2$. In this manner, formed is a crystalline semiconductor layer 313 formed by the overlying layers of the first crystalline semiconductor layer 307 (crystalline silicon-germanium film) and the second crystalline semiconductor layer 312 (crystalline silicon film) (FIG. 32B).

Example 5

This example explains another example to form a crystalline semiconductor film of the invention by partly adding a catalyst element to a first semiconductor layer, with reference to FIGS. 33A to 33G.

In compliance with Example 4 (FIGS. 31A to 31E), carried out is a process of from forming a first semiconductor layer to addition of a catalyst element. An underlying insulating film 401 is formed of silicon nitride oxide on a substrate 400, and an $Si_xGe_{1-x}$ film is formed as a first semiconductor layer 402 on the underlying insulating film 401. Incidentally, the underlying insulating film 401 may use a silicon nitride film having 1–10 nm.

Figure 33A:
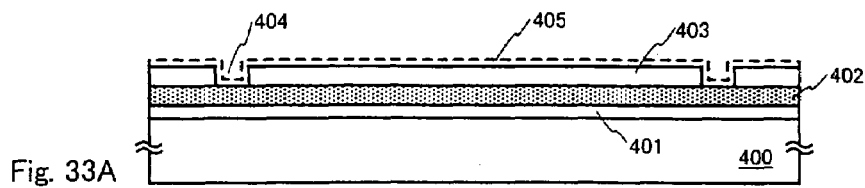
FIGS. 33A to 33G are views showing an example of practical application of the invention.

Then, a mask insulating film 403 is formed of silicon oxide having an opening 404, on the first semiconductor layer 402. A solution containing 1–100 ppm by weight of a catalyst element (nickel, in this example) (nickel acetate solution) is applied by a spin coat technique, thereby adding a catalyst element (nickel) containing layer 405. The catalyst element containing layer 405 is selectively formed on the first semiconductor layer 402 at the opening of the mask insulating film 403 (FIG. 33A).

Figure 33B:
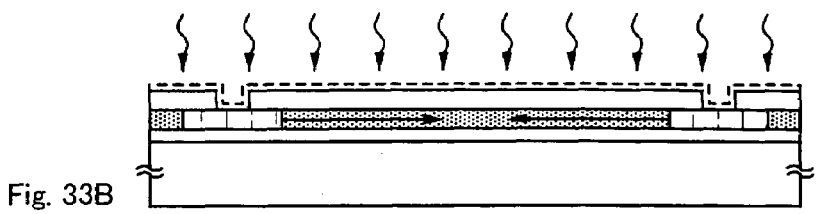
Figure 33C:
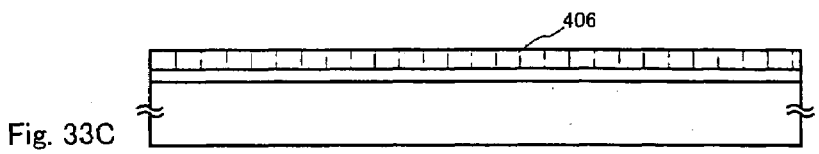

Subsequently, as shown in FIG. 33B, the first semiconductor layer is heating-processed to form a first crystalline semiconductor layer. The heating process may use any of a method of heating using the radiation heat of a light source, a method of heating with a heated inert gas and a method of heating using a furnace. Herein, a furnace is used to carry out a heating process at 580° C. for 4 hours, to form a first crystalline semiconductor layer 406 (FIG. 33C).

Figure 33D:
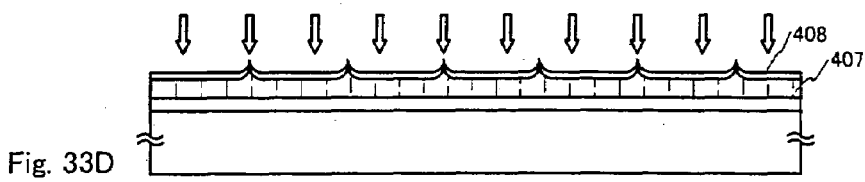

Next, similarly to Example 4, laser light is radiated to form a first crystalline semiconductor layer 407 having a concavo-convex in a surface, and an oxide film 408 on the surface of the first crystalline semiconductor layer 407 (FIG. 33D).

Figure 33E:
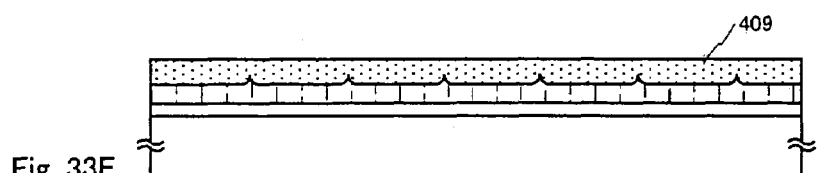

Next, removed is the oxide film 408 formed on the surface of the first crystalline semiconductor layer, to form an amorphous silicon film as a second semiconductor layer 409 on the first crystalline semiconductor layer. The amorphous silicon film is formed of amorphous silicon to a film thickness of 20–100 nm by a plasma CVD process (FIG. 33E).

Figure 33F:
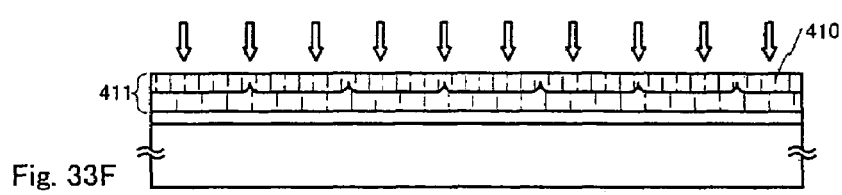

Subsequently, a second laser radiation is made to the second semiconductor layer 409. Prior to the second laser radiation process, a heating process is carried out to remove the hydrogen contained in the second semiconductor layer (silicon film). The heating process is made at 400–500° C. for about 1 hour, thereby desorbing the hydrogen contained in the amorphous silicon film. Note that the amorphous semiconductor layer formed by a sputter process, having a low hydrogen content, does not require a process of desorbing hydrogen. Then, laser light is radiated to the second semiconductor layer 409 to carry out crystallization under the influence of an orientation of the first crystalline semiconductor layer. The second laser radiation process may be made similarly to Example 4. The second laser radiation crystallizes also the second semiconductor layer to form a crystalline semiconductor layer 411 having a first crystalline semiconductor ($Si_{1-x}Ge_x$) layer and a second crystalline semiconductor (Si) layer 410 (FIG. 33F).

Subsequently, in order to reduce the concentration of the catalyst element used in the crystallization process on the first semiconductor layer, a process is made to move it from the crystalline semiconductor layer.

First, a barrier layer 412 is formed on the crystalline semiconductor layer. The barrier layer 412 is not especially limited in its thickness. There is, as a simple forming method, a method to process a surface of the crystalline semiconductor layer by the use of ozone water. This process forms a chemical oxide on the surface of the crystalline semiconductor layer. Meanwhile, a chemical oxide can be similarly formed by processing with a solution of sulfuric acid, chloride acid or nitric acid mixed with hydrogen peroxide water. Another method for forming a barrier layer may use any of a plasma process in an oxidizing atmosphere, a method that ozone is caused by ultraviolet ray radiation in an oxygen-containing atmosphere to carry out oxidizing process for formation, a method that a clean oven is used for heating up to approximately 200–350° C. to form a thin oxide film, a method that an oxide film is deposited to approximately 1–5 nm by plasma CVD process, sputter process or deposition process.

Figure 33G:
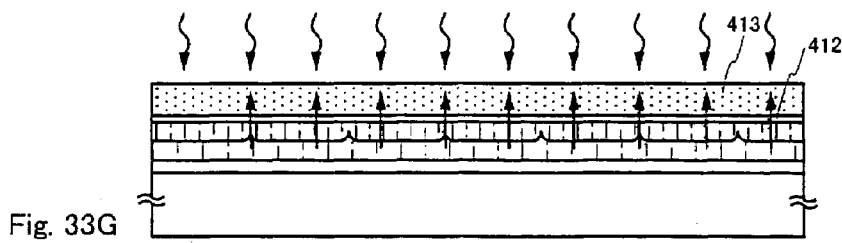

Then, on the barrier layer, a semiconductor layer is formed for a gettering region 413 similarly to Example 4. Specifically, the gettering region 413 can be formed by adding Ar in the amorphous silicon film and simultaneously introducing an inert gas element in the film (FIG. 33G).

Thereafter, a heating process is carried out to move the catalyst element remaining in the crystalline semiconductor layer into the gettering region. The heating process may use any of a method using a furnace (in a nitrogen atmosphere at 450–600° C. for 0.5–12 hours), an RTA process using a heating light source (instantaneously to a silicon film at 600–1000° C. for 1–60 seconds), and an RTA process with a heated inert gas (at 550–700° C. for 1–5 minutes). The heating process causes the catalyst element to move into the gettering region due to diffusion. The catalyst element contained in the crystalline semiconductor layer can be reduced in concentration down to $1 \times 10^{17}/cm^3$ or lower. Incidentally, with this heating process, the gettering region containing the inert gas element in an concentration of $1 \times 10^{20}/cm^3$ or more will not be crystallized.

Then, similarly to Example 4, the semiconductor film as the gettering region 413 is selectively etched and removed away. At this time, the barrier layer 412 serves as an etching stopper to protect the crystalline semiconductor layer not to be etched. After ending the etching process on the gettering region, the barrier layer 412 may be removed by hydrogen fluoride.

In this manner, formed is a crystalline semiconductor layer having the overlying layers of a first crystalline semiconductor layer and second crystalline semiconductor layer reduced in catalyst element concentration and having a high orientation ratio and aggregated with large-sized crystal grains.

EXAMPLE 6

This example explains an example to form a crystalline semiconductor film of the invention by adding a catalyst element to the entire surface of a first semiconductor layer, with reference to FIGS. 34A to 34G.

An underlying insulating film 1551 is formed on a substrate 1550, and an amorphous silicon-germanium ($Si_{1-x}Ge_x$: x=0.001–0.05) film 1552 is formed as a first semiconductor layer on the underlying insulating film 1551. The underlying insulating film 1551 uses the overlying layers of a silicon oxide nitride film formed using $SiH_4$, $NH_3$ and $N_2O$ as a reactive gas and a silicon oxide nitride film deposited using $SiH_4$ and $N_2O$ as a reactive gas.

The amorphous silicon-germanium film (first semiconductor layer) 1552 may be formed by a plasma CVD process, a low pressure CVD process or another proper process. The amorphous semiconductor film is deposited to a thickness in a range of 20–100 nm.

Figure 34A:
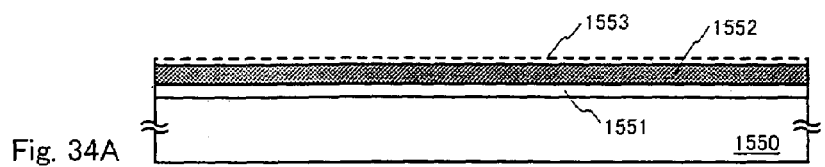
FIGS. 34A to 34G are views showing an example of practical application of the invention.

Subsequently, a crystallization process is made on the first semiconductor layer 1552. During crystallization, Ni as a catalyst element is added to a surface of the first semiconductor layer 1552, to form a catalyst-element containing layer 1553 (FIG. 34A).

Figure 34B:
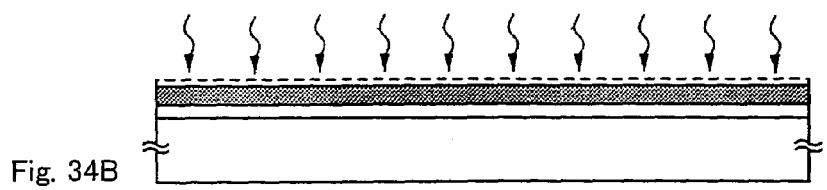
Figure 34C:
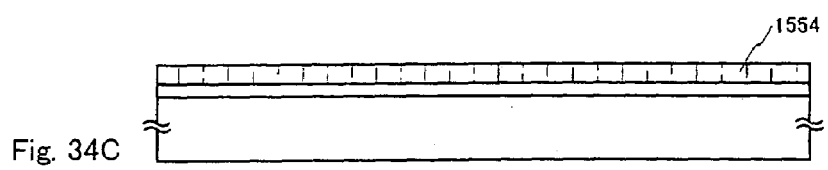
Figure 34D:
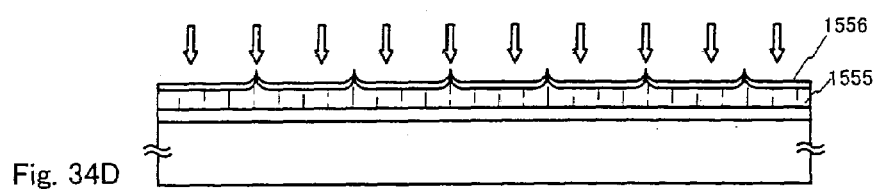

After adding the catalyst element to the semiconductor layer, a heating process is carried out to form a first crystalline semiconductor ($Si_{1-x}Ge_x$: x=0.001–0.05) layer 1554. This may use any of a method of heating using the radiation heat of a light source, a method of heating with a heated inert gas and a method of heating using a furnace (FIG. 34B).

Next, similarly to Example 4, first laser radiation is made to the first crystalline semiconductor layer 1554 in an oxygen or air atmosphere. The above process provides a first crystalline semiconductor layer 1555 preferentially orientated to (101) to have large-sized crystal grains. The first crystalline semiconductor layer 1555 thus formed has surface having a concavo-convex formed with further an oxide film 1556.

Then, a gettering process is carried out in order to reduce the concentration of the catalyst element contained in the first crystalline semiconductor layer 1555. A barrier layer 1557 is formed on the first crystalline semiconductor layer. A chemical oxide is formed as the barrier layer 1557 on a surface of the first crystalline semiconductor layer.

Figure 34E:
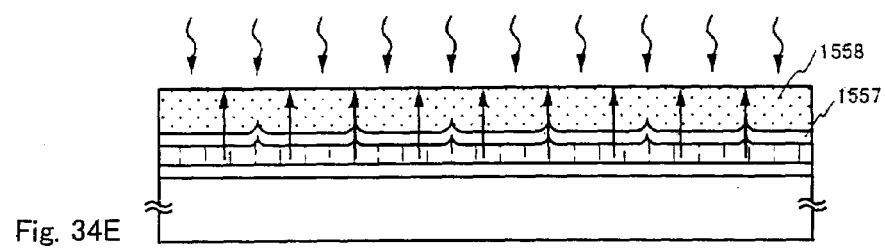
Figure 34F:
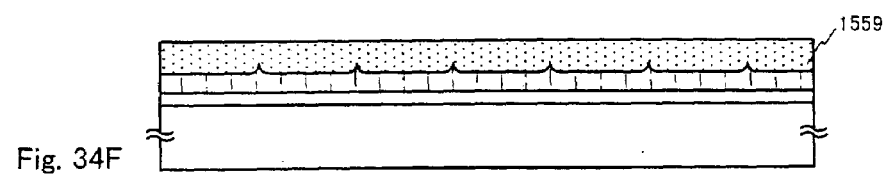
Figure 34G:
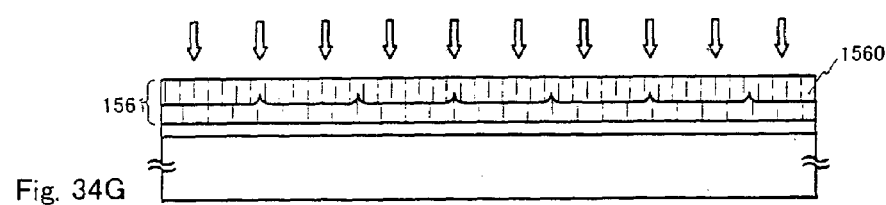

Next, a semiconductor film for a gettering region 1558 is formed on the barrier layer 1557. For a gettering region, a semiconductor film is formed in a thickness of 25 –250 nm by a plasma CVD process or sputter process. Typically, an amorphous silicon film is formed containing 0.01–20 atom percent of Ar by a sputter process (FIG. 34E).

Thereafter, similarly to Example 5, a heating process is carried out in order to move the catalyst element remaining in the first crystalline semiconductor layer to the gettering region.

Next, the semiconductor film in the gettering region 1558 is selectively etched and removed away. After ending the etching process on the gettering region, the barrier layer 1557 is removed by the use of hydrogen fluoride. After removing the oxide film formed on the surface of the first crystalline semiconductor layer and cleaning the surface thereof, an amorphous silicon film as a second semiconductor layer 1559 is formed on the first crystalline semiconductor layer 1555 by a plasma CVD process or sputter process.

Subsequently, prior to a second laser radiation process, a heating process is carried out in order to remove the hydrogen contained in the second semiconductor layer (silicon film). The heating process is made at 400–500° C. for nearly 1 hour, to desorb the hydrogen contained in the amorphous silicon film. However, there is no need to carry out a hydrogen desorbing process on an amorphous semiconductor layer formed by a sputter process, because of its low hydrogen content. Then, laser light is radiated to the second semiconductor layer to crystallize it under the influence of an orientation of the first crystalline semiconductor layer. The second laser radiation process may be carried out similarly to Embodiment 4. The second laser radiation crystallizes also the second semiconductor layer, thereby forming a crystalline semiconductor layer 1561 having a first crystalline semiconductor layer 1555 and a second crystalline semiconductor layer 1560.

By the second laser radiation, the second semiconductor layer can be crystallized under the influence of the first crystalline semiconductor layer having a high (101)-plane orientation ratio. The orientation ratio is high entirely in the crystalline semiconductor layer. As a result, it is possible to form a crystalline semiconductor layer aggregated with large-sized crystal grains.

Example 7

Explanation is made on an example to form TFTs using a crystalline semiconductor layer made according to Examples 1–4, with reference to FIGS. 10A to 10E. First, in FIG. 10A, on a glass substrate 200 of aluminum borosilicate glass or barium borosilicate glass, island-isolated semiconductor layers 202, 203 are formed from the semiconductor film made in Example 2. Between the substrate 200 and the semiconductor layer, a blocking layer 201 is formed of silicon nitride oxide in a thickness of 200 nm. The semiconductor layers 202, 203 are applied with those island-separated by etching from the crystalline semiconductor layer formed according to the method shown in Examples 1–4.

Furthermore, a gate insulation film 204 is formed in a thickness of 80 nm. The gate insulation film 204 is formed of silicon oxide nitride with using $SiH_4$, $N_2O$ and $O_2$ as a reactive gas by the use of a plasma CVD process. Because the crystalline semiconductor layer applied in this example has a high (101)-plane orientation ratio, the gate insulation film formed thereon can be reduced in film-quality variation. Accordingly, it is possible to reduce the variation in TFT threshold voltage.

Figure 10A:
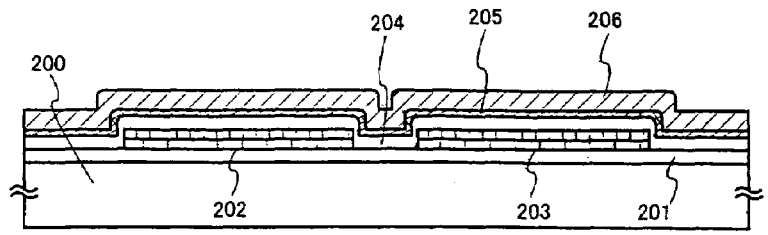
FIGS. 10A to 10E are sectional view explaining a TFT fabrication process according to the invention.
Figure 10B:
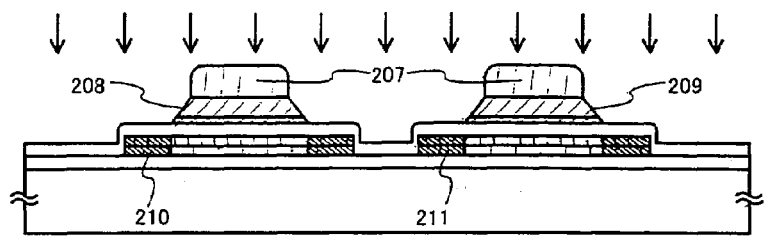

On the gate insulation film 204, a first conductor film 205 and a second conductor film 206 are formed for forming a gate electrode. The first conductor film is formed of tantalum nitride or titanium nitride in a thickness of 30 nm. The second conductor film is applied with a conductor material Al, Ta, Ti, W, Mo or the like or an alloy thereof, in a thickness of 300 nm. Thereafter, as shown in FIG. 10B, a resist pattern 207 is formed to form a first form of gate electrodes 208, 209 by dry etching. Also, although not shown, an interconnection to the gate electrode can be formed at the same time.

The gate electrode is used as a mask to form an n-type semiconductor region in a self-aligned fashion. In doping, phosphorus is implanted by an ion implanting technique or ion doping technique (referring, herein, to a method for implanting ions free from mass-separation). This region is made with a phosphorus concentration in a range of $1 \times 10^{20}$–$1 \times 10^{21}/cm^3$. In this manner, first impurity regions 210, 211 are formed.

Figure 10C:
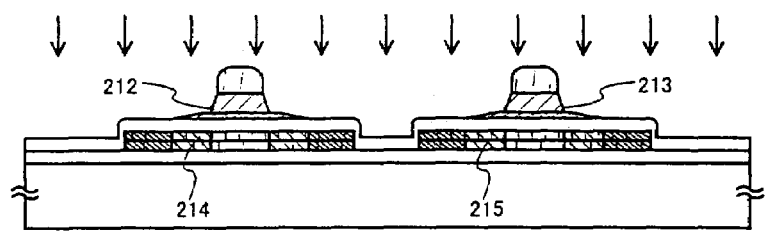

Then, as shown in FIG. 10C, the second conductor film of the gate electrode is selectively etched by dry etching to form a second form of gate electrodes 212, 213. Then, phosphorus ions are implanted through a region that a surface of the first conductor film is exposed, thereby forming second impurity regions 214, 215.

Figure 10D:
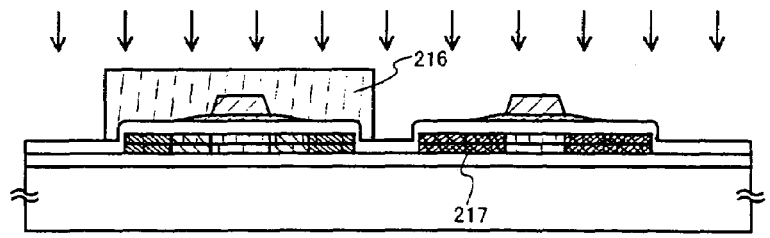

Subsequently, as shown in FIG. 10D, a mask 216 is formed covering one semiconductor layer 203, to form a third impurity region 217 that the semiconductor film 203 is implanted with boron ions. The impurity, using boron, is added in a concentration 1.5–3 times that of phosphorus for inversion into p-type. This region is made with a boron concentration in a range of $1.5 \times 10^{20}$–$3 \times 10^{21}/cm^3$.

Figure 10E:
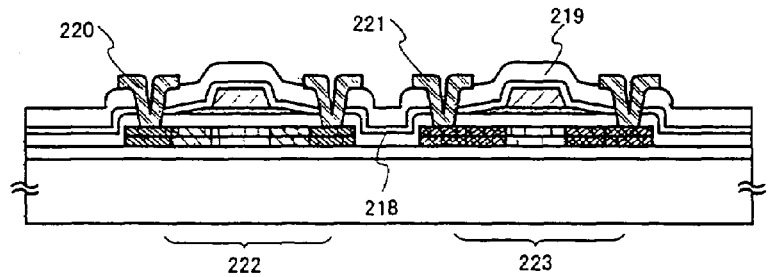

Thereafter, as shown in FIG. 10E, a silicon nitride film 218 and silicon oxide film 219 are formed by a plasma CVD process. Then, a thermal process is made in order to restore the crystallinity of and activate the first to third impurity regions. The temperature suited for activation is 450±50° C., and the thermal process may be for 1–10 minutes. The gas for heating can use nitrogen, Ar or the like. This may be in a reducing atmosphere that the gas is added with hydrogen. Hydrogenation is simultaneously possible by the added hydrogen.

Next, contact holes are formed reaching the impurity regions of the semiconductor layers. Interconnections 220, 221 are formed using Al, Ti, Ta or the like. In this manner, formed are an n-channel TFT 222 and a p-channel TFT 223. Although the respective TFTs herein are shown singly, a CMOS circuit, an NMOS circuit and/or a PMOS circuit can be formed with using the TFTs.

Although this example explained the LDD-structured TFT, it is of course possible to form a single-drain structure. The crystalline semiconductor layer obtained in the invention, having high (101)-plane Orientation ratio, reduces the defect density in grain boundaries to obtain high field-effect mobility. The TFT thus made can be used as a TFT for fabricating an active-matrix liquid crystal display device or display device using light emitting elements, or a TFT for forming a memory or microprocessor on a glass substrate.

Figure 11:
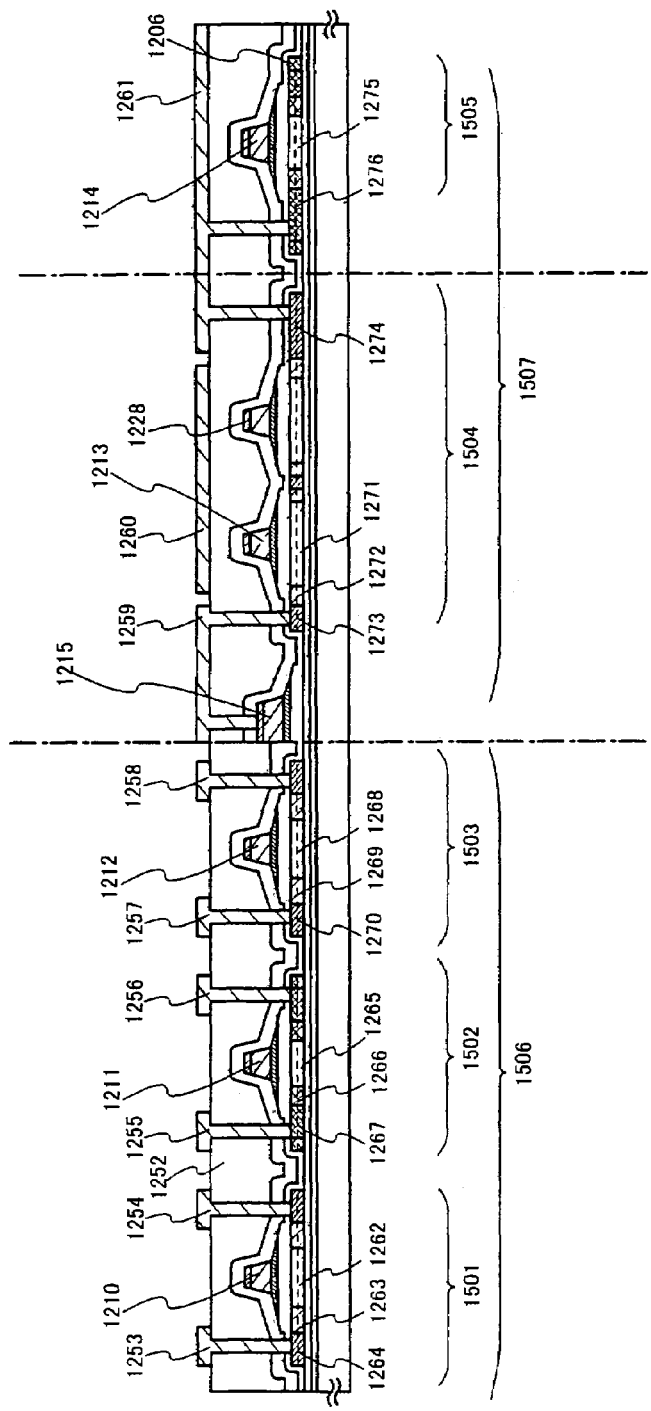
FIG. 11 is a sectional view showing a structure of an active-matrix substrate.

Explanation will be made on an example to form a TFT substrate (substrate formed with TFTs) for realizing an active-matrix drive type display device using such TFTs, with reference to FIG. 11. In FIG. 11, formed on the same substrate are a drive circuit section 1506 having an n-channel TFT 1501, a p-channel TFT 1502 and an n-channel TFT 1503, and a pixel section 1507 having an n-channel TFT 1504 and a capacitance element 1505.

The n-channel TFT 1501 in the drive circuit section 1506 has a channel region 1262, a second impurity region 1263 partly overlapped with a gate electrode 1210 and a first impurity region 1264 serving as a source or drain region. The p-channel TFT 1502 has a channel region 1265, a fourth impurity region 1266 partly overlapped with a gate electrode 1211 and a third impurity region 1267 serving as a source or drain region. The n-channel TFT 1503 has a channel region 1268, a second impurity region 1269 partly overlapped with a gate electrode 1212 and a first impurity region 1270 serving as a source or drain region. With such n-channel and p-channel TFTs, it is possible to form a shift register circuit, a buffer circuit, a level shifter circuit, a latch circuit and the like. In particular, for a buffer circuit high in drive voltage, the structure of n-channel TFT 1501 or 1503 is suited for the purpose of prevention against the deterioration due to hot carrier effects.

The pixel TFT 1504 in the pixel section 1507 has a channel region 1271, a second impurity region 1272 formed on an outside of a gate electrode 1213 and a first impurity region 1273 serving as a source or drain region. Meanwhile, a third impurity region 1276 added with boron is formed in a semiconductor film serving as one electrode of the capacitance element 1505. The capacitance element 1505, having an insulating film (the same film as the gate insulation film) as a dielectric, is formed with an electrode 1214 and a semiconductor film 1206. Note that 1253-1260 are various interconnections and 1261 corresponds to a pixel electrode.

These TFTs have a high orientation ratio in the semiconductor layer forming the channel and impurity regions. Because of preferential orientation to the (101) plane, the gate insulation film formed thereon can be reduced in film-quality variation, hence reducing the variation in TFT threshold voltage. Consequently, the TFT can be driven on a low voltage, providing a merit to reduce power consumption. Also, because the surface is planarized, the electric field will not concentrate on a convex region, so that it is possible to suppress the deterioration due to hot carrier effects particularly occurring at a drain end. Meanwhile, although the concentration distribution of the carriers flowing between the source and the drain increases in the vicinity of an interface to the gate insulation film, the carriers are allowed to smoothly move due to the planarization without being scattered, thus enhancing electric-field mobility.

Figure 12:
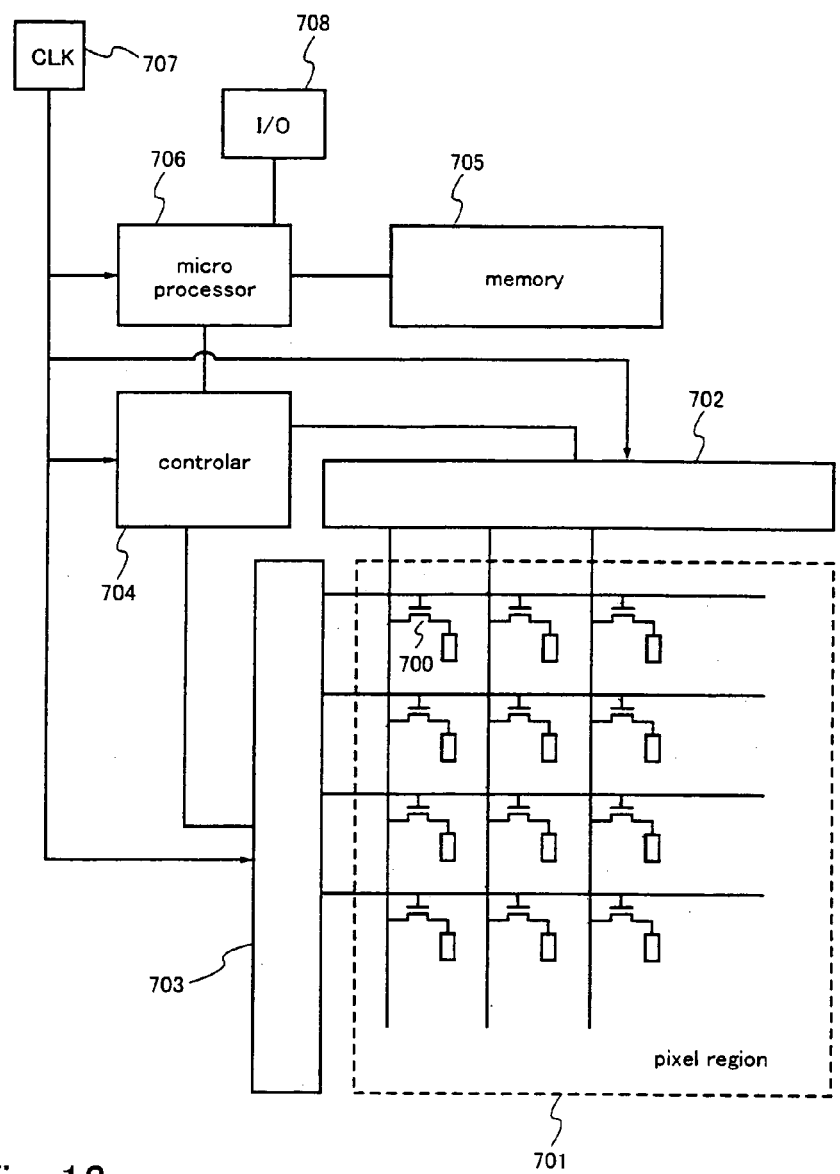
FIG. 12 is a block diagram showing a circuit configuration of an active-matrix substrate.

FIG. 12 shows a circuit configuration of such an active-matrix substrate. The drive circuit section, for driving TFTs 700 of a pixel section 701, has an X driver 702 and a Y driver 703. A shift register circuit, a buffer circuit, a level shifter circuit, a latch circuit and the like are provided as required. In this case, the X driver 702, for forwarding a video signal, is to be inputted by a video signal from a controller 704 and a timing signal for X driver from a timing generator 707. The Y driver 703, to be inputted by a timing signal for Y driver from the timing generator 707, outputs a signal onto a scanning line. The microprocessor 706 controls the controller 704, writes the data such as a video signal to a memory 705, inputs and outputs to and from an external interface 708, and manages the operation of the system overall.

The TFTs configuring these circuits can be formed by the TFTs structured as shown in this example. By enhancing the orientation ratio in a crystalline semiconductor layer forming the TFT channel region, the TFT characteristic can be improved so that various functional circuits can be formed on a substrate of glass or the like.

Example 8

Explanation will be made on an example of an active-matrix substrate arranged with TFTs made by using a crystalline semiconductor layer according to Examples 4–6, with reference to FIGS. 25A–28C. Herein, explanation is made in detail on a method to fabricate simultaneously a pixel section and the TFTs (n-channel and p-channel TFTs) of a drive circuit provided in a periphery of the pixel section on the same substrate.

In FIG. 25A, a substrate 110 uses a aluminoborosilicate glass. An underlying insulating film is formed on the substrate 110. This example forms the overlying layers of a first silicon oxide nitride film 111a having a thickness of 50 nm deposited using $SiH_4$, $NH_3$ and $N_2O$ as a reactive gas and a second silicon oxide nitride film 111b having a thickness of 100 nm deposited using $SiH_4$ and $N_2O$ as a reactive gas.

Then, an amorphous semiconductor film is formed on the underlying insulating film 111 and crystallized, and then divided to form semiconductor layers 120–123 (in the example, conveniently, a first semiconductor layer 120, a second semiconductor layer 121, a third semiconductor layer 122 and a fourth semiconductor layer 123).

The method of crystallization is as in the following. On the underlying insulating film 111 is formed an amorphous silicon-germanium ($Si_{1-x}Ge_X$: x=0.001–0.05) film as a first semiconductor layer 112. The first amorphous semiconductor film uses a silicon-based amorphous semiconductor film containing germanium in a range of 0.1 atom percent or more but 75 atom percent or less (in this example, formed is such an $Si_{1-x}Ge_X$ film as containing 3.5 atom percent of germanium). The content of germanium can be adjusted by a mixing ratio of $SiH_4$ and $GeH_4$ to be used as a typical reactive gas.

The first semiconductor layer 112 is formed by a proper method such as a plasma CVD process or low-pressure CVD process. In the case of applying a plasma CVD process, a reactive gas of $SiH_4$ and $GeH_4$ or a reactive gas of $SiH_4$ and $H_2$-diluted $GeH_4$ is introduced into a reaction chamber, and decomposed by a radio discharge at 1–200 MHz to deposit an amorphous semiconductor film over the substrate. The first semiconductor layer 112 deposited has a thickness in a range of 20–100 nm (FIG. 25A).

Then, Ni is added as a catalyst element to the first semiconductor layer 112. Thereafter, a heating process is made to crystallize the first semiconductor layer, thereby forming a first crystalline semiconductor ($Si_{1-x}Ge_X$) layer 113. The heating process may use any of a method of heating using the radiation heat of a light source, a method of heating with a heated inert gas and a method of heating using a furnace. Herein, a furnace is used to carry out a heating process at 580° C. for 4 hours, to form a first crystalline semiconductor layer (FIG. 25B).

Next, first laser light is radiated to the first crystalline semiconductor layer 113, similarly to Example 4. In the first laser radiation process, the first crystalline semiconductor layer 113, in its surface, turns into a concavo-convex form. Also, an oxide film 114 is formed on the surface (FIG. 25C).

Figure 26A:
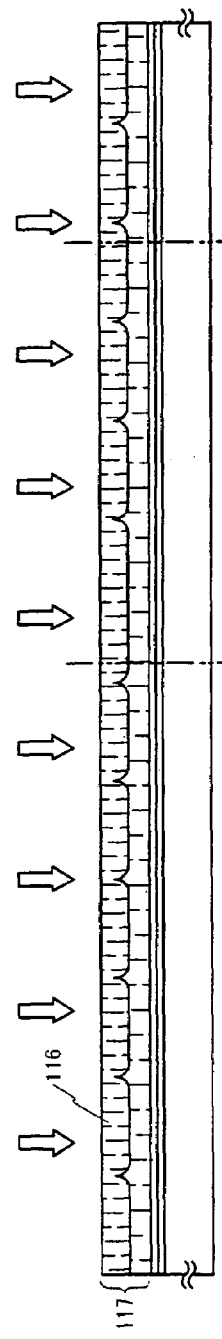
FIGS. 26A to 26D are views showing a TFT fabrication process using the invention.
Figure 26B:
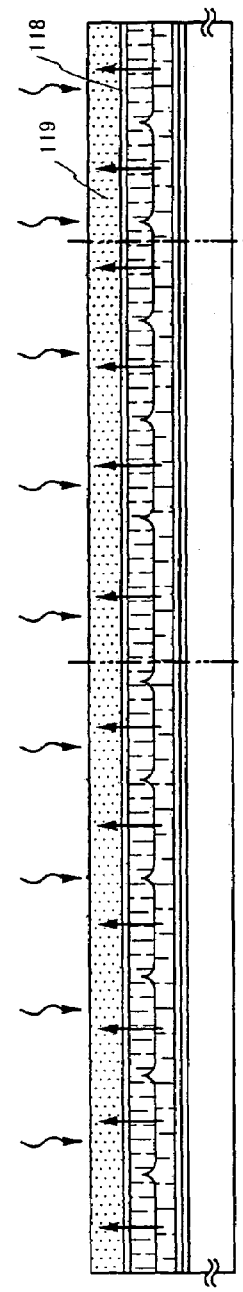

After the first laser radiation, removed is an oxide film 114 formed on a surface of the first crystalline semiconductor layer 113 to form an amorphous silicon film as a second semiconductor layer 115 on the first crystalline semiconductor layer. The amorphous silicon film is formed of amorphous silicon in a film thickness of 20–100 nm by a plasma CVD process. Incidentally, prior to forming a second semiconductor layer 115, the first crystalline semiconductor layer 113 may be reduced in thickness by using a wet etching process using TMAH (tetra methyl ammonium hydroxide), a dry etching process using $ClF_3$ or a CMP process. Because this can suppress the film thickness of the entire semiconductor layer, it is possible to suppress a step that is to be problematic upon forming a gate insulation film Subsequently, prior to a second laser radiation process, a heating process is carried out to remove the hydrogen contained in the second semiconductor layer (silicon film). The heating process is made at 400–500° C. for about 1 hour, thereby desorbing the hydrogen contained in the amorphous silicon film. Note that the amorphous semiconductor film formed by a sputter process, having a low hydrogen content, does not require a process for desorbing hydrogen. Then, laser light is radiated to the second semiconductor layer similarly to Example 4 to carry out crystallization under the influence of an orientation of the first crystalline semiconductor layer. The second laser radiation crystallizes also the second semiconductor layer to form a crystalline semiconductor layer 117 having a first crystalline semiconductor ($Si_{1-x}Ge_x$) layer 113 and a second crystalline semiconductor (Si) layer 116 (FIG. 26A).

Subsequently, in order to reduce the concentration of the catalyst element contained in the crystalline semiconductor layer used in the crystallization process on the first semiconductor layer, a process is made to move it from the crystalline semiconductor layer. First, a barrier layer 118 is formed on the crystalline semiconductor layer. The barrier layer 118 is not especially limited in its thickness. There is, as a simple forming method, a method to process the surface of the crystalline semiconductor layer by the use of ozone water. This process forms a chemical oxide on the surface of the crystalline semiconductor layer. Another method for forming a barrier layer may use any of a plasma process in an oxidizing atmosphere, a method that ozone is caused by ultraviolet ray radiation in an oxygen-containing atmosphere to carry out oxidizing process for formation, a method that a clean oven is used for heating up to approximately 200–350° C. to form a thin oxide film, a method that an oxide film is deposited to approximately 1–5 nm by plasma CVD process, sputter process or deposition process.

Then, on the barrier layer, a semiconductor layer 119 is formed for a gettering region. For a gettering region 119, a semiconductor film is formed in a thickness of 25 –250 nm by a plasma CVD process or sputter process. Typically, an amorphous silicon film containing 0.01–20 atom percent of Ar is formed by a sputter process.

Thereafter, a heating process is carried out to move the catalyst element remaining in the crystalline semiconductor layer into the gettering region. The heating process may use any of a method using a furnace (in a nitrogen atmosphere at 450–600° C. for 0.5–12 hours), an RTA process using a heating light source (instantaneously to a silicon film at 600–1000° C. for 1–60 seconds), and an RTA process with a heated inert gas (at 550–700° C. for 1–5 minutes). The heating process causes the catalyst element to move into the gettering region due to diffusion. The catalyst element contained in the crystalline semiconductor layer can be reduced in concentration down to $1\times10^{17}/cm^3$ or lower. Incidentally, with this heating process, the gettering region containing the inert gas element in a concentration of $1\times10^{20}/cm^3$ or more will not be crystallized.

After ending the gettering process, the semiconductor film in the gettering region 119 is selectively etched and removed away similarly to Example 5. After ending the etching process on the gettering region, the barrier layer 118 may be removed by hydrogen fluoride.

In this manner, formed is a crystalline semiconductor layer having the overlying layers of a first crystalline semiconductor layer and second crystalline semiconductor layer reduced in catalyst element concentration and having a high orientation ratio and aggregated with large-sized crystal grains. Incidentally, after crystallization, boron as an acceptor-type impurity is added to the semiconductor film by an ion dope technique in order to control the TFT threshold voltage. The concentration of addition may be properly determined by a practitioner.

Figure 26C:
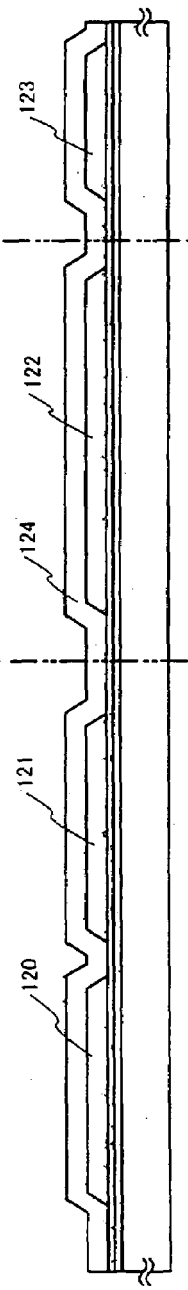

The polysilicon film thus formed is divided by etching to form semiconductor films 120–123. On this, a silicon oxide nitride film 110, to be made using $SiH_4$ and $N_2O$ by a plasma CVD process, is formed as a gate insulation film 124 to a thickness of 110 nm (FIG. 26C).

Figure 26D:
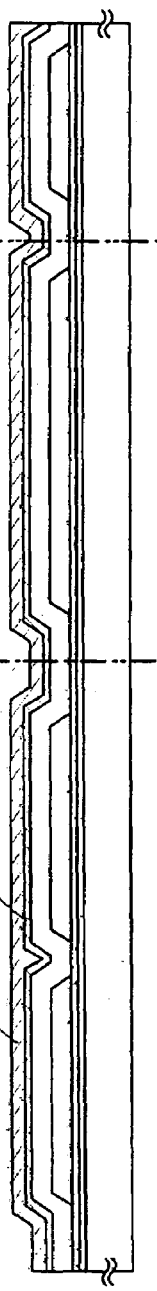

Furthermore, a tantalum nitride film is formed as a first conductor film 125 to a thickness of 30 nm on the gate insulation film 124 by a sputter process, and further tungsten is formed as a second conductor film 126 to a thickness of 300 nm (FIG. 26D).

Next, masks 127–130 are formed by using a photosensitive resist material, as shown in FIG. 27A. Then, a first etching process is made on the first conductor film 125 and second conductor film 126. The etching uses an ICP (Inductively Coupled Plasma) etching technique. The etching gas, although not limited, uses $CF_4$, $Cl_2$ and $O_2$ in etching a W film or tantalum nitride film. Etching is made under a pressure of 1 Pa at a flow rate ratio of the gases of 25:25:10 by supplying an RF (13.56 MHz) electric power at 500 W to a coil-formed electrode. In this case, a 150W RF (13.56 MHz) power is supplied also to the substrate end (sample stage), applying substantially a negative self-bias voltage. Under the first etching condition, the W film mainly is etched into a predetermined form.

Thereafter, the etching gas is changed to $CF_4$ and $Cl_2$, to provide a gas flow rate ratio of 30:30. Under a pressure of 1 Pa, 500W RF (13.56 MHz) power is supplied to the coil-formed electrode, to cause a plasma and carry out etching for about 30 seconds. 20W RF (13.56 MHz) power is supplied also to the substrate end (sample stage), applying substantially a negative self-bias voltage. The mixture gas of $CF_4$ and $Cl_2$ etches the tantalum nitride film and the W film at nearly the same rate. In this manner, formed are gate electrodes 131–134 in a first form having taper-ended first electrodes 131a–134a and second electrodes 131b–134b. The taper is formed at 45–75 degrees. Incidentally, the gate insulation film 124, at a surface of a region not covered by the first-formed gate electrode 131–134, is etched by approximately 20–50 nm and formed with a thickness-reduced region (FIG. 27A).

Next, a second etching process is carried out without removing the masks 127–130, as shown in FIG. 27B. The etching gas uses $CF_4$, $Cl_2$ and $O_2$, to provide a gas flow rate ratio of 20:20:20. Under a pressure of 1 Pa, 500W RF (13.56 MHz) power is supplied to the coil-formed electrode, to cause a plasma and carry out etching. 20W RF (13.56 MHz) power is supplied to the substrate end (sample stage), to apply a self-bias voltage lower as compared to that of the first etching process. Under this etching condition, the W film used as the second conductor film is etched. In this manner, formed are gate electrodes 135–138 in a second form having third electrodes 135a–138a and fourth electrodes 135b–138b. The gate insulation film 124, at a surface of a region not covered by the second-formed gate electrodes 135–138, is etched by approximately 20–50 nm and reduced in thickness. The third electrode and fourth electrode are also referred to as an electrode (A) and electrode (B), for convenience.

Subsequently, a first doping process is made to add an impurity element providing n-type (n-type impurity element) to the semiconductor layer. The first doping process is carried out by an ion doping technique to implant ions without mass separation. In the doping, the first-formed electrodes 135–138 are used as a mask. Using a hydrogen-diluted phosphine ($PH_3$) gas or inert-gas-diluted phosphine gas, n-type impurity regions 139–142 containing a first concentration of n-type impurity element are formed in the semiconductor films 120–123. By this doping, the n-type impurity region containing a first concentration of n-type impurity element is made in a phosphorus concentration of $1 \times 10^{16}$–$1 \times 10^{17}$/$cm^3$ (FIG. 27B).

Thereafter, formed are a mask 143 covering the second semiconductor layer 121, a mask 144 exposing a part of the third semiconductor layer 122 and a mask 145 covering the fourth semiconductor layer 123, to carry out a second doping process. In the second doping process, an n-type impurity region 146 containing a second concentration of n-type impurity element is formed in the first semiconductor layer 120 through the third electrode (electrode (A)) 135a. By this doping, the n-type impurity region containing a second concentration of n-type impurity element is made in a phosphorus concentration of $1 \times 10^{17}$–$1 \times 10^{19}$/$cm^3$.

Subsequently, the masks 143, 144, 145 are left as they are to carry out a third doping process. An n-type impurity element is added to the first semiconductor layer 120 and third semiconductor layer 122 through the gate insulation film 124, to form n-type impurity regions 147, 148 containing a third concentration of n-type impurity element. By this doping, the n-type impurity region containing a third concentration of n-type impurity element is made in a phosphorus concentration of $1 \times 10^{20}$–$1 \times 10^{21}$/$cm^3$ (FIG. 27C).

Incidentally, although this example adds the impurity element separately twice as in the above, by controlling the film thickness of the gate insulation film or third electrode forming a gate electrode or by adjusting the acceleration voltage for doping, it is possible to form an n-type impurity region containing a second concentration of n-type impurity element and an n-type impurity region containing a third concentration of n-type impurity element by once of a doping process.

Figure 28A:
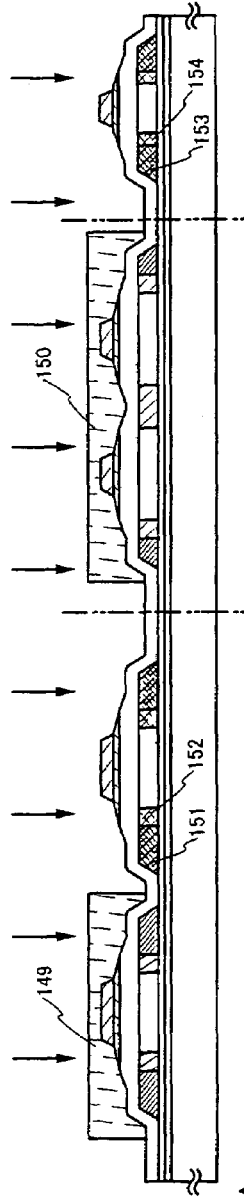
FIGS. 28A to 28C are views showing a TFT fabrication process using the invention.

Next, as shown in FIG. 28A, masks 149, 150 are formed covering the first semiconductor layer 120 and third semiconductor layer 122 to carry out a fourth doping process. The doping uses a hydrogen-diluted diborane gas ($B_2H_6$) or inert-gas-diluted diborane gas, to form a p-type impurity region 152 of a first concentration and a p-type impurity region 151 of a second concentration in the second semiconductor layer 121. Also, formed, in the fourth semiconductor layer 123 forming a holding capacitance in the pixel section, is a p-type impurity region 154 of a first concentration and a p-type impurity region 153 of a second concentration. The p-type impurity regions 152, 154 of the first concentration is to be formed in an area overlapped with an electrode (A) 136a, 138a, to which is to be added boron in a concentration range of $1 \times 10^{18}$–$1 \times 10^{20}$/$cm^3$. The p-type impurity region 151, 153 of the second concentration is to be added with boron in a concentration range of $2 \times 10^{20}$–$3 \times 10^{21}$/$cm^3$.

In the process so far, phosphorus or boron added regions are formed in the respective semiconductor films. The second-formed gate electrodes 135–137 are made into gate electrodes. Meanwhile, the second-formed electrode 138 is made into one capacitance electrode forming a holding capacitance in the pixel section.

Figure 28B:
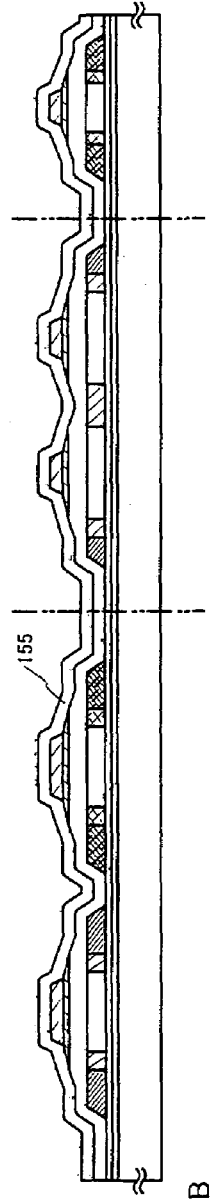

Then, as shown in FIG. 28B, the second harmonic (532 nm) light of a YAG laser is radiated to the semiconductor films in order to activate the impurity elements added in the respective semiconductor films. Incidentally, the method for activating the impurity elements added in the semiconductor layers may be by a heating process using a furnace at 550° C. for 4 hours, or a heating process due to RTA (including RTA using a gas or light as a heat source).

Meanwhile, by combining the gettering process with the heating process for activation, the catalyst element used in crystallizing the semiconductor film can be moved to a TFT source or drain region (region added with phosphorus in high concentration) thereby reducing the catalyst element concentration of the channel region.

Thereafter, as shown in FIG. 28B, a first interlayer insulating film 155 is formed of silicon nitride or silicon nitride oxide to a thickness of 50 nm by a plasma CVD process.

Using a clean oven, a heating process is made at 410° C. to hydrogenate the semiconductor film with using the hydrogen given off the silicon nitride film or silicon nitride oxide film.

Figure 28C:
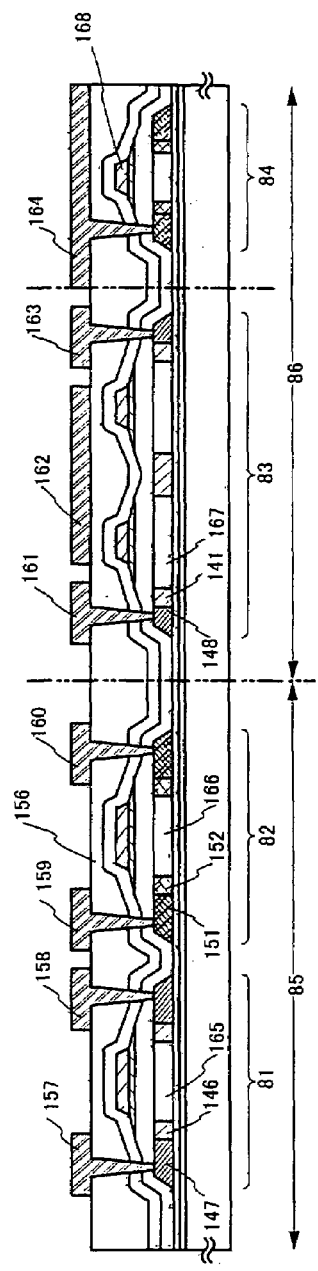

Then, a second interlayer insulating film 156 is formed of acryl on the first interlayer insulating film 155. Then, contact holes are formed. In the etching process, the first interlayer insulating film and third interlayer insulating film are removed in the external input terminal. Then, interconnections 157–164 are formed by the layers of a titanium film and an aluminum film (FIG. 28C).

In this manner, on the same substrate are formed a drive circuit 85 having an n-channel TFT 81 and a p-channel TFT 82 and a pixel section 86 having a TFT 83 and a holding capacitance 84. The holding capacitance 84 is formed by the semiconductor 123, the gate insulation film 124 and the capacitance interconnection 168.

The n-channel TFT 81 of the drive circuit 205 has a channel region 165, an n-type impurity region 146 ($L_{0V}$ region) including a second concentration of n-type 30 impurity element overlapped with the electrode (A)135a forming a gate electrode, and an n-type impurity region 147 including a third concentration of n-type impurity element serving as a source or drain region. The $L_{0V}$ region is formed with a channel longitudinal length of 0.5–2.5 µm, preferably 1.5 µm. The $L_{0V}$ region structure principally aims at preventing the TFT deterioration due to hot carrier effects. Such n-channel and p-channel TFTs can form a shift register circuit, a buffer circuit, a level shifter circuit, a latch circuit and so on. Particularly, for a buffer circuit high in drive voltage, the structure of n-channel TFT 81 is suited for the purpose of preventing against the deterioration due to hot carrier effects.

The p-channel TFT 82 of the drive circuit 85 has a channel region 166, a p-type impurity region 151 including a second concentration of p-type impurity element on the outside of the electrode (A) 136a forming a gate electrode (region serving as a source or drain region), and a p-type impurity region 152 including a first concentration of p-type impurity element overlapped with the electrode (A) 136a.

The TFT (pixel TFT) 83 of the pixel section 86 has a channel region 167, an n-type impurity region 141 including a first concentration of n-type impurity element formed on the outside of the channel region, and an n-type impurity region 148 including a third concentration of n-type impurity element serving as a source or drain region. Also, p-type impurity regions 153, 154 are formed in the semiconductor layer 123 serving as one electrode of the holding capacitance 214.

In this manner, the invention can properly determine an arrangement correspondingly to the circuits different in operating conditions, e.g. a drive circuit section and a pixel section.

Figure 29:
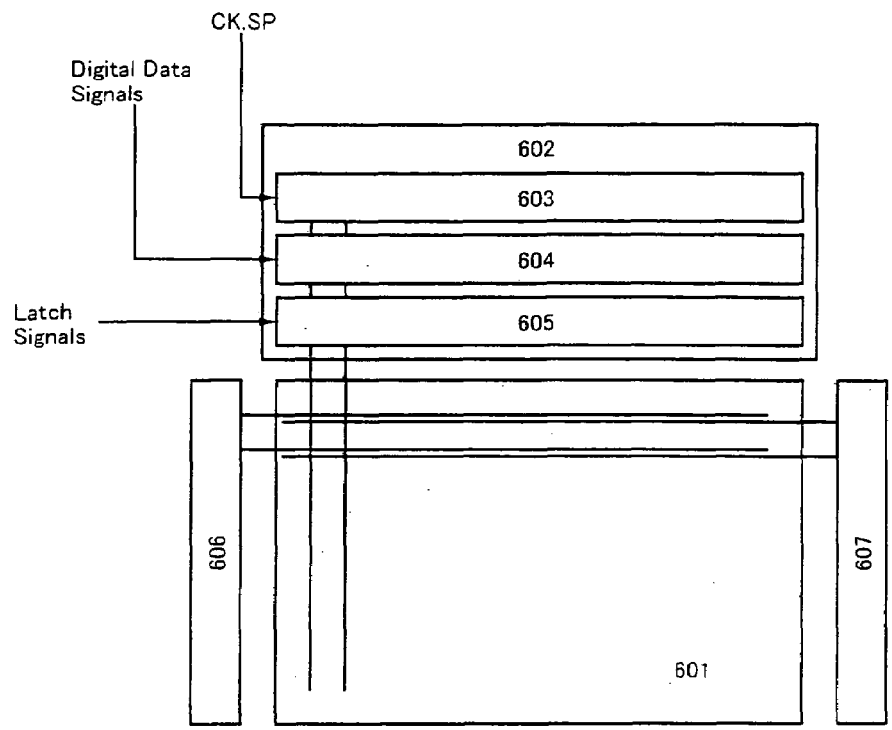
FIG. 29 is a diagram showing an example of practical application of the invention.

FIG. 29 is a circuit block showing an example of a circuit configuration of the active-matrix substrate. Incorporating TFTs, formed are a pixel section 601, a data signal line drive circuit 602 and a scanning signal line drive circuit 606. The data signal line drive circuit 602 is configured with a shift register 603, latches 604, 605, buffer circuits and so on. The shift register 603 is to be inputted by clock and start signals, while the latch is to be by digital-data and latch signals. Also, the scanning signal line drive circuit 606 is configured with a shift register, buffer circuits and the like. The pixel section 601 has pixels in an arbitrary number, wherein 1024×768 pixels are provided in the case of an XGA.

Using such an active-matrix substrate, a display device can be formed for active-matrix driving. The present example, because forming the pixel electrode of a light-reflective material, can form a reflective display device if applied to a liquid-crystal display device. From such a substrate, it is possible to form a liquid-crystal display device or a light emitting device forming a pixel section with organic light-emitting elements. Thus, an active-matrix substrate can be fabricated corresponding to a reflective display device.

The process for fabricating an active-matrix liquid-crystal display device from the active-matrix substrate is as follows.

At first, after fabricating an active-matrix substrate in a state of FIG. 28C, an alignment film 180 is formed on the active-matrix substrate to carry out a rubbing process. Next, a counter substrate 181 is prepared, to form coloring layers 182, 183 and a planarizing film 184 on the counter substrate 180. By partly overlapping a red coloring layer 182 with a blue coloring layer 183, these serve as a shadow film. Note that, although not shown in FIG. 30, there also are regions where red and green coloring layers are overlapped to serve as a shadow film.

Figure 30:
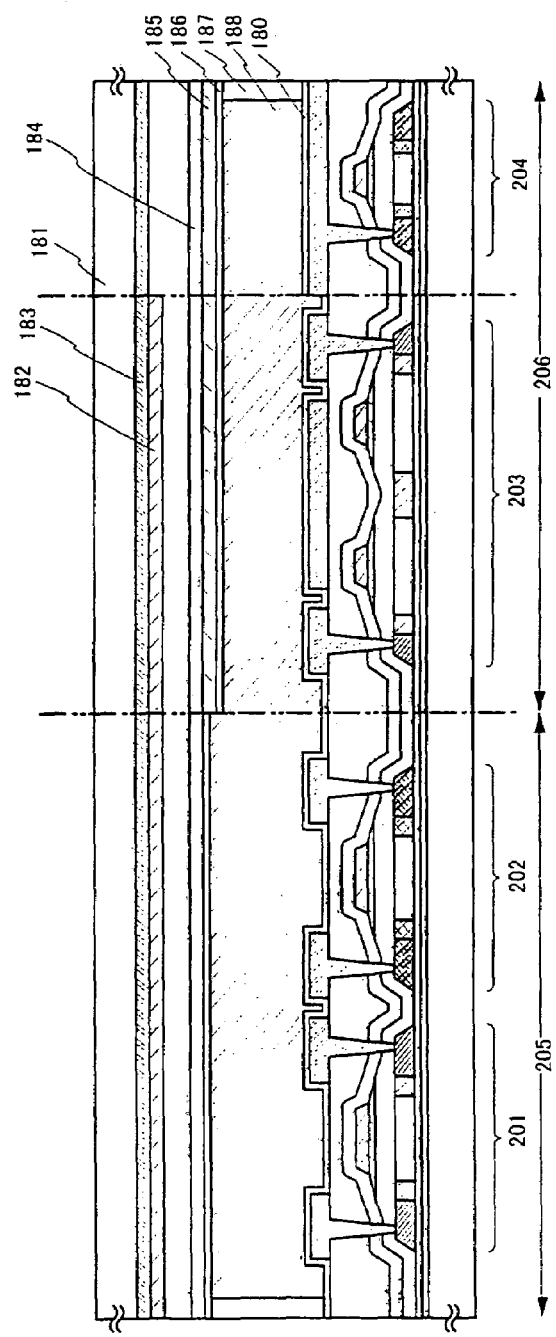
FIG. 30 is a view showing an example of practical application of the invention.

Then, after forming a counter electrode 185 in the pixel section, an alignment film 186 is formed on the entire surface to carry out a rubbing process. Then, bonded together are the active-matrix substrate formed with the pixel section and drive circuit and the counter substrate formed with the coloring layers and pixel electrodes, through a seal material 187. The seal material 187 is mixed with a filler so that the filler, together with cylindrical spacers, enables to bond together the two substrates with an even spacing. Thereafter, a liquid-crystal material 188 is poured to between the bonded substrates, and they are completely sealed by a sealant (not shown). The liquid-crystal material 188 may use a known liquid-crystal material. In this manner, an active-matrix liquid crystal display device is completed as shown in FIG. 30.

Example 9

The present invention can be applied regardless of a TFT form. This example explains an example that the invention is applied to a fabrication process of a bottom-gate TFT, with reference to FIGS. 38A to 38F and 39A to 39E.

An insulating film, such as a silicon oxide film, a silicon nitride film or a silicon oxide nitride film, is formed on a substrate 50 (not shown). A conductor film is formed to form a gate electrode and patterned into a desired form, obtaining a gate electrode 51. The conductor film may use a conductor film based on one or a plurality of elements selected from Ta, Ti, W, Mo, Cr and Al.

Then, a gate insulation film 52 is formed. The gate insulation film may be a single layer of a silicon oxide film, a silicon nitride film or a silicon oxide nitride film, or an overlying structure of these films. An amorphous semiconductor film is formed of silicon-germanium 53 as a first semiconductor layer. Using $SiH_4$ and $GeH_4$ as a reactive gas, the film may be formed to a film thickness of 20–100 nm by a plasma CVD process, a low-pressure CVD process or the like.

Figure 38A:
FIGS. 38A to 38F are views showing an example of practical application of the invention.
Figure 38B:
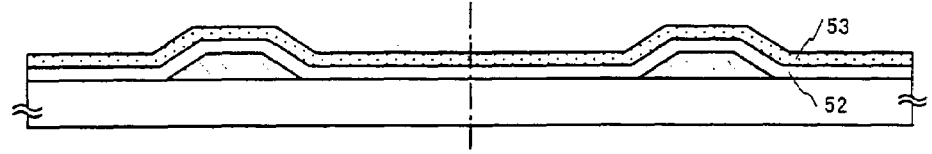
Figure 38C:
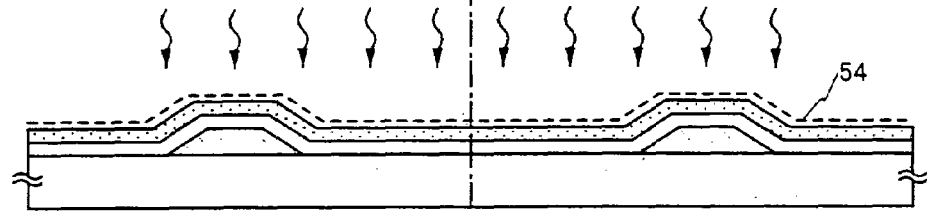

Subsequently, a catalyst element is added to the first semiconductor layer to form a catalyst-element containing layer 54. A heating process is made to form a first crystalline semiconductor layer. The heating process may use any of a method of heating using the radiation heat of a light source, a method of heating with a heated inert gas and a method of heating using a furnace (FIG. 38C).

Figure 38D:
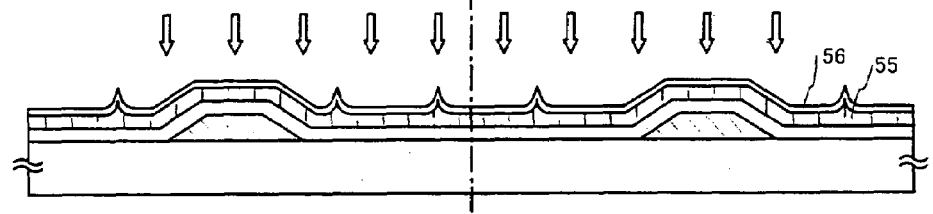

Then, a first laser light is radiated to the first crystalline semiconductor layer similarly to Example 4. The first laser light uses, as a light source, an excimer laser having a wavelength of 400 nm or shorter or a second harmonic (wavelength: 532 nm) to fourth harmonic (wavelength: 266 nm) of a YAG laser or YVO$_4$ laser. The laser light is focused into a linear or spot form by an optical system, to provide a radiation with an energy density of 460 mJ/cm$^2$. The laser light thus focused is scanned over a predetermined area of the substrate, and radiated to the first crystalline semiconductor layer with an overlapping ratio of 90–98%, thereby forming a first crystalline semiconductor layer 55 having a concavo-convex form in a surface thereof. Meanwhile, an oxide film 56 is formed on the surface of the first crystalline semiconductor layer 55 (FIG. 38D).

Figure 38E:
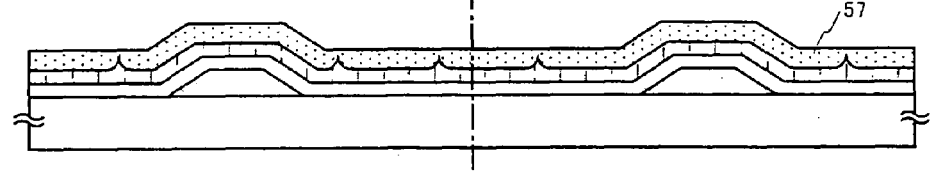

Next, after removing the oxide film 56, an amorphous silicon film 57 is formed as a second semiconductor layer. This may be formed in a film thickness of 20–100 nm by using a plasma CVD process (FIG. 38E).

Figure 38F:
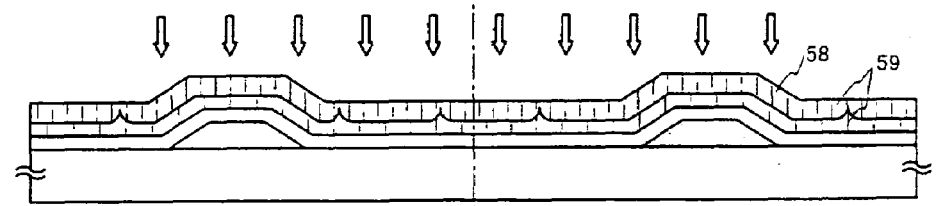

Subsequently, a second laser light is radiated to the second semiconductor layer 57 similarly to Example 4, to crystallize the second semiconductor layer 57. The second semiconductor layer undergoes the influence of a high orientation of the first crystalline semiconductor layer 55, and a second crystalline semiconductor layer 58 is formed having a high orientation. Incidentally, the energy density of the second laser light is given higher than an energy density of the first laser light. This example is given with 553 mJ/cm$^2$. By the second laser radiation, the second semiconductor layer is crystallized to form a crystalline semiconductor layer 59 having a first crystalline semiconductor (Si$_{1-x}$Ge$_x$) layer 55 and a second crystalline semiconductor (Si) layer 58 (FIG. 38F).

Then, carried out is a process to move into a gettering region the catalyst element used in the crystallization process on the first semiconductor layer. A barrier layer 60 is formed on the crystalline semiconductor layer 59. A gettering region 61 is formed on the barrier layer 60. The barrier layer 60 is not especially limited in its thickness. There is a simple forming method to process the surface of the crystalline semiconductor layer by the use of ozone water. Because this process forms a chemical oxide on the surface of the crystalline semiconductor layer, this film may be used. The semiconductor layer 61 for a gettering region is formed by an amorphous silicon film containing 0.01–20 atom percent of Ar in a thickness of 25–250 nm by a plasma CVD process or sputter process. This semiconductor film, because to be removed later, is desirably made by a low density film (e.g. amorphous silicon film) to enhance the selective ratio to the crystalline semiconductor layer in order for easy removal upon etching.

Figure 39A:
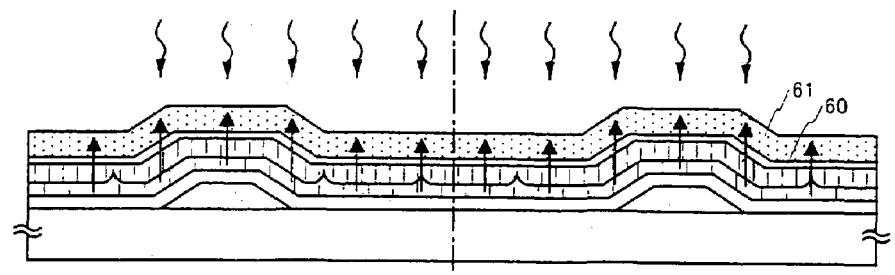
FIGS. 39A to 39E are views showing an example of practical application of the invention.

Thereafter, a heating process is carried out in order to move the catalyst element to the gettering region. This may use any of a method of heating using radiation heat of a light source, a method of heating with a heated inert gas, and a method of heating using a furnace. Due to the heating process, the catalyst element is moved to the gettering region due to diffusion to reduce the concentration of the catalyst element contained in the crystalline semiconductor layer down to $1\times10^{17/cm3}$ or less (FIG. 39A).

After ending the gettering process, the gettering region 61 and the barrier layer 60 may be removed away in the order. In this manner, formed is a crystalline semiconductor layer having the overlying layers of a first crystalline semiconductor layer and second crystalline semiconductor layer reduced in catalyst element concentration and having a favorable structure having a high orientation ratio and aggregated with large-sized crystal grains.

Figure 39B:
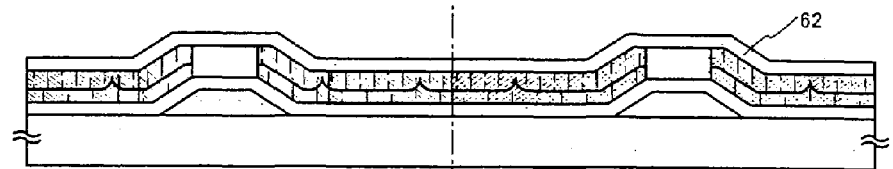
Figure 39C:
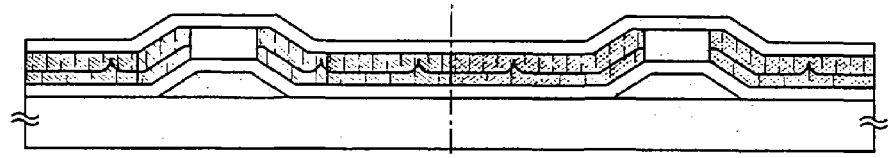
Figure 39D:
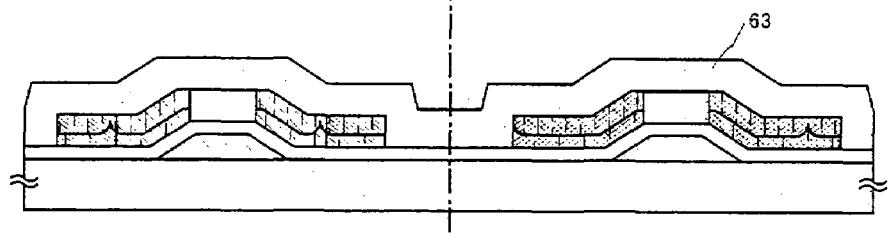
Figure 39E:
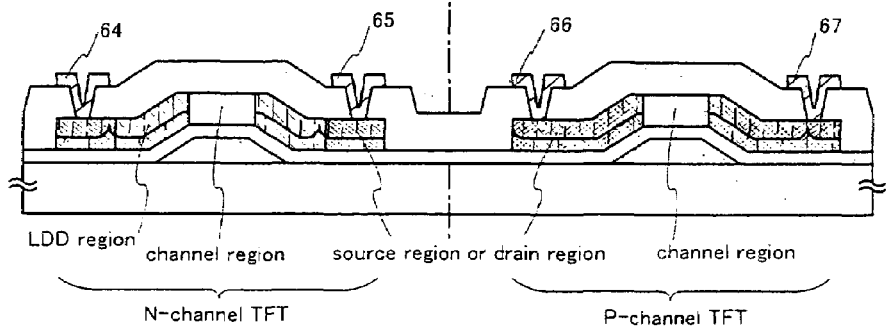

After ending the crystallization process, an insulating film 62 is formed in a thickness of 100–400 nm for protecting the crystalline silicon film (channel region) in a later impurity adding process. Then, a resist mask is used to add an n-type providing impurity element at a concentration of $1\times10^{20}$–$1\times10^{21}$/cm$^3$ to the crystalline silicon film in a region as a later n-channel TFT active layer, and a p-type providing impurity element at a concentration of $1\times10^{20}$–$5\times10^{21}$/cm$^3$ to the crystalline silicon film in a region as a later p-channel TFT active layer and an inert gas element at a concentration of $1\times10^{19}$–$1\times10^{22}$/cm$^3$, thereby forming source, drain and LDD regions (FIG. 39B).

Next, the insulating film on the crystalline silicon film is removed to pattern the crystalline silicon film into a desired form, followed by forming an interlayer insulating film 63. The interlayer insulating film is formed by an insulating film, such as a silicon oxide film, a silicon nitride film or a silicon oxide nitride film, to a thickness of 500–1500 nm. Thereafter, contact holes are formed reaching the source or drain regions of the TFTs, thereby forming interconnections 64–67 electrically connecting the TFTs.

Incidentally, although this example formed the second semiconductor layer before performing a gettering process for reducing the content of the catalyst element contained in the first semiconductor layer, the manufacturing process can use, in combination, any of Examples 4–6. In this manner, the invention can be applied regardless of a TFT form.

Example 10

This example explains an example that the invention is applied to a manufacturing process for a TFT having a semiconductor layer sandwiched between a pair of gate interconnections, with reference to FIGS. 40A to 40F and 41A to 41D.

On a substrate 1000, an insulating film, such as a silicon oxide film, a silicon nitride film or a silicon oxide nitride film, is formed similarly to Example 6 (not shown). In order to form a gate electrode, a conductor film is formed and patterned into a predetermined form, thereby obtaining a first gate interconnection 1001.

Then, an underlying insulating film 1002 is formed. The underlying insulating film may be a single layer of a silicon oxide film, a silicon nitride film or a silicon oxide nitride film or a layered structure of these films. A silicon-germanium film 1003 is formed as a first semiconductor layer. Using SiH$_4$ and GeH$_4$ as a reactive gas, a film may be formed to a thickness of 20–100 nm by a plasma CVD process or low-pressure CVD process.

Figure 40A:
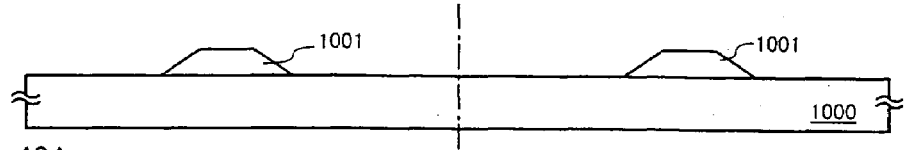
FIGS. 40A to 40F are views showing an example of practical application of the invention.
Figure 40B:
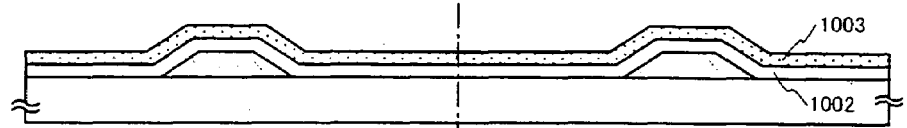
Figure 40C:
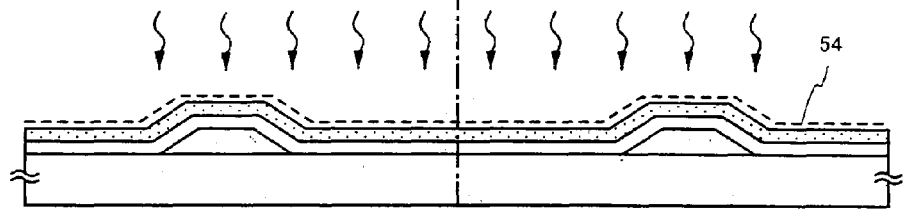

Subsequently, a catalyst element is added to the first semiconductor layer to form a catalyst-element containing layer 54. A heating process is made to form a first crystalline semiconductor layer. The heating process may use any of a method of heating using the radiation heat of a light source, a method of heating with a heated inert gas and a method of heating using a furnace (FIG. 40C).

Figure 40D:
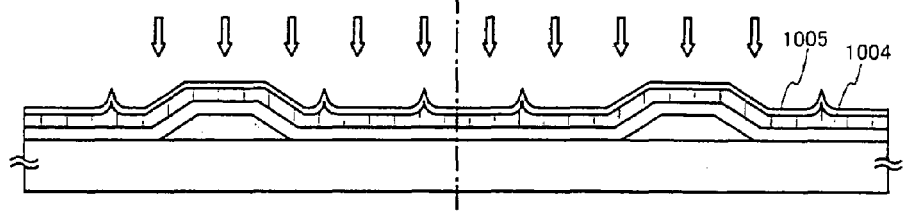

Next, a first laser light is radiated to the first crystalline semiconductor layer similarly to Example 6, to form a first crystalline semiconductor layer 1004 having a concavo-convex form in a surface thereof. Also, an oxide film 1005 is formed on the surface of the first crystalline semiconductor layer 1004 (FIG. 40D).

Figure 40E:
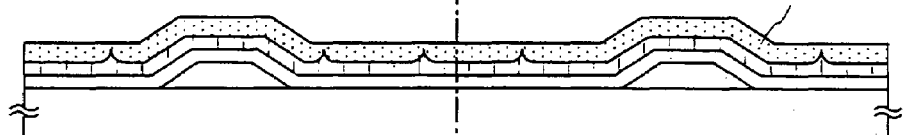
Figure 40F:
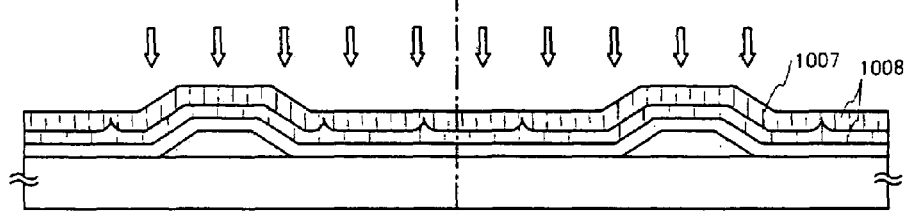

Then, after removing the oxide film 1005, an amorphous silicon film 1006 is formed as a second semiconductor layer. This may be formed to a film thickness of 20–100 nm by using a plasma CVD process (FIG. 40E).

Subsequently, a second laser light is radiated to the second semiconductor layer 1006 similarly to Example 6, to crystallize the second semiconductor layer 1006. The second semiconductor layer is formed into a highly-oriented second crystalline semiconductor layer 1007 under the influence of a high orientation of the first crystalline semiconductor layer 1004. Thus, formed is a crystalline semiconductor layer 1008 having a first crystalline semiconductor ($Si_{1-x}Ge_x$) layer 1004 and a second crystalline semiconductor (Si) layer 1007 (FIG. 38F).

Then, a process is made to move to the gettering region the catalyst element used in crystallizing the first semiconductor layer 1003. A barrier layer 1009 is formed on the crystalline semiconductor layer 1008 to form a gettering region 1010 on the barrier layer 1009. The semiconductor layer 1010 for a gettering region is formed by an amorphous silicon film containing 0.01–20 atom percent of Ar to a thickness of 25–250 nm. This semiconductor film, because to be removed later, is desirably made by a low density film (e.g. amorphous silicon film) to enhance the selective ratio to the crystalline semiconductor layer in order for easy removal by etching.

Figure 41A:
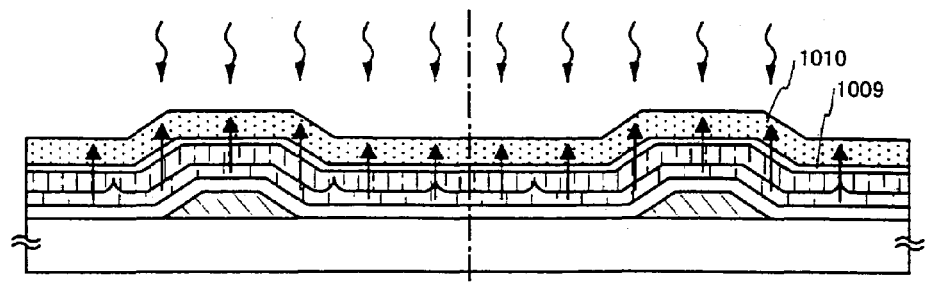
FIGS. 41A to 41D are views showing an example of practical application of the invention.
Figure 41B:
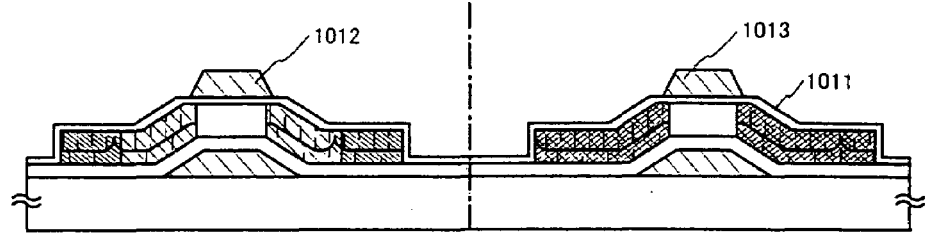
Figure 41C:
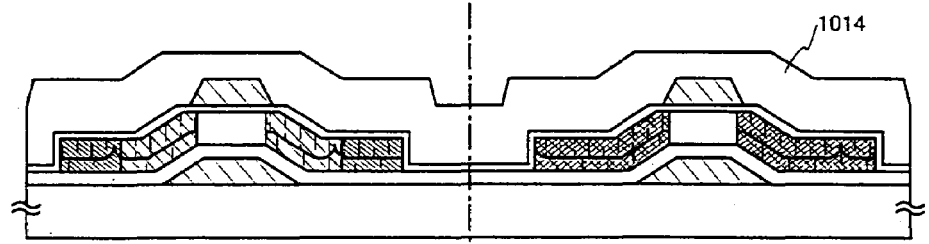
Figure 41D:
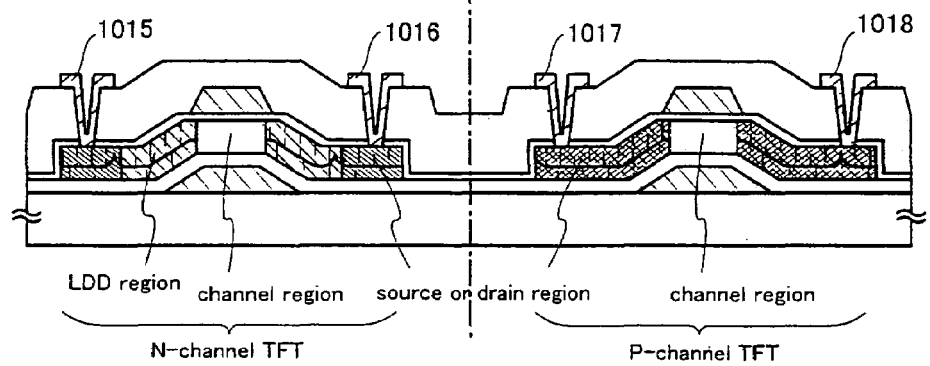

Thereafter, a heating process is made to move the catalyst element into the gettering region, similarly to Example 6 (FIG. 41A).

After ending the gettering process, the gettering region 1010 and the barrier layer 1009 may be removed away in the order. In this manner; formed is a crystalline semiconductor layer having the overlying layers of a first crystalline semiconductor layer and second crystalline semiconductor layer reduced in catalyst element concentration and having a favorable structure having a high orientation ratio and aggregated with large-sized crystal grains.

Subsequently, a gate insulating film 1011 is formed covering the crystalline semiconductor layer 1008. The gate insulating layer 1011 is formed of an insulator containing silicon by a plasma CVD process or sputter process, whose thickness is 40–150 nm. On the same, second gate interconnections 1012, 1013 are formed. Although the material for forming the second gate interconnections is not limited, it may be in a layered structure having a first layer formed of a nitride of a refractory metal, such as molybdenum or tungsten, and a refractory metal or low-resistance metal, such as aluminum or copper, or polysilicon formed thereon.

Thereafter, the impurity elements for providing conductivity types are added to the semiconductor films by an ion doping process, to form impurity regions for later source, drain and LDD regions. Furthermore, carried out are heating processes for activation and hydrogenation. Next, an interlayer insulating film 1014 is formed of an organic resin material selected from acryl, polyimide, polyamide and polyimideamide. The interlayer insulating film, in its surface, is desirably planarized by CMP. Thereafter, contact holes are formed reaching the crystalline semiconductor layer 1008, to form interconnections 1015–1018.

Incidentally, although this example formed the second semiconductor layer before performing a gettering process for reducing the content of the catalyst element contained in the first semiconductor layer, the manufacturing process can use, in combination, any of Examples 4–6.

Example 11

Figure 35:
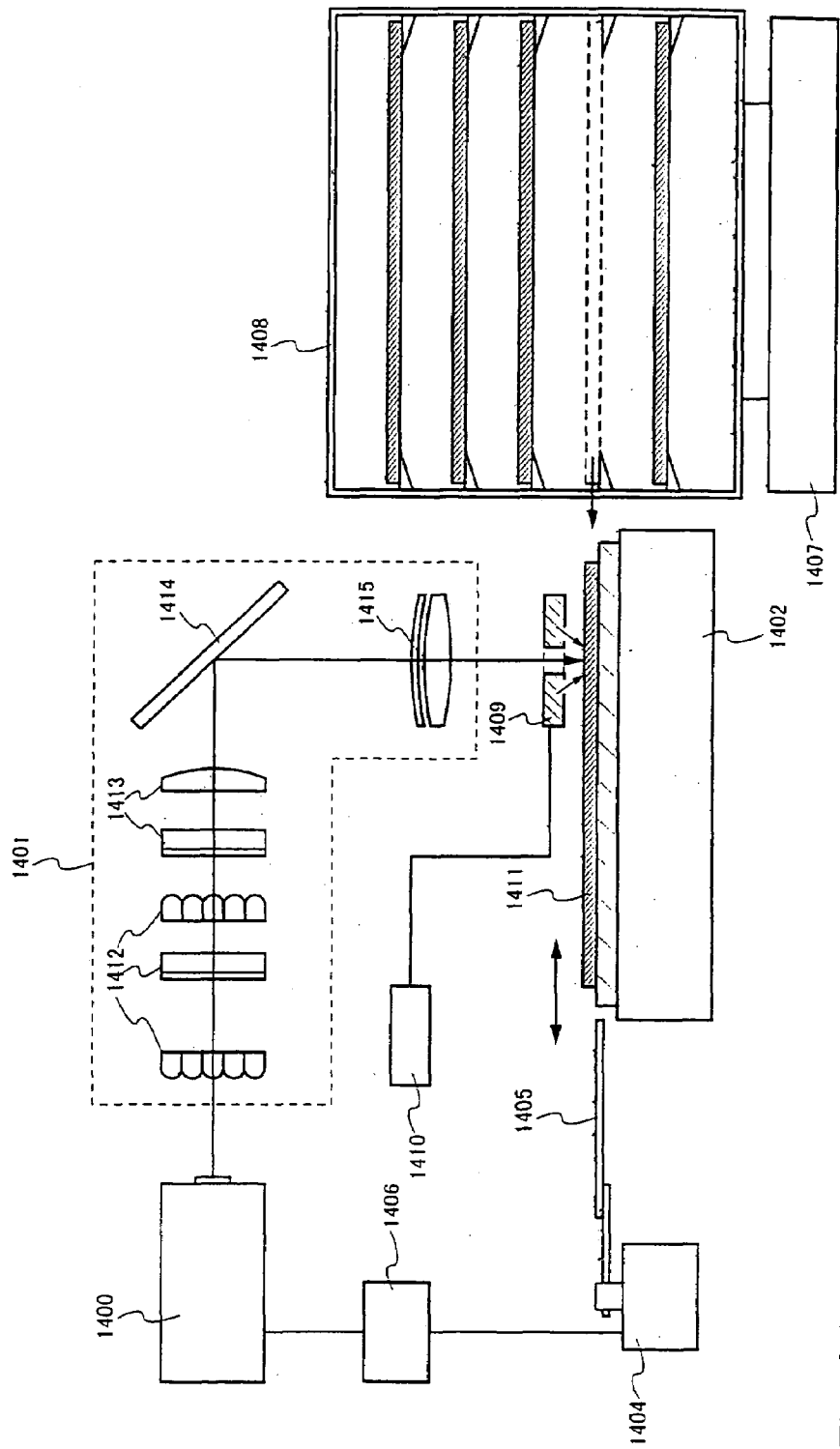
FIG. 35 is a diagram showing an example of practical application of the invention.

FIG. 35 is a diagram showing one form of a laser processing apparatus applicable to the invention. The apparatus is structured with a laser 1400, an optical system 1401, a substrate stage 1402, substrate transport means 1404, a blower 1410 and so on. Meanwhile, there are provided, as accessories, a cassette 1408 for storing substrates 1411, a cassette holder 1407, and a nozzle 1409 for replacing a laser radiation area on a substrate with a gas supplied from the blower.

The laser uses a gas laser, such as an excimer laser, to oscillate with a wavelength of 400 nm or smaller of light, or a solid laser, such as a YAG or a YLF laser. The YAG laser can use, besides a basic wave (1060 nm), a second harmonic (532 nm), a third harmonic (353.3 nm) or the like. Concerning the lasers, a pulse oscillating one is to be used, to adopt an oscillation frequency of approximately 5–300 Hz.

The optical system 1401 is to focus and extend the laser light emitted from the laser 1400 and radiate a linear form of laser light having a small sectional form onto a radiation surface. The structure, although may be arbitrary, uses a cylindrical lens array 1412, a cylindrical lens 1413, a mirror 1414, a tablet cylindrical lens 1415 and so on. Although depending on a lens size, it is possible to radiate a linear-formed laser light having approximately 100–400 mm in the lengthwise and approximately 100–500 μm in the widthwise.

The stage 1402 is to hold a substrate 1411 for processing and move it in synchronism with a laser. A substrate 1411 is taken from the cassette 1408 and moved in order for laser processing by transport means 1404. The transport means 1404 has an arm 1405. The arm 1405 grasps a substrate 1411 at its end and moves it in one direction thereby allowing to radiate linear-formed laser light onto the entire surface of the substrate.

The laser radiation apparatus thus structured is useful especially in processing a glass substrate having one side exceeding 1000 mm and a thickness of 1 mm or smaller. For example, it is possible to handle a glass substrate having a size of 1200 mm×160 mm or 2000 mm×2500 mm and a thickness of 0.4–0.7 mm.

The laser radiation apparatus shown in this example is to be applied to a process shown in Examples 1–5 by using an oxidizing gas or inert gas as a gas to be blown through the nozzle. The laser radiation apparatus structure does not require a chamber for atmosphere control in laser radiation. The laser eradiation apparatus can be size-reduced even for the substrate-size increase. This example is applicable to Examples 1–10.

Example 12

Figure 13A:
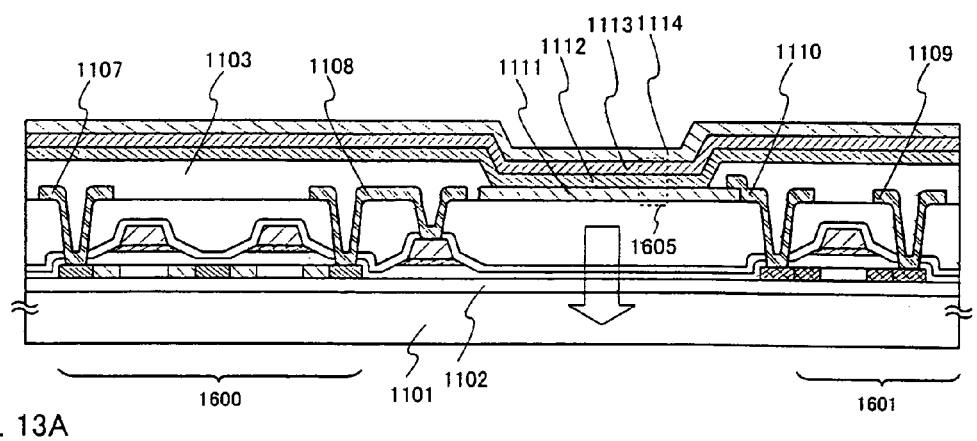
FIGS. 13A and 13B are sectional views showing a pixel structure of an active-matrix display device using light-emitting elements.
Figure 13B:
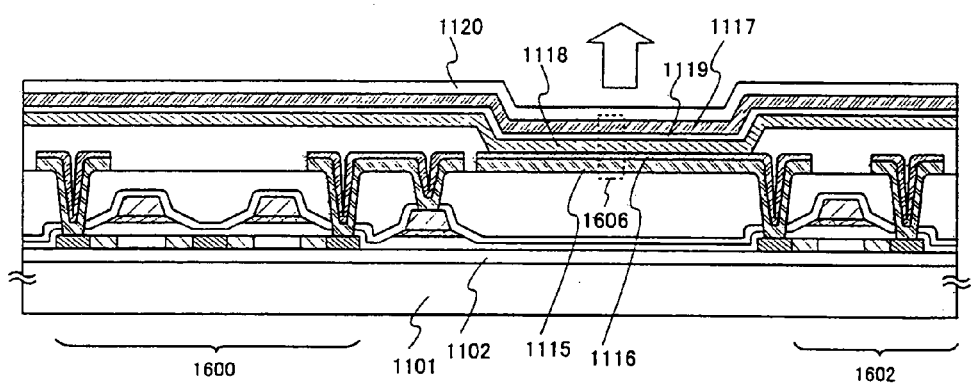

Explanation will be made on an example of a display device using light-emitting elements as another example using a TFT substrate, with reference to the figures. FIGS. 13A and 13B show a pixel-structure top view of a display device formed by arranging TFTs on pixel-by-pixel basis. Incidentally, the n-channel TFTs 1600, 1602 and p-channel TFT 1601 shown in FIGS. 13A and 13B are similar in structure to those of Example 5, and hence detailed explanation is omitted in this example.

FIG. 13A shows a structure that an n-channel TFT 1600 and a p-channel TFT 1601 are formed in a pixel on a substrate 1101 through a blocking layer 1102. In this case, the n-channel TFT 1600 is a switching TFT while the p-channel TFT 1601 is a current control TFT connected at its drain side to one electrode of a light-emitting element 1605. A p-channel TFT 1602 has a purpose acting to control a current flowing to the light-emitting element. Of course, there is no limitation in the number of TFTs to be provided on one pixel, and a proper circuit configuration can be provided in accordance with a display-device drive scheme.

The light-emitting element 1605 shown in FIG. 13A is formed with an anode layer 1111, an organic compound layer 1112 including a phosphor and a cathode layer 1113, on which a passivation layer 1114 is formed. The organic compound layer includes a light-emitting layer, a hole injection layer, an electron injection layer, a hole transport layer, an electron transport layer, and so on. Meanwhile, the luminescence on the organic compound includes the light emission (fluorescence) upon returning from a singlet excitation state to a ground state and the light emission (phosphorescence) upon returning from a triplet excitation state to a ground state. Any one or both of these are included.

The anode forming material uses a material having a high work function, such as indium oxide, tin oxide or zinc oxide. The cathode uses a material having a low work function to be formed of an alkali metal or alkaline earth metal, such as MgAg, AlMg, Ca, Mg, Li, AlLi or AlLiAg, typically a magnesium compound. Meanwhile, the cathode may be formed by a combination of a lithium fluoride layer having a small thickness of 1–20 nm and Al layer or a combination of a thin cesium layer and an Al layer. The anode is connected to an interconnection 1110 on a drain side of the p-channel TFT 1601, and a partition layer 1103 is formed in a manner covering an end of the anode 1111.

A passivation film 1114 is formed on the light-emitting element 1605. The passivation layer 1114 is formed using a material having a high barrier to oxygen or water vapor, e.g. silicon nitride, silicon oxide nitride or diamond-like carbon (DLC). This structure allows the light emitted from the light-emitting element to be radiated at an anode side.

On the other hand, FIG. 13B shows a structure that an n-channel TFT 1600 and an n-channel TFT 1602 are formed in a pixel through a blocking layer 1102 on a substrate 1101. In this case, the n-channel TFT 1600 is a switching TFT while the n-channel TFT 1602 is a current control TFT connected at its drain side to one electrode of a light-emitting element 1606.

The light-emitting element 1606 is formed with a film of a material having a high work function, such as indium oxide, tin oxide or zinc oxide, as an anode material on an interconnection 1115 connected to a drain side of the n-channel TFT 1602. The organic compound layer to be formed thereon is applied with a structure similar to the organic compound layer 1112 of FIG. 13A.

The cathode, in its structure, is formed with a first cathode layer 1118 of a material having a low work function having 1–2 nm, and a second cathode layer 1119 provided for reducing the cathode resistance on the cathode layer 1118. The first cathode layer 1118 is formed of, besides cesium, an alloy of cesium and silver or lithium fluoride, an alkali metal or alkaline earth metal, such as MgAg, AlMg, Ca, Mg, Li, AlLi or AlLiAg, typically a magnesium compound. The second cathode layer 1119 is formed of a metal material having 10–20 nm of Al, Ag or the like, or a transparent conductor film having 10–100 nm of indium oxide, tin oxide or zinc oxide. A passivation film 1120 is formed on the light-emitting element 1606. This structure allows the light emitted from the light-emitting element to be radiated at a cathod side.

Meanwhile, the light-emitting element 1606 of FIG. 13B can have another form structured with a cathode layer 1116 formed as a cathode material, besides cesium, an alloy of cesium and silver or lithium fluoride, of an alkali metal or alkaline earth metal, such as MgAg, AlMg, Ca, Mg, Li, AlLi or AlLiAg, typically a magnesium compound, an organic compound layer 1117, a first anode layer 1118 small in thickness of approximately 1–2 nm, and a second anode layer 1119 formed of a transparent conductor film, on an interconnection 1115 connected to a drain side of the n-channel TFT 1602. The first anode layer is formed of a material having a high work function, such as nickel, platinum or lead, by a vacuum deposition process.

In this manner, a display device can be formed using active-matrix driven light-emitting elements. The crystalline semiconductor layer obtained by the invention, because of high (101)-plane orientation ratio, has a reduced defect density in crystal boundaries to obtain a high field-effect mobility. This display device, because requiring high current drivability in the current control TFT connected to the light-emitting element, is suited for that application. Meanwhile, although not shown herein, the structure providing a drive circuit section in a periphery of the pixel section may be made similarly to Example 6.

Example 13

Figure 16A:
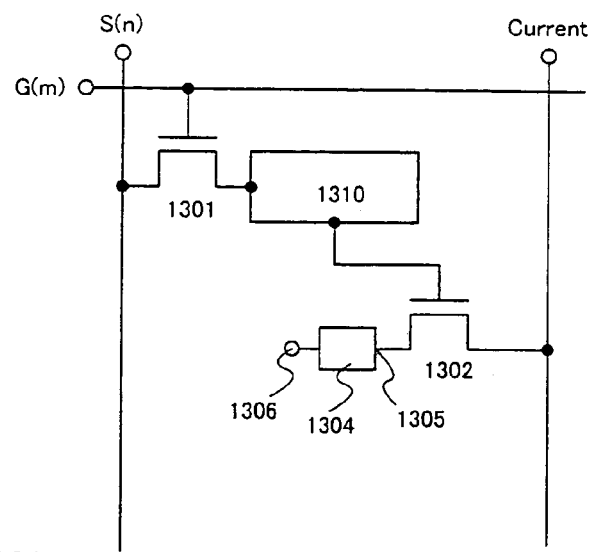
FIGS. 16A and 16B are circuit diagrams showing a structure of an active-matrix display device using a light-emitting element.

FIGS. 16A and 160B show a configuration of a pixel of a display device using a light-emitting element having a voltage compensation circuit. As shown in FIG. 16A, a switching TFT 1301, a driving TFT 1302, a light emitting element 1304, a source signal line (S), a gate signal line (G) and a current supply line (Current) are provided similarly to the conventional. The pixel structure is characterized in that a voltage compensation circuit 1310 is provided between an output electrode of the switching TFT 1301 and a gate electrode of the driving TFT 1302.

Figure 16B:
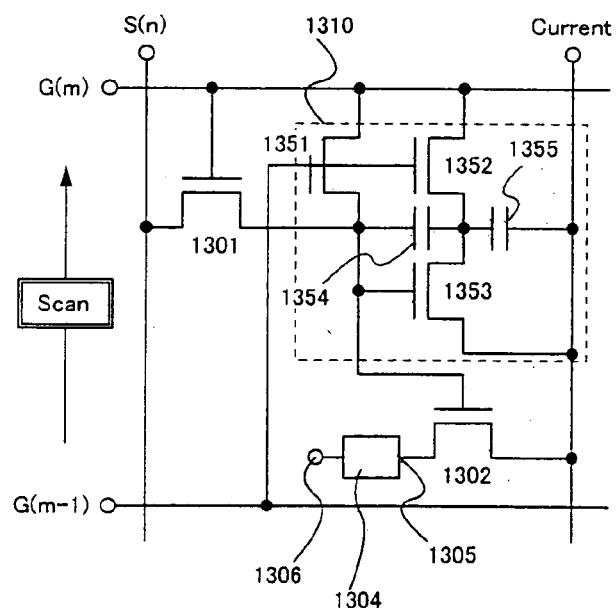

FIG. 16B is a circuit diagram including a configuration of the voltage compensation circuit 1310. The voltage compensation circuit 1310 has a first TFT 1351, a second TFT 1352, a third TFT 1353, a first capacitance 1354 and a second capacitance 1355. Meanwhile, G(m) is a gate signal line to be scanned as an m-th line and G(m−1) is a gate signal line to be scanned as an (m−1)-th line.

The first capacitance 1354 and the second capacitance 1355 are arranged in series. The first capacitance 1354 has a first electrode connected to an output electrode of the switching TFT 1301. The second electrode of the first capacitance 1354 is connected to a first electrode of the second capacitance 1355. The second electrode of the second capacitance 1355 is connected to the current supply line.

The first TFT 1351 has a gate electrode connected to the gate signal line G(m−1), an input electrode connected to the gate signal line G(m) and an output electrode connected to an output electrode of the switching TFT 1301. The second TFT 1352 has a gate electrode connected to the gate signal line G(m−1), an input electrode connected to the gate signal line G(m) and an output electrode connected to a second electrode of the first capacitance 1354 and to a first electrode of the second capacitance 1355. The third TFT 1353 has a gate electrode connected to an output electrode of the switching TFT 1351, an input electrode connected to the current supply line and an output electrode connected to an second electrode of the first capacitance 1354 and to a first electrode of the second capacitance 1355.

Incidentally, the TFTs 1301, 1302, 1351–1353 structuring the pixel all uses the same polarity of TFTs, which polarity may be an n-channel type or p-channel type. In case such TFTs are formed on a crystalline semiconductor layer of the invention, because the (101)-plane orientation ratio is high, the defect density in grain boundaries is reduced and high field-effect mobility is obtained. The light-emitting elements can be operated at high speed and afford to be driven with high current drivability.

Meanwhile, the first capacitance 1354 is a capacitance arranged between the output and gate electrodes of the third TFT 1353, and used to raise the gate electrode potential of the driving TFT 1302 by the utilization of its capacitance coupling. The second capacitance 1355 is a capacitance is arranged in series with the first capacitance 1354, and used to couple the capacitance at between the potential-stabilized current supply line and the driving TFT 1302 thereby holding a potential on the gate electrode of the driving TFT 1302.

It is herein noted that the second capacitance 1355 has another function used as a load to always function the boot-strap in the voltage compensation circuit. In the absence of the load, as soon as the potential on the gate electrode of the third TFT 1353 begins rising due to an input of digital video signal from the source signal line, the potential on the output electrode of the third TFT 1353 immediately rises due to the capacitance coupling. In the event of an occurrence of this operation, there is a possibility that the boot strap does not normally operate. Accordingly, by arranging the second capacitance 1355, the potential on the output electrode of the third TFT 1353 is delayed in rise due to capacitance coupling with respect to a potential rise on the gate electrode of the third TFT 1353. Due to this, the potential rise on the output electrode of the third TFT is predominantly by a drain current flowing due to turning on of the third TFT 1353, thus making possible to normally operate the boot strap.

By the above method, the gate signal selecting pulse, usually requiring a voltage amplitude greater than a voltage amplitude of a digital video signal to be inputted to a source signal line, can be reduced to a voltage amplitude equivalent to that of a digital video signal. Accordingly, it is possible to reduce the consumption power on a side of a gate signal drive circuit. Incidentally, in the case of the operation herein, because the potential on the current supply line is desirably high in view of operation, the light-emitting element 1304 desirably is in an electrode direction that reference numeral 1305 is an anode and reference numeral 1306 is a cathode. In this case, conversely to that in the conventional example, light emission is at a lower surface in a structure with an n-channel TFT while light emission is at an upper surface in a structure with a p-channel TFT.

Example 14

Figure 17A:
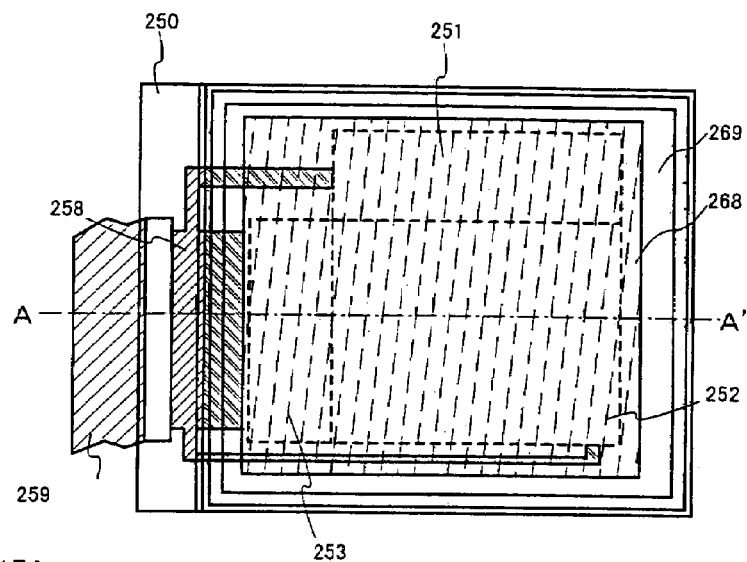
FIGS. 17A and 17B are a top view and a sectional view showing a structure of an active-matrix display device using a light-emitting element.
Figure 17B:
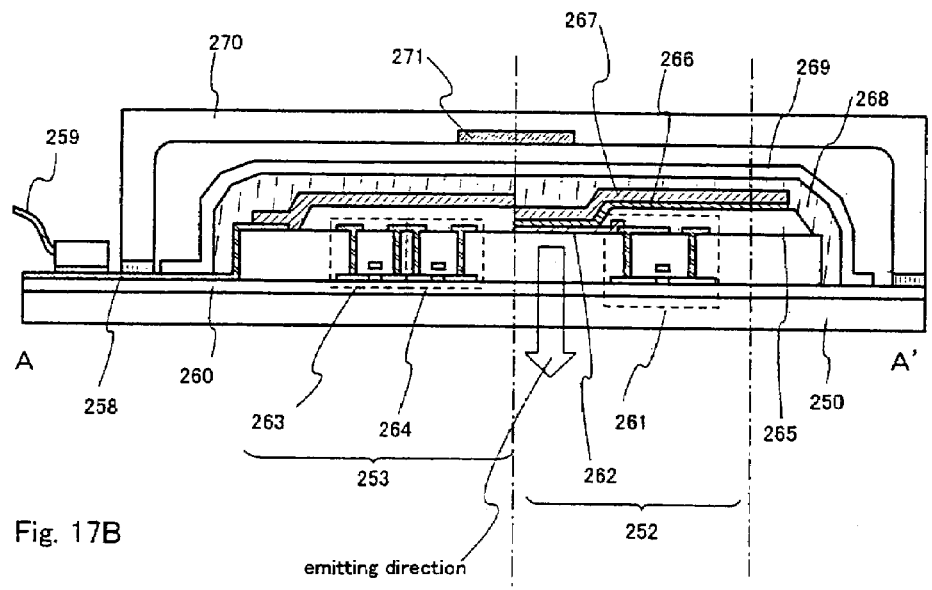

In this example, FIGS. 17A and 17B show a mode of a display device provided with an organic light emitting element described in examples 6 or 7. FIG. 17A is a top view of the display device, and FIG. 17B is a sectional view taken along a line A–A' in FIG. 17A. On a substrate 250 having an insulating surface (for example, a glass substrate, a crystalline glass substrate, or a plastic substrate), a pixel region 252, a source side driver circuit 251, and a gate side driver circuit 253 are formed.

Reference numeral 268 indicates a sealing member, and 269 indicates a DLC film. The pixel region and the driver circuits are covered with the sealing member 268, and the sealing member is covered with protective film 269. Further, this is sealed by a cover member 270 using an adhesive. It is desirable that the cover member 270 is formed by using the same material as that for the substrate 250, for example, a glass substrate in order to withstand deformation due to heat, external force, or the like. The cover member 270 is processed to have a concave shape (with a depth of 3 to 10 μm) shown in FIG. 17B by sandblasting or the like. It is desirable that the cover member 270 is further processed to form a concave portion (with a depth of 50 to 200 μm) into which a drying agent 271 can be arranged. Incidentally, reference numeral 258 indicates a wiring for transmitting signals input to the source side driver circuit 251 25 and the gate side driver circuit 253, and the wiring receives a video signal and a clock signal from an FPC (flexible printed circuit) 259 that is an external input terminal.

Next, the sectional structure is described with reference to FIG. 17B. An insulating film 260 is provided on the substrate 250, and the pixel region 252 and the gate side driver circuit 253 are formed above the insulating film 260. The pixel region 252 is constituted of a plurality of pixels including a current control TFT 261 and one electrode 262 of a light emitting element electrically connected to a drain of the current control TFT 261. Further, the gate side driver circuit 253 is formed by using a CMOS circuit in which an n-channel TFT 263 and a p-channel TFT 264 are combined. These TFTs (including 261, 263, and 264) may be manufactured in accordance with a known technique.

The pixel electrode 262 functions as an anode of an organic light emitting element. Also, partition walls 265 are formed at both ends of the pixel electrode 262, and an organic compound layer 266 and a cathode 267 of the organic light emitting element are formed on the electrode 262 of the light emitting element. The organic compound layer 267 may be formed by freely combining a hole injection layer, a light emitting layer, an electron injection layer, and the like. Organic compound layers may also be formed by the ink jet printing or combination of the spin coating and the ink jet method.

For example, a first organic compound layer comprised of PEDOT can be formed as a hole injection layer, and a second organic compound layer can be formed thereon in a linear shape or a striped shape by using the ink jet printing device of the present invention. In this case, the second organic compound layer becomes a light emitting layer. A polymer or intermediate molecular weight organic compound material may be applied.

The cathode 267 also functions as a common wiring to all the pixels, and is electrically connected to an FPC 259 through a connection wiring 258. Further, all the elements included in the pixel region 252 and in the gate side driver circuit 253 are covered by the cathode 267, the sealing member 268 and the protective film 269. After the organic light emitting element is completely covered by using the sealing member 268, at least the protective film 269 comprised of a diamond-like carbon (DLC) film or the like is preferably provided on the surface (exposed surface) of the sealing member 268 as shown in FIGS. 17A and 17B. Also, the protective film may be provided on the entire surface including the rear surface of the substrate. Here, attention has to be paid to such that the protective film is not formed at the part where the external input terminal (FPC) is provided. The protective film may not be formed by using a mask. Alternatively, the protective film may not be formed by covering the external input terminal portion with a masking tape.

The organic light emitting element is sealed by the sealing member 268 and the protective film with the above-described structure, whereby the organic light emitting element can be completely shut from the outside. Thus, substances that promote deterioration due to oxidization of the organic compound layer, such as moisture and oxygen, can be prevented from entering the organic light emitting element. Therefore, a display device with high reliability can be obtained. In addition, the structure may be adopted in which a pixel electrode is a cathode, and an organic compound layer and an anode are laminated to provide light emission in a direction reverse to that in FIG. 17B.

Example 15

This example explains an example to form a light-emitting element using an active-matrix substrate of Example 8. The light-emitting element refers collectively to a display panel sealed with light-emitting elements formed on a substrate at between the substrate and a cover member, and a display module mounted with ICs on the display panel. Incidentally, the light-emitting element has a layer containing an organic compound that electro luminescence is to be obtained by applying an electric field (EL layer), an anode layer and a cathode layer. Meanwhile, the luminescence on the organic compound includes the light emission (fluorescence) upon returning from a singlet excitation state to a ground state and the light emission (phosphorescence) upon returning from a triplet excitation state to a ground state. Any one or both of these are included.

The EL layer, concretely, includes a light-emitting layer, a hole injection layer, an electron injection layer, a hole transport layer, an electron transport layer and so on. Basically, the light-emitting element has a structure having overlying layers of an anode layer, a light-emitting layer and a cathode layer, in the order. In addition to this structure, it may have a structure having overlying layers of an anode layer, hole injection layer, light-emitting layer and cathode layer, or an anode layer, hole injection layer, light-emitting layer, electron transport layer and cathode layer and the like, in the order.

Figure 36:
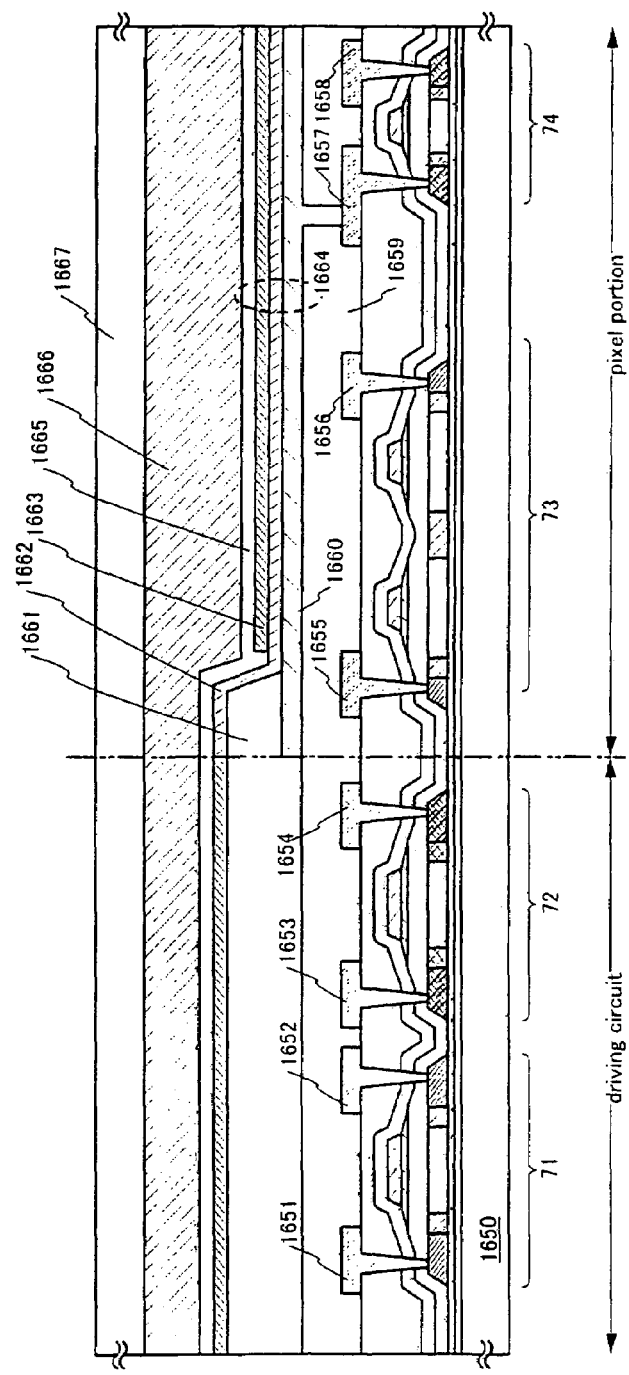
FIG. 36 is a view showing an example of a light-emitting device.

FIG. 36 is a sectional view of the light-emitting element of this example. In FIG. 36, the switching TFT 73 provided on a substrate is formed using a pixel TFT 83 of FIG. 28C. Consequently, the structure may be referred to the explanation on the pixel TFT 83. The drive circuit provided on a substrate 1650 is formed using a drive circuit of FIG. 28C. Accordingly, the structure of an n-channel TFT 71 and p-channel TFT 72 may be referred to the explanation on the n-channel TFT 81 and p-channel TFT 82. A current control TFT 74 is formed using the p-channel TFT 82 of FIG. 28C. Accordingly, the structure may be referred to the explanation on the p-channel TFT 82.

Meanwhile, an interconnection 1658 is a source interconnection (corresponding to a current supply line) of the current control TFT. Reference numeral 1657 is an interconnection overlying a pixel electrode 1660 of the current control TFT thereby being electrically connected to the pixel electrode 1660. Incidentally, the pixel electrode 1660 is a pixel electrode (anode of the light-emitting element) formed by a transparent conductor film. The transparent conductor film can use a compound of indium oxide and tin oxide, a compound of indium oxide and zinc oxide, zinc oxide, tin oxide or indium oxide. Meanwhile, the transparent conductor film may use the above noted transparent conductor film introduced with gallium. The pixel electrode 1660 is formed on a flat interlayer insulating film 1659 prior to forming the interconnection. The EL layer to be formed later is extremely thin to possibly cause abnormal light emission due to the presence of a step. Accordingly, planarization is desirably made before forming a pixel electrode so that an EL layer can be formed into a surface as flat as possible.

After forming interconnections 1651–1658, a bank 1661 is formed as shown in FIG. 36. The bank 1661 may be formed by patterning an insulating film or organic resin film having 100–400 nm. Note that, because the bank 1661 is an insulating film, caution should be given to electrostatic breakdown of an element during film forming. In this example, a carbon particle or metal particle is introduced in an insulating film as a material of the bank 1661, to reduce the resistivity and suppress the occurrence of static electricity. In this case, the introducing amount of carbon particle or metal particle may be adjusted to a resistivity of $1\times10^6$–$1\times10^{12}$ $\Omega$m (preferably, $1\times10^8$–$1\times10^{10}$ $\Omega$m).

A light-emitting layer 1662 is formed on the pixel electrode 1660. Although only one pixel is shown in FIG. 36, light-emitting layers can be separately made corresponding to R (red), G (green) and B (blue). Specifically, an overlying structure is made with a copper phthalocyanine (CuPc) film as a hole injection layer having a thickness of 20 nm, and a tris-8-quinilinolato aluminum complex ($Alq_3$) film provided thereon as a light-emitting layer having a thickness of 70 nm. Emission-light color can be controlled by introducing a fluorescent pigment, such as $Alq_3$, quinacridone, perylene or DCM1.

However, the above example is an example of an organic light-emission material to be used as a light-emission layer, which is not necessarily limited to that. The EL layer (layer for light emission and carrier movement therefor) may be formed by freely combining with a light-emission layer, a charge transport layer and a charge injection layer. For example, although this example showed the example using a low-molecule-based organic light-emitting material, a middle-molecule-based or high-molecule-based organic light-emitting material may be used. Furthermore, an organic light-emitting material, having no sublimity but having molecules in the number of 20 or less or chained molecules having a length of 10 μm or less, is provided as a middle-molecule-based organic light-emitting material. Meanwhile, as an example using a high-molecule-based light-emitting material, a layered structure may be given with a polythiophene (PEDOT) film having 20 nm provided as a hole injection layer by a spin coat technique, and a para phenylene vinylene (PPV) film having approximately 100 nm provided thereon as a light-emission layer. Meanwhile, an inorganic material, such as silicon carbide, can be used as a charge transport layer or charge injection layer. These organic light-emission materials and inorganic materials can use known materials.

Next, a cathode 1663 is provided of an alloy of aluminum and lithium on the EL layer 1662. A light-emitting element 1664 is completed at a time point that formation has been made up to the cathode 1663. The light-emitting element 1664 is made up with the pixel electrode 1660, the EL layer 1662 and the cathode 1663.

A passivation film 1665 is formed in a manner completely covering the light-emitting element 1664. The passivation film 1665 is formed by an insulating film including a carbon film, a silicon nitride film or a silicon nitride oxide film. The insulating film is used in a single layer or combined overlying layers. In particular, it is effective to use a DLC (diamond-like carbon) film. Because a DLC film can be formed in a temperature range of from a room temperature to 100° C. or lower, it can be easily formed on the EL layer 1662 low in thermal resistance. The DLC film, having a high blocking effect to oxygen, can suppress against the oxidation of the EL layer 1662. Consequently, it is possible to prevent the problem that the EL layer 1662 be oxidized during the following sealing process.

Furthermore, a seal member 1666 is provided on the passivation film 1665, to bond with a cover member 1667. The seal member 1666 may use a UV-set resin, wherein a substance having a hygroscopic or antioxidant effect is contained therein. The cover member 1667 uses a glass substrate, a synthetic quartz glass substrate or plastic substrate (including a plastic film) formed with carbon films (preferably, diamond-like carbon films) at respective surfaces.

In this manner, completed is a light-emitting element having a structure as shown in FIG. 36. Incidentally, it is effective to carry out the process of after forming the bank 1661 up to forming a passivation film 1665 by the use of a multi-chamber schemed (in-line schemed) deposition apparatus in a continuous fashion without exposure to the air. Furthermore, developing this furthermore, it is possible to continuously carry out the process up to a process of bonding a cover member 1667 without exposure to the air. In this manner, formed on the substrate are an n-channel TFT 71, a p-channel TFT 72, a switching TFT (n-channel TFT) 73 and a current control TFT (p-channel TFT) 74.

Although this example shows only the structure of the pixel section and drive circuit, it is possible to form logic circuits, such as a signal dividing circuit, a D/A converter, an operating amplifier and a γ-correction circuit, on the same insulator. Furthermore, a memory or microprocessor can be formed.

Furthermore, explanation will be made on a light-emitting element of this example after completing to a sealing process (or encapsulation) for protecting the light-emitting element, with reference to FIGS. 37A and 37B. Incidentally, the references are cited as required that have been used in FIG. 36.

FIG. 37A is a top view of a light-emitting element having done up to sealing. FIG. 37B is a sectional view taken on line C–C' in FIG. 37A. Reference numeral 801 shown at the dotted line is a source drive circuit, reference numeral 806 is a pixel section, and reference numeral 807 is a gate drive circuit. Reference numeral 901 is a cover member, reference numeral 902 is a first seal member, reference numeral 903 is a second seal member. A sealant 716 is provided at an inside surrounded by the first seal member 902. Incidentally, reference numeral 904 is an interconnection to transmit a signal inputted to the source drive circuit 801 and gate drive circuit 807, to receive a video and clock signals from an FPC (flexible print circuit) 905 as an external input terminal. Incidentally, although the FPC only is shown herein, the FPC may be provided with a print wiring board (PWB).

Next, a sectional structure is explained with reference to FIG. 37B. In the above of a substrate 700, formed are a pixel section 806 and a gate drive circuit 807. The pixel section 806 is formed with a plurality of pixels including a pixel electrode 710 electrically connected to a current control TFT 1604 and its drain. The gate drive circuit 807 is formed using a CMOS circuit combined with an n-channel TFT 1601 and a p-channel TFT 1602 (see FIG. 36).

The pixel electrode 710 serves as an anode of the light-emitting element. A bank 711 is formed at the both ends of the pixel electrode 710. An EL layer 712 and a cathode 713 of the light-emitting element are formed on the pixel electrode 710. The cathode 713 serves also as a common interconnection to all the pixels, which is electrically connected to an FPC 905 via an interconnection 904. Furthermore, the elements included in the pixel section 806 and gate drive circuit 807 are all covered by the cathode 713 and the passivation film 715.

Meanwhile, the cover member 901 is bonded by the first seal member 902. Incidentally, a spacer of a resin film may be provided to secure a spacing between the cover member 901 and the light-emitting element. A sealant 716 is filled at an inside of the first seal member 902. The first seal member 902 and the sealant 716 preferably use an epoxy resin. The first seal member 902 is desirably of a material not to transmit water or oxygen to a possible less extent. Furthermore, the sealant 716 may contain a substance having a hygroscopic or antioxidant effect.

The sealant 716 provided in a manner covering the light-emitting element serves as an adhesive to bond the cover member 901. Meanwhile, this example can use FRP (fiberglass-reinforced plastics), PVF (polyvinyl fluoride), miler, polyester or acryl as a material of a plastic substrate 901a structuring the cover member 901. Also, after bonding the cover member 901 using the sealant 716, a second seal member 903 is provided in a manner covering a side surface (exposed surface) of the sealant 907. The second seal member 903 can use the same material as the first seal member 902.

With the above structure, by sealing the light-emitting element in the sealant 716, the light-emitting element can be completely shielded from the surrounding, making it possible to prevent from externally intruding a substance, such as water or oxygen, of accelerating deterioration due to oxidation in the EL layer. Accordingly, a reliable light-emitting device can be obtained. Such a light-emitting device can be used as a display part of an electronic appliance in various kinds. This example can be manufactured with a combination of Examples 1–13.

Example 16

A semiconductor device or a display device can be applicable to various electronic equipment. Such electronic equipment includes a video camera, a digital camera, a projector (a rear type projector or a front type projector), a head mounting display (a goggle type display), a personal computer, a potable information terminal (a mobile computer, a portable telephone, an electronic notebook, etc.), and the like. FIGS. 18A to 20C show examples of those.

Figure 18A:
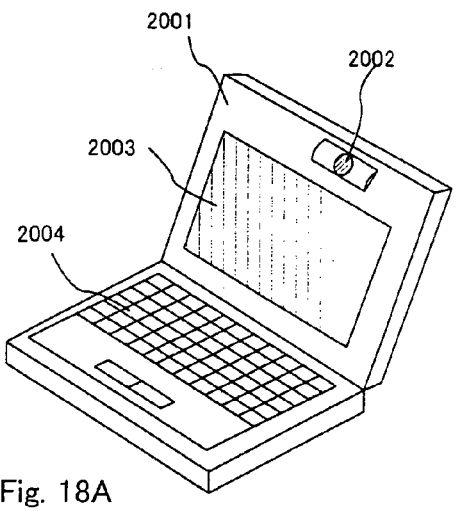
FIGS. 18A to 18F are views showing examples of electronic appliance.

FIG. 18A shows a personal computer including a main body 2001, an image input portion 2002, a display portion 2003, a keyboard 2004 and the like. The personal computer can be completed by using the active matrix driving display device manufactured by the present invention to the display portion 2003.

Figure 18B:
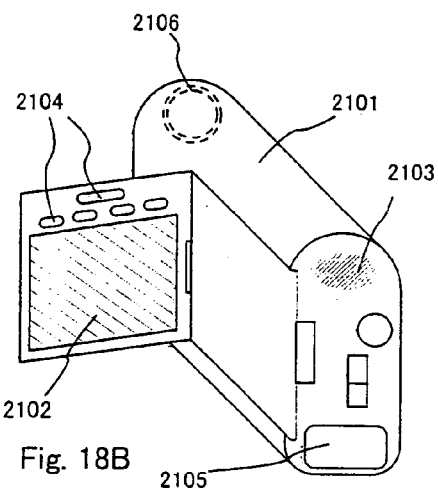

FIG. 18B shows a video camera including a main body 2101, a display portion 2102, a voice input portion 2103, operation switches 2104, a battery 2105, an image receiving portion 2106 and the like. The video camera can be completed by using the active matrix driving display device manufactured by the present invention to the display portion 2102.

Figure 18C:
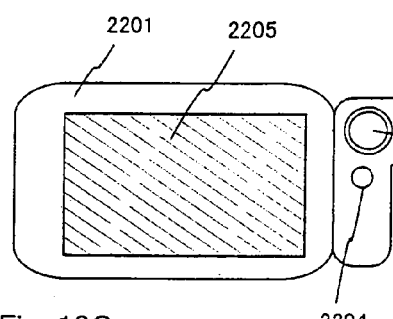

FIG. 18C shows a mobile computer including a main body 2201, a camera portion 2202, an image receiving portion 2203, an operation switch 2204, a display portion 2205 and the like. The mobile computer can be completed by using the active matrix driving display device manufactured by the present invention to the display portion 2205.

Figure 18D:
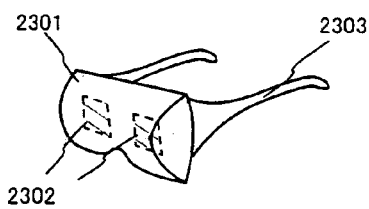

FIG. 18D shows a goggle type display including a main body 2301, a display portion 2302, an arm portion 2303 and the like. The goggle type display can be completed by using the active matrix driving display device manufactured by the present invention to the display portion 2302.

Figure 18E:
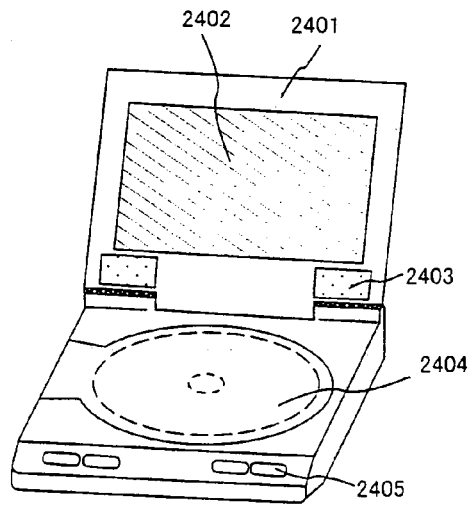

FIG. 18E shows a player using a record medium recorded with programs (hereinafter, referred to as record medium) including a main body 2401, a display portion 2402, a speaker portion 2403, a record medium 2404, an operation switch 2405 and the like. The player uses DVD (Digital Versatile Disc), CD or the like as the record medium and can enjoy music, enjoy movie and carry out game or Internet.

The player can be completed by using the active matrix driving display device to the display portion 2402.

Figure 18F:
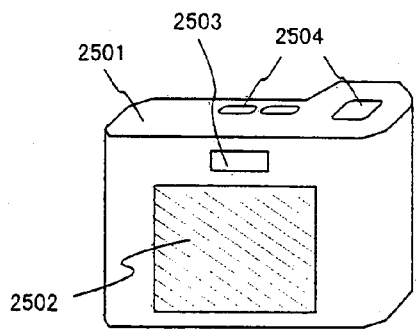

FIG. 18F shows a digital camera including a main body 2501, a display portion 2502, an eye contact portion 2503, operation switches 2504, an image receiving portion (not illustrated) and the like. The digital camera can be completed by using the active matrix driving display device to the display portion 2502.

Figure 19A:
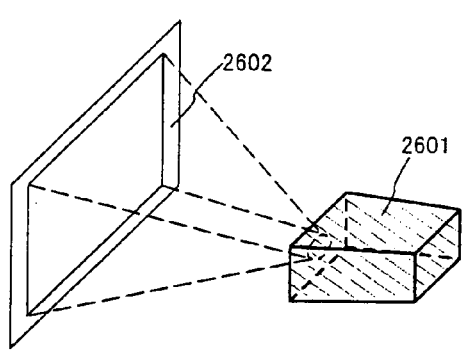
FIGS. 19A to 19D are views showing an example of a projector.
Figure 19B:
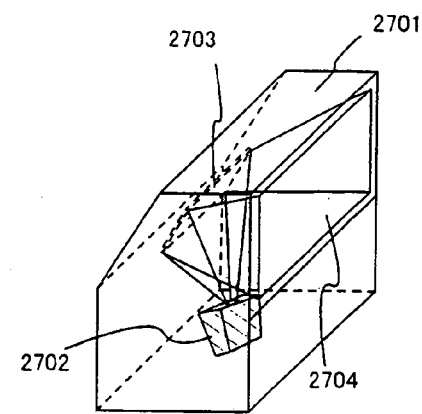

FIG. 19A shows a front type projector including a projection equipment 2601, a screen 2602 and the like. FIG. 19B shows a rear type projector including a main body 2701, a projection equipment 2702, a mirror 2703, a screen 2704 and the like.

Figure 19C:
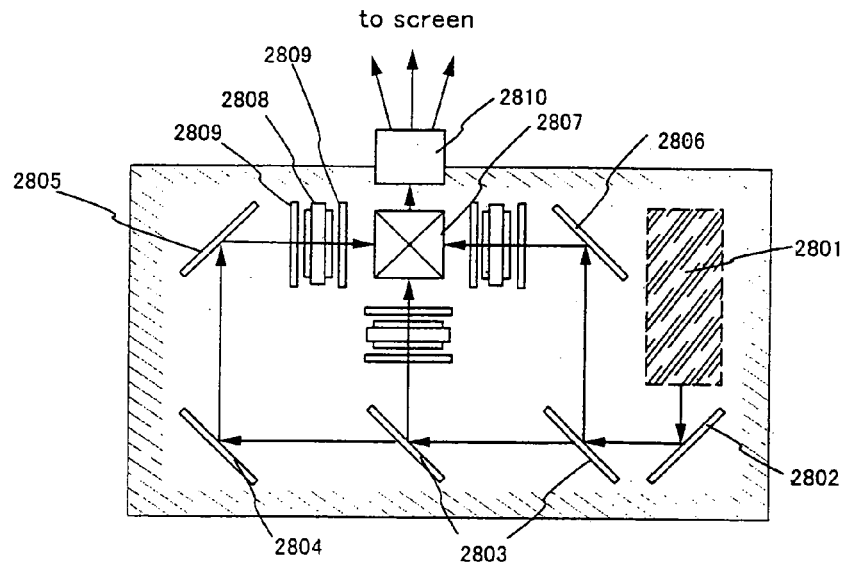

Further, FIG. 19C is a view showing an example of a structure of the projection equipment 2601 and 2702 in FIG. 19A and FIG. 19B. The projection equipment 2601 or 2702 is constituted by a light source optical system 2801, mirrors 2802, and 2804 through 2806, a dichroic mirror 2803, a prism 2807, a liquid crystal display equipment 2808, a phase difference plate 2809 and a projection optical system 2810. The projection optical system 2810 is constituted by an optical system including a projection lens. Although this example shows an example of three plates type, this example is not particularly limited thereto but may be of, for example, a single plate type. Further, person of executing this example may pertinently provide an optical system such as an optical lens, a film having a polarization function, a film for adjusting a phase difference or an IR film in an optical path shown by arrow marks in FIG. 19C.

Figure 19D:
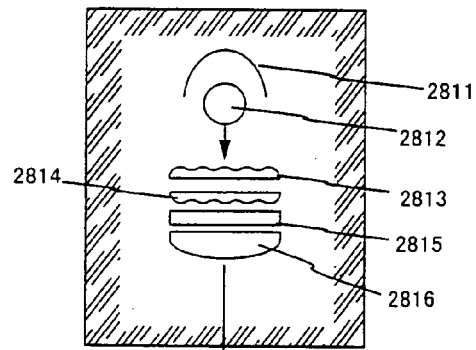

Further, FIG. 19D is a view showing an example of a structure of the light source optical system 2801 in FIG. 19C. According to this example, the light source optical system 2801 is constituted by a reflector 2811, a light source 2812, lens arrays 2813 and 2814, a polarization conversion element 2815 and a focusing lens 2816. Further, the light source optical system shown in FIG. 19D is only an example and this example is not particularly limited thereto. For example, a person of executing this example may pertinently provide an optical system such as an optical lens, a film having a polarization function, a film for adjusting a phase difference or an IR film and the like in the light source optical system. However, according to the projectors shown in FIG. 19, there is shown a case of using a transmission type electro-optical device and an example of applying a reflection type electro-optical device is not illustrated.

Figure 20A:
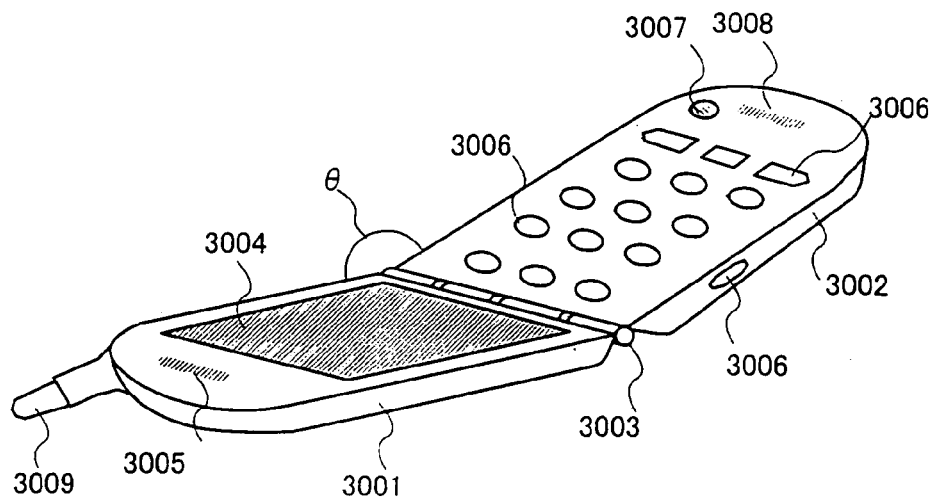
FIGS. 20A to 20C are views showing an example of an electronic appliance.

FIG. 20A shows a portable telephone including a display panel 3001, an operation panel 3002. The display panel 3001 and the operation panel 3002 are connected to each other in the connecting portion 3003. In the connecting panel 3003, the angle of a face which is provided the display portion 3004 of the display panel 3001 and a face which is provided the operation key 3006 of the operation panel 3002 can be changed arbitrary. Further, a voice output portion 3005, an operation key 3006, a power source switch 3007 and a sound input portion 3008 are also included. The personal portable telephone can be completed by using the active matrix driving display device to the display portion 3004.

Figure 20B:
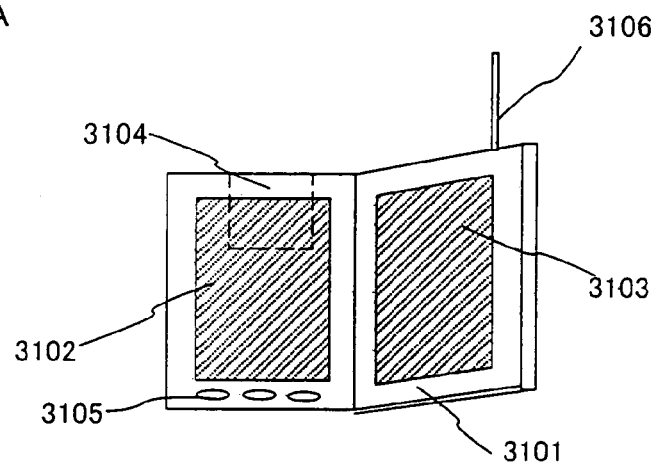
Figure 20C:
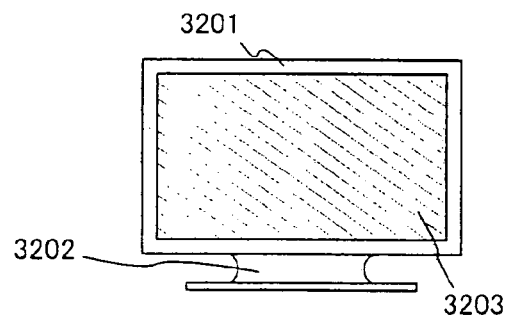

FIG. 20B shows a portable book (electronic notebook) including a main body 3101, display portion 3102, 3013, a record medium 3104, an operation switch 3105, an antenna 3106 and the like. The potable book can be completed by using the active FIG. 20C shows a television including a main body 3201, a support base 3202,a display portion 3203 and the like. The display according to the invention is advantageous particularly in the case of large screen formation and is advantageous in the display having a diagonal length of 10 inch or more (particularly, 30 inch or more). The television can be completed by using the active matrix driving display device to the display potion 3203.

As has been described, the range of applying the present invention is extremely wide and is applicable to electronic equipment of all the fields.

The present invention uses a germanium-containing silicon film as a first amorphous semiconductor film in order to form a first crystalline semiconductor film having a high orientation. By crystallizing the first amorphous semiconductor film with using a catalyst element, a first crystalline semiconductor film is formed having a high (110)-plane orientation. Furthermore, by radiating a first laser light, crystallinity is improved to vanish an amorphous region and a high concentration germanium-containing region is removed.

Subsequently, a silicon film is formed as a second semiconductor layer on the first crystalline semiconductor layer. By a heating process or laser radiation, a second crystalline semiconductor film is formed on the basis of the first crystalline semiconductor film as a seed (nucleus) for crystallization. The second crystalline semiconductor film crystal-grows at a high orientation ratio under the influence of an orientation of the first crystalline semiconductor film.

In this manner, the crystal growth at a high orientation ratio reduces the crystal boundaries occurring due to crashing between the crystal growths from the adjacent different-oriented nuclei, thereby increasing individual-crystal grain size. Meanwhile, the catalyst element used in forming the first crystalline semiconductor layer is moved into a gettering region by a gettering process, thereby reducing the concentration of the catalyst element contained in the crystalline semiconductor layer. As described above, the use of the invention provides a favorable crystalline semiconductor film low in catalyst element concentration, high in orientation, and aggregated with large-sized crystal grains.

Furthermore, according to the invention, a silicon-germanium film is used as a first semiconductor layer in order to form a first semiconductor layer having a high orientation. By crystallizing the silicon-germanium film with using a catalyst element, a first crystalline semiconductor layer can be obtained having a high (110)-plane orientation. Furthermore, by radiating a first laser light, crystallinity is improved to vanish an amorphous region. A silicon film is formed as a second semiconductor layer on the first crystalline semiconductor layer. By radiating a laser light, the second semiconductor layer crystal-grows on the basis of the first crystalline semiconductor layer as a seed (nucleus) for crystallization. Incidentally, the second semiconductor layer crystal-grows at a high orientation ratio under the influence of an orientation of the first crystalline semiconductor layer.

In this manner, the crystal growth at a high orientation ratio reduces the crystal boundaries occurring due to crashing between the crystal growths from the adjacent different-oriented nuclei, thereby increasing individual-crystal grain size. Meanwhile, the catalyst element used in forming the first crystalline semiconductor layer is moved into a gettering region by a gettering process, thereby reducing the concentration of the catalyst element contained in the crystalline semiconductor layer. As described above, the use of the invention provides a favorable crystalline semiconductor film low in catalyst element concentration, high in orientation, and aggregated with large-sized crystal grains.

What is claimed is:
1. A semiconductor device comprising:
 a first crystalline semiconductor film comprising silicon added with an element having an atomic radius greater than silicon over a substrate; and a second crystalline semiconductor film comprising silicon over and in contact with the first crystalline semiconductor film;

wherein the first semiconductor film has a semiconductor region having a (101)-plane orientation ratio of 30 percent or greater, and wherein the first crystalline semiconductor film and the second crystalline semiconductor film are coincident in crystal orientation at a ratio of 60 percent or higher.

2. A semiconductor device according to claim 1, wherein the element having an atomic radius greater than silicon is germanium.

3. A semiconductor device comprising:
a first crystalline semiconductor film comprising silicon and germanium over a substrate; and
a second crystalline semiconductor film comprising silicon over and in contact with the first crystalline semiconductor film;
wherein the first crystalline semiconductor film has a (101)-plane orientation ratio of 30 percent or greater, and
wherein the first crystalline semiconductor film and the second crystalline semiconductor film are coincident in crystal orientation at a ratio of 60 percent or higher.

4. A semiconductor device according to claim 3, wherein at least one of oxygen, carbon and nitrogen having a concentration of $1 \times 10^{19}/cm^3$ or higher is contained between the first crystalline semiconductor film and the second crystalline semiconductor film.

5. A semiconductor device comprising:
a first crystalline semiconductor film containing silicon and germanium over a substrate; and
a second crystalline semiconductor film comprising silicon over and in contact with the first crystalline semiconductor film;
wherein the second crystalline semiconductor film has a (101)-plane orientation ratio of 20 percent or greater, and
the first crystalline semiconductor film and the second crystalline semiconductor film are coincident in crystal orientation at a ratio of 60 percent or higher.

6. A semiconductor device according to claim 5, wherein at least one of oxygen, carbon and nitrogen having a concentration of $1 \times 10^{19}/cm^3$ or higher is contained between the first crystalline semiconductor film and the second crystalline semiconductor film.

7. A semiconductor device comprising:
a first crystalline semiconductor film comprising silicon and germanium over a substrate; and
a second crystalline semiconductor film comprising silicon over and in contact with the first crystalline semiconductor film;
wherein the first crystalline semiconductor film has a (101)-plane orientation ratio of 30 percent or greater and the second crystalline semiconductor film has a (101)-plane orientation ratio of 20 percent or greater, and
wherein the first crystalline semiconductor film and the second crystalline semiconductor film are coincident in crystal orientation at a ratio of 60 percent or higher.

8. A semiconductor device according to claim 7, wherein the first crystalline semiconductor film contains germanium in a concentration of $1 \times 10^{20}/cm^3$ or less.

9. A semiconductor device according to claim 7, wherein the second crystalline semiconductor film contains germanium in a concentration of $1 \times 10^{19}/cm^3$ or less.

10. A semiconductor device according to claim 7, wherein at least one of oxygen, carbon and nitrogen having a concentration of $1 \times 10^{19}/cm^3$ or higher is contained between the first crystalline semiconductor film and the second crystalline semiconductor film.

11. A semiconductor device comprising:
a first crystalline semiconductor film comprising silicon and germanium over a substrate; and
a second crystalline semiconductor film comprising silicon over and in contact with the first crystalline semiconductor film;
wherein the first crystalline semiconductor film contains germanium in a concentration of $1 \times 10^{20}/cm^3$ or less,
wherein the second crystalline semiconductor film has a (101)-plane orientation ratio of 20 percent or greater, and
wherein the first crystalline semiconductor film and the second crystalline semiconductor film are coincident in crystal orientation at a ratio of 60 percent or higher.

12. A semiconductor device according to claim 11, wherein the second crystalline semiconductor film contains germanium in a concentration of $1 \times 10^{19}/cm^3$ or less.

13. A semiconductor device according to claim 11, wherein at least one of oxygen, carbon and nitrogen having a concentration of $1 \times 10^{19}/cm^3$ or higher is contained between the first crystalline semiconductor film and the second crystalline semiconductor film.

14. A semiconductor device comprising:
a first crystalline semiconductor film comprising silicon and germanium over a substrate; and
a second crystalline semiconductor film comprising silicon over and in contact with a first crystalline semiconductor film;
wherein the second crystalline semiconductor film contains germanium in a concentration of $1 \times 10^{19}/cm^3$ or less,
wherein the second crystalline semiconductor film has a (101)-plane orientation ratio of 20 percent or greater, and
wherein the first crystalline semiconductor film and the second crystalline semiconductor film are coincident in crystal orientation at a ratio of 60 percent or higher.

15. A semiconductor device according to claim 14, wherein at least one of oxygen, carbon and nitrogen having a concentration of $1 \times 10^{19}/cm^3$ or higher is contained between the first crystalline semiconductor film and the second crystalline semiconductor film.

* * * * *